(12) United States Patent
Tsuchiya

(10) Patent No.: US 7,696,063 B2
(45) Date of Patent: Apr. 13, 2010

(54) MANUFACTURING METHOD OF SEMICONDUCTOR DEVICE

(75) Inventor: Kaoru Tsuchiya, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 0 days.

(21) Appl. No.: 12/325,458

(22) Filed: Dec. 1, 2008

(65) Prior Publication Data

US 2009/0142888 A1    Jun. 4, 2009

(30) Foreign Application Priority Data

Dec. 3, 2007  (JP) .............................. 2007-311910

(51) Int. Cl.
*H01L 21/30* (2006.01)
(52) U.S. Cl. .................. 438/455; 438/106; 438/109; 438/118; 438/458; 438/763; 257/52; 257/59; 257/72; 257/E21.54
(58) Field of Classification Search .................. 438/67, 438/502, 616; 257/37
See application file for complete search history.

(56) References Cited

U.S. PATENT DOCUMENTS

| | | |
|---|---|---|
| 6,525,415 B2 | 2/2003 | Koyanagi et al. |
| 6,682,963 B2 | 1/2004 | Ishikawa |
| 7,084,045 B2 * | 8/2006 | Takayama et al. ............ 438/455 |
| 7,109,071 B2 | 9/2006 | Ishikawa |
| 7,408,193 B2 | 8/2008 | Ishikawa |

FOREIGN PATENT DOCUMENTS

| | | |
|---|---|---|
| JP | 05-335482 | 12/1993 |
| JP | 2001-189419 | 7/2001 |

* cited by examiner

*Primary Examiner*—N Drew Richards
*Assistant Examiner*—Kyoung Lee
(74) *Attorney, Agent, or Firm*—Eric J. Robinson; Robinson Intellectual Property Law Office, P.C.

(57) ABSTRACT

A semiconductor device which has higher integration and is further reduced in thickness and size. A semiconductor device with high performance and low power consumption. A semiconductor element layer separated from a substrate by using a separation layer is stacked over a semiconductor element layer formed by using another substrate and covered with a flattened inorganic insulating layer. After separation of the semiconductor element layer in a top layer from the substrate, the separation layer is removed so that an inorganic insulating film formed under the semiconductor element layer is exposed. The flattened inorganic insulating layer and the inorganic insulating film are made to be in close contact and bonded to each other. In addition, a semiconductor layer included in the semiconductor element layer is a single crystal semiconductor layer which is separated from a semiconductor substrate and transferred to a formation substrate.

22 Claims, 26 Drawing Sheets

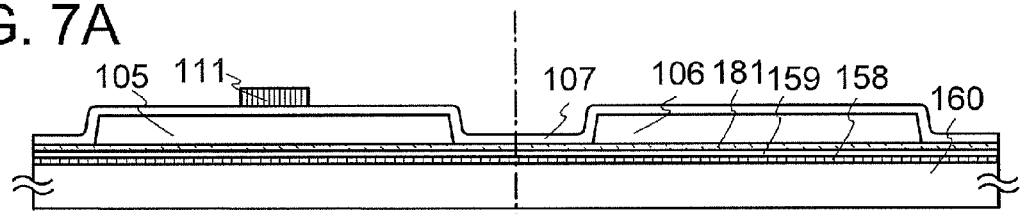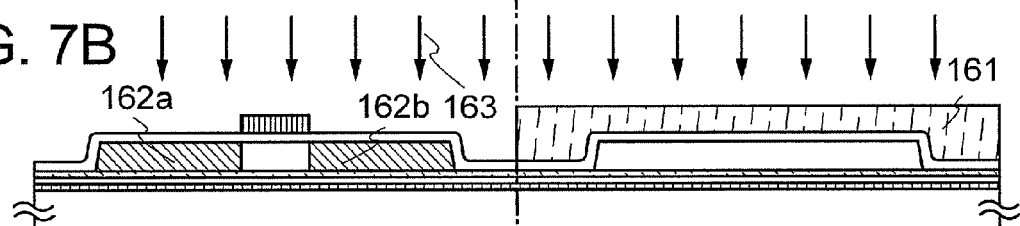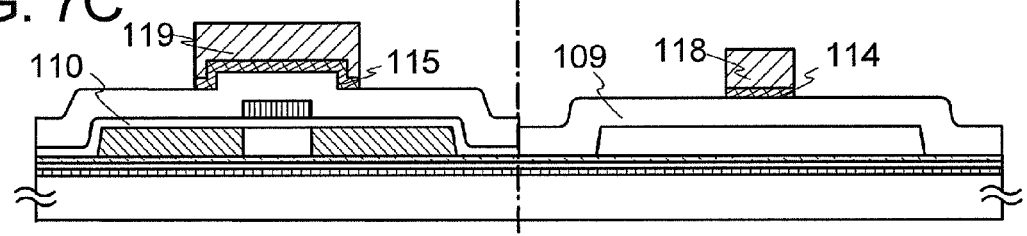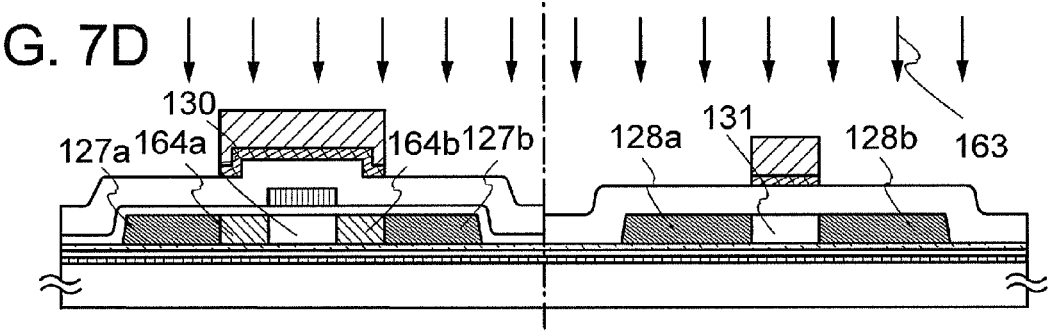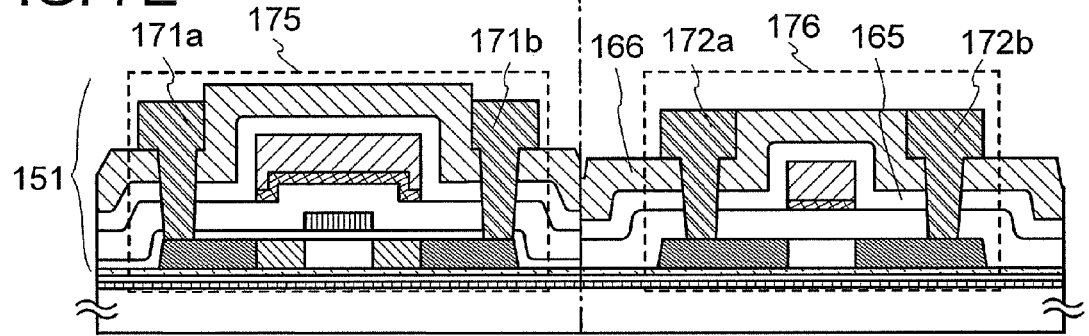

190

191

197

193

194

195

196

1101  1130

1125

1109

MANUFACTURING METHOD OF SEMICONDUCTOR DEVICE

BACKGROUND OF THE INVENTION

1. Field of the Invention

This invention relates to a method of manufacturing a semiconductor device having a multi-layer structure.

2. Description of the Related Art

In a technical field of semiconductor devices, higher performance and lower electric power consumption have been promoted by miniaturization and higher integration. In order to increase the integration of semiconductor integrated circuits, a multi-layer integrated circuits with integrated circuits (semiconductor element layer) of a multi-layer structure have been proposed.

As an example of manufacturing such a multi-layer integrated circuit, a method in which an interlayer insulator of an organic material is formed over a first semiconductor element layer which is formed over a substrate, and a second semiconductor element layer is stacked over the interlayer insulator has been disclosed (for example, see Patent Document 1: Japanese Published Patent Application No. H5-335482).

In addition, as another example of manufacturing such a multi-layer integrated circuit, a method in which a first semiconductor element layer and a second semiconductor element layer formed over different substrates are bonded with an epoxy resin so as to be in contact with each other to have a multi-layer structure has been disclosed (for example, see Patent Document 2: Japanese Published Patent Application No. 2001-189419).

[Patent Document 1] Japanese Published Patent Application No. H5-335482

[Patent Document 2] Japanese Published Patent Application No. 2001-189419

SUMMARY OF THE INVENTION

However, as described above, if an adhesive layer such as an interlayer insulator of an organic material or a resin is formed between semiconductor element layers, a semiconductor device becomes thick and large. Moreover, a problem that electrical connection between the semiconductor element layers is difficult is also concerned.

Accordingly, an object is to manufacture a semiconductor device which has higher integration and thus is reduced in thickness and size. In addition, another object is to achieve higher performance and lower electric power consumption in the semiconductor device.

A plurality of layers including semiconductor elements (hereinafter referred to as semiconductor element layers) is stacked to manufacture a semiconductor device with a multi-layer structure. The semiconductor element layer is formed over a substrate (hereinafter also referred to as a formation substrate because it is a substrate for manufacturing a semiconductor element) over which a separation layer and an inorganic insulating film which functions as a base film are formed, and separated from the formation substrate to the side of another substrate (also referred to as a holding substrate because it is for temporally holding a semiconductor element layer) by using the separation layer. After the semiconductor element layer which is a semiconductor element layer in a top layer is separated from the formation substrate, the separation layer remained on the semiconductor element layer side is removed to expose the inorganic insulating film which functions as a base film of the semiconductor element layer. Flattening treatment may be performed on the exposed inorganic insulating film.

On the other hand, a flattened inorganic insulating layer is formed over a semiconductor element layer formed over another substrate, which is to be a semiconductor element layer in a bottom layer.

The flattened inorganic insulating film and the organic insulating layer are made in close contact and bonded to each other to stack the semiconductor element layer in the bottom layer and the semiconductor layer in the top layer.

In addition, plasma treatment is preferably performed on at least one of the exposed inorganic insulating film and the flattened inorganic insulating layer for activation. It is needless to say that the plasma treatment may be performed on both the exposed inorganic insulating film and the flattened inorganic insulating layer.

Materials of different kinds can be easily bonded to each other even at a room temperature to a temperature of 400° C. by plasma treatment for activating a surface. Accordingly, a semiconductor device of a multi-layer structure can be manufactured through a low temperature process. In addition, since the semiconductor element layers are bonded by the thin inorganic insulating layer and the inorganic insulating film without using an organic material such as an adhesive, the semiconductor device can be reduced in thickness and size.

Since the inorganic insulating layer provided between the semiconductor element layers to be stacked is thin, a wiring layer which is formed by penetrating the inorganic insulating layer provided between single crystal semiconductor layers can be easily manufactured, whereby yield and productivity can be improved. Accordingly, electrical defects due to a defective shape in electrical connection between the stacked semiconductor elements are reduced and thus a semiconductor device with high reliability can be manufactured.

Further, in a semiconductor device provided with a plurality of circuits having different functions, various different electrical characteristics or functions are required for the plurality of semiconductor elements in accordance with their intended uses. Therefore, semiconductor elements each having a necessary function or electrical characteristics need to be manufactured.

In order to improve required function and electrical characteristics of each semiconductor element, it is preferable that manufacturing conditions such as a material and the thickness of a thin film that forms the semiconductor element be optimized.

In this invention, since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layer in a different layer. Accordingly, a semiconductor device with a multi-layer structure with a plurality of semiconductor elements can also have higher performance.

In this invention, a single crystal semiconductor layer separated and transferred from a single crystal semiconductor substrate is used. Therefore, by selecting a single crystal semiconductor substrate, a crystal plane orientation and a crystallographic axis in a channel length direction in a transistor can be controlled.

By employing a crystal plane orientation and a crystallographic axis in the single crystal semiconductor layer, which make the mobility of a carrier flowing through a channel of the transistor the highest, the effective mass of the carrier is reduced and the mobility of the transistor can be improved. Therefore, the transistor can have higher performance.

As flattening treatment, polishing treatment or etching treatment may be performed. It is needless to say that both the polishing treatment and the etching treatment may be performed. For the polishing treatment, a chemical mechanical polishing (CMP) method or a liquid jet polishing method can be used. For the etching treatment, wet etching, dry etching, or the both of them can be performed as appropriate. Flattening treatment may be performed by plasma treatment. For example, a reverse sputtering method can be employed.

Alternatively, after the separation layer is formed over the substrate, flattening treatment may be performed on the separation layer before the inorganic insulating film is formed. Formation of the inorganic insulating film over the separation layer on which flattening treatment is performed can increase the flatness of a bonding surface of the inorganic insulating film which is exposed by removal of the separation layer.

In this specification, the word "transfer" (also referred to as transpose) means to separate a semiconductor element layer formed over one substrate from the substrate and move the semiconductor element layer to another substrate. In other words, "transfer" means to move a position where the semiconductor element layer is formed to another substrate.

A single crystal semiconductor layer in a bottom layer and a single crystal semiconductor layer in a top layer that are stacked with a gate insulating layer, an inorganic insulating layer, an inorganic insulating film, and the like interposed therebetween are electrically connected through a wiring layer that penetrates the gate insulating layer, the inorganic insulating layer and the inorganic insulating film. In the case where the single crystal semiconductor layer in the bottom layer and the single crystal semiconductor layer in the top layer are stacked to overlap with each other, the wiring layer may be formed in contact with the single crystal semiconductor layer in the bottom layer by penetrating the single crystal semiconductor layer in the top layer. By tightly stacking the single crystal semiconductor layers so as to overlap with each other, a semiconductor device with higher integration can be obtained.

Since a semiconductor element can have a layered structure, a semiconductor device with higher integration can be obtained. High integration can reduce the area of circuits and wiring capacitance; therefore, electric power consumption can be suppressed.

In forming a semiconductor element in the top layer over a semiconductor element in the bottom layer, an interlayer insulating layer which covers the semiconductor element in the bottom layer is formed and an insulating layer which is bonded to a single crystal semiconductor layer is formed over the interlayer insulating layer. Accordingly, the single crystal semiconductor layer of the semiconductor element in the top layer and the insulating layer can be easily bonded, and thus the reliability of a semiconductor device can be increased and yield is improved.

According to one aspect of a manufacturing method of a semiconductor device of this invention, a first separation layer is formed over a first substrate, flattening treatment is performed on the first separation layer, a first inorganic insulating film is formed over the flattened first separation layer, and a first semiconductor element layer is formed over the first inorganic insulating film. An inorganic insulating layer is formed over the first semiconductor element layer, and flattening treatment is performed on the inorganic insulating layer. A second separation layer is formed over a second substrate, flattening treatment is performed on the second separation layer, a second inorganic insulating film is formed over the flattened second separation layer, and a second semiconductor element layer is formed over the second inorganic insulating film. A holding substrate is adhered to the second semiconductor element layer and the second semiconductor element layer and the second inorganic insulating film are separated from the second substrate. The second inorganic insulating film is exposed by removing the second separation layer remaining on the second inorganic insulating film. The first semiconductor element layer and the second semiconductor element layer are stacked with the inorganic insulating layer and the second inorganic insulating film interposed between the first semiconductor element layer and the second semiconductor element layer by bonding the flattened inorganic insulating layer and the exposed second inorganic insulating film. The first semiconductor element layer and the second semiconductor element layer each includes a single crystal semiconductor layer, and a weakened layer is formed over a single crystal semiconductor substrate. The single crystal semiconductor substrate is separated along the weakened layer, and the single crystal semiconductor layer is formed over each of the first inorganic insulating film and the second inorganic insulating film.

In addition, according to another aspect of a manufacturing method of a semiconductor device of this invention, after the first semiconductor element layer and the second semiconductor element layer are stacked with the inorganic insulating layer and the second inorganic insulating film interposed between the first semiconductor element layer and the second semiconductor element layer, the holding substrate is separated from the second semiconductor element layer. Next, a wiring layer which penetrates the inorganic insulating layer and the second inorganic insulating film to electrically connect the first semiconductor element layer to the second semiconductor element layer which hare stacked is formed.

In addition, according to another aspect of a manufacturing method of a semiconductor device of this invention, after the wiring layer which penetrates the inorganic insulating layer and the second inorganic insulating film to electrically connect the first semiconductor element layer to the second semiconductor element layer which are stacked is formed, a resin layer is formed over the second semiconductor element layer and the wiring layer. Next, a second holding substrate is adhered to the resin layer and the first inorganic insulating film is separated from the first substrate to the second holding substrate side.

Note that in this invention, a semiconductor device means a device that functions by utilizing semiconductor characteristics. Devices provided with circuits including semiconductor elements (a transistor, a memory element, a diode, and the like) or semiconductor devices such as chips including processor circuits can be manufactured by using this invention.

A semiconductor device with a multi-layer structure can be manufactured through a low temperature process. In addition, since semiconductor element layers are bonded with a thin inorganic insulating layer and an inorganic insulating film without using an organic material such as an adhesive, the semiconductor device can be reduced in thickness and size.

Since the inorganic insulating layer provided between the semiconductor element layers to be stacked is thin, a wiring layer which is formed by penetrating the inorganic insulating layer provided between single crystal semiconductor layers can be easily manufactured, whereby yield and productivity can be improved. Accordingly, electrical defects due to a defective shape in electrical connection between the stacked semiconductor elements are reduced and thus a semiconductor device with higher reliability can be manufactured.

In addition, since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layer in a different layer. Accordingly, a semiconductor device with a multi-layer structure with a plurality of semiconductor elements can also have higher performance.

BRIEF DESCRIPTION OF THE DRAWINGS

In the accompanying drawings:

FIGS. 7A to 7E are views illustrating a manufacturing method of a semiconductor device, according to an aspect of this invention;

DETAILED DESCRIPTION OF THE INVENTION

Figure 1A:
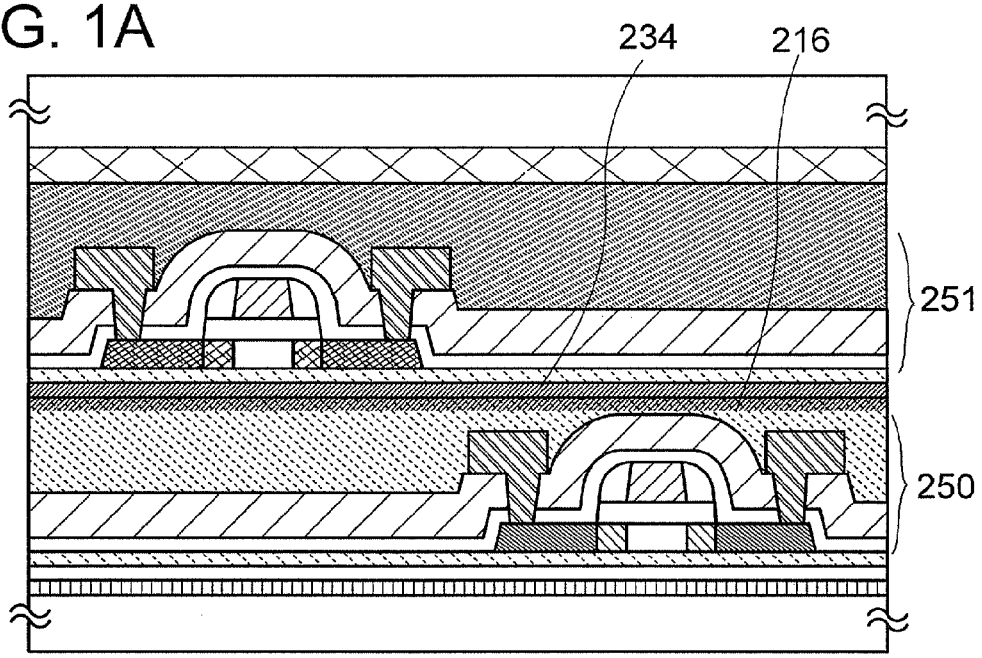
FIGS. 1A to 1C are views illustrating a manufacturing method of a semiconductor device, according to an aspect of this invention.

The embodiment modes of this invention will be described with reference to drawings. However, this invention is not limited to the following description, and it is to be understood by those skilled in the art that the mode and detail of this invention can be changed variously within the spirit and scope of this invention. Therefore, this invention should not be construed as being limited to the description of the following embodiment modes. Note that in structures of this invention described below, common portions or portions having similar functions are denoted by the same reference numerals in the drawings, and repeated description thereof is omitted.

Embodiment Mode 1

In this embodiment mode, a semiconductor device aimed at increase in integration and reduction in thickness and size, and a manufacturing method of the semiconductor device will be described in detail with reference to FIGS. 1A to 1C, FIGS. 2A to 2C, FIGS. 3A to 3D, FIGS. 4A to 4E, and FIGS. 10A and 10B.

In this embodiment mode, as an example of a semiconductor device, a CMOS (complementary metal oxide semiconductor) will be described.

A semiconductor device of this embodiment mode has a multi-layer structure in which semiconductor element layers are stacked. The semiconductor element layer is separated from a substrate used when the semiconductor element layer is formed, and stacked over another semiconductor element layer by bonding between insulating layers. Note that in this specification, a substrate over which the semiconductor element layer is formed is also referred to as a formation substrate. Accordingly, the semiconductor element layer is formed over the formation substrate with a separation layer interposed therebetween. In this embodiment mode, a semiconductor device with a layered structure of two layers is illustrated as an example. Semiconductor element layers of top and bottom layers to be stacked are electrically connected to each other through a wiring layer that penetrates the layered structure.

In this embodiment mode, a semiconductor element including a single crystal semiconductor layer separated from a single crystal semiconductor substrate and bonded to a formation substrate is used for a semiconductor element layer.

First, a method for providing a single crystal semiconductor layer from a single crystal semiconductor substrate over a formation substrate which is a substrate having an insulating surface will be described with reference to FIGS. 18A to 18C, FIGS. 19A to 19E, FIGS. 20A to 20D, and FIGS. 21A to 21C.

Figure 20A:
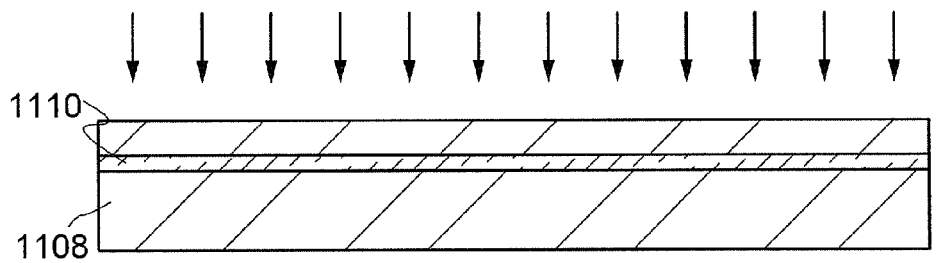
FIGS. 20A to 20D are views illustrating a manufacturing method of a semiconductor device, according to an aspect of this invention.

A single crystal semiconductor substrate 1108 shown in FIG. 20A is purified, and ions which are accelerated by an electric field are added at a predetermined depth from the surface of the single crystal semiconductor substrate 1108 to form a weakened layer 1110. Ions are added in view of the thickness of a single crystal semiconductor layer to be transferred to a formation substrate. Accelerating voltage for adding ions to the single crystal semiconductor substrate 1108 is set in consideration of the thickness. In this invention, a region which is weakened so as to include minute voids by the addition of ions to a single crystal semiconductor substrate is referred to as a weakened layer.

As the single crystal semiconductor substrate 1108, a commercial single crystal semiconductor substrate can be used. For example, a single crystal semiconductor substrate formed of an element in group 4, such as a single crystal silicon substrate, a single crystal germanium substrate, or a single crystal silicon germanium substrate can be used. Alternatively, a compound semiconductor substrate of gallium arsenide, indium phosphide, or the like may be used. A polycrystalline semiconductor substrate may be used as a semiconductor substrate. It is needless to say that a single crystal semiconductor substrate is not limited to a circular wafer and single crystal semiconductor substrates with various shapes can be used. For example, a substrate of a circle or a polygon such as a rectangle, a pentagon, or a hexagon can be used. It is needless to say that a commercial circular single crystal semiconductor wafer may be used for a single crystal semiconductor substrate. As a circular single crystal semiconductor wafer, a semiconductor wafer of silicon, germanium, or the like, a compound semiconductor wafer of gallium arsenide, indium phosphide, or the like, or the like can be used. A typical example of a single crystal semiconductor wafer is a single crystal silicon wafer, and a circular wafer having a following diameter can be used: 5 inch (125 mm), 6 inch (150 mm), 8 inch (200 mm), 12 inch (300 mm), 400 mm, or 450 mm. In addition, a rectangular single crystal semiconductor substrate can be formed by cutting a commercial circular single crystal semiconductor wafer. For cutting a substrate, a cutting device such as a dicer or a wire saw, a laser beam cutting, a plasma cutting, an electron beam cutting, or other given cutting means can be used. Alternatively, a rectangular single crystal semiconductor substrate can also be manufactured by processing an ingot for manufacturing a semiconductor substrate before being thinned to be used for a substrate into a rectangular solid form so that the cross section of the ingot is rectangular, and thinning this ingot with a rectangular solid form. In addition, although there are no particular limitations on the thickness of a single crystal semiconductor substrate, a thicker single crystal semiconductor substrate is preferable in consideration of reusing the single crystal semiconductor substrate because the larger number of single crystal semiconductor layers can be formed from one raw material wafer. The thickness of a single crystal silicon wafer in the marketplace conforms to the SEMI standard. For example, a 6-inch diameter wafer is 625 µm in thickness, an 8-inch diameter wafer is 725 µm in thickness, and a 12-inch diameter wafer is 775 µm in thickness. Note that the thickness of a wafer that conforms to the SEMI standard accepts a tolerance of ±25 µm. It is needless to say that not being limited to the SEMI standard, the thickness of a single crystal semiconductor substrate which is to be a raw material can be adjusted as appropriate in slicing an ingot. It is needless to say that when the reused single crystal semiconductor substrate 1108 is used, the thickness of the reused single crystal semiconductor substrate 1108 is thinner than that of the single crystal semiconductor substrate conforming to the SEMI standard. A single crystal semiconductor layer to be formed over a formation substrate is determined by selecting a semiconductor substrate to be a base.

In addition, the crystal plane orientation of the single crystal semiconductor substrate 1108 can be selected in accordance with a semiconductor element (a field effect transistor in this embodiment mode) to be manufactured. For example, a single crystal semiconductor substrate with a {100} plane, a {110} plane, or the like as a crystal plane orientation can be used.

In this embodiment mode, an ion addition separation method in which hydrogen, helium, or fluorine ions are added to a single crystal semiconductor substrate at a predetermined depth, heat treatment is then conducted, and a single crystal semiconductor layer, which is an outer layer, is separated can be used. Alternatively, a method in which single crystal silicon is epitaxially grown over porous silicon and the porous silicon layer is separated by water jetting may also be employed.

A single crystal silicon substrate is used as the single crystal semiconductor substrate 1108, the surface thereof is processed with dilute hydrofluoric acid, a native oxide film is removed and a contaminant such as dust which is attached to the surface is also removed, and the surface of the single crystal semiconductor substrate 1108 is purified.

Ions may be added (introduced) to the weakened layer 1110 by an ion doping method (abbreviated as an ID method) or an ion implantation method (abbreviated as an II method). The weakened layer 1110 is formed by addition of ions of hydrogen, helium, or halogen typified by fluorine. In the case of adding fluorine ions as the halogen element, $BF_3$ may be used as a source gas. Note that ion implantation is a method in which ionized gas is mass separated and added to a semiconductor.

For example, an ion implantation method can be employed so that an ionized hydrogen gas is mass separated and only $H^+$ (or $H_2^+$) can be selectively accelerated and added.

In an ion doping method, plural kinds of ion species are formed in plasma without mass separation of an ionized gas and the ion species are accelerated and a single crystal semiconductor substrate is doped with the accelerated ion species. For example, of hydrogen ions including $H^+$, $H_2^+$, and $H_3^+$ ions typically account for 50% of ions which are to be used for doping; generally, $H_3^+$ ions account for 80% and the other ions ($H^+$ and $H_2^+$ ions) account for 20% of the ions which are to be used for doping. Here, to add only an ion species of $H_3^+$ is also referred to as ion doping.

In addition, ions made up of a single atom that have different masses or ions made up of a plurality of atoms that have different masses can be added. For example, in the case of adding hydrogen ions, the hydrogen ions preferably include $H^+$, $H_2^+$, and $H_3^+$ ions with a high proportion of $H_3^+$ ions. With a high proportion of $H_3^+$ ions, addition efficiency can be increased and addition time can be shortened. With such a structure, separation can be easily performed.

Hereinafter, an ion doping method and an ion implantation method will be described in detail. An ion doping apparatus (also referred to as an ID apparatus) has a large plasma space, and thus a large amount of ions can be added to a single crystal semiconductor substrate. On the other hand, an ion implantation apparatus (also referred to as an II apparatus) for implanting ions has a characteristic that ions taken from plasma are analyzed by mass spectroscopy and only particular ion species can be introduced to a semiconductor substrate, and a process is basically performed by scanning of a point beam.

For generating plasma, for example, both apparatuses form a plasma state by thermoelectrons generated by heating a filament. However, the ratio of hydrogen ion species when generated hydrogen ions ($H^+$, $H_2^+$, and $H_3^+$) are added to a semiconductor substrate is largely different between an ion doping method and an ion implantation method.

In terms of introducing a larger amount of $H_3^+$, it can be said that the ion doping apparatus is preferred to the ion implantation apparatus.

When halogen ions such as hydrogen ions or fluorine ions are added to a single crystal silicon substrate, fluorine which is added knocks out (expels) silicon atoms in silicon crystal lattice, so that blank portions are created effectively and microvoids are made in a weakened layer. In this case, a change occurs in the volume of the microvoids formed in the weakened layer by heat treatment at a relatively low temperature to cause cleavage along the weakened layer, whereby a thin single crystal semiconductor layer can be formed. After the addition of fluorine ions, hydrogen ions may be added and hydrogen may be contained in the voids. Since the weakened layer which is formed to separate the thin single crystal semiconductor layer from the single crystal semiconductor substrate cleaves using a change in the volume of the microvoids formed in the weakened layer, it is preferable to make effective use of fluorine ions or hydrogen ions in this manner.

In addition, a protective layer may be formed between the single crystal semiconductor substrate and an inorganic insulating film (or an insulating layer) that is bonded to the single crystal semiconductor layer. The protective layer can be formed of a single layer or a layered structure of a plurality of layers selected from a group of a silicon nitride layer, a silicon oxide layer, a silicon nitride oxide layer, and a silicon oxynitride layer. These layers can be formed over the single crystal semiconductor substrate before the weakened layer is formed in the single crystal semiconductor substrate. Alternatively, such a layer may be formed over the single crystal semiconductor substrate after the weakened layer is formed in the single crystal semiconductor substrate.

It is necessary to add ions under a high dose condition in the formation of the weakened layer, and the surface of the single crystal semiconductor substrate 1108 becomes rough in some cases. Therefore, a protective layer against addition of ions may be provided on a surface to which ions are added by using a silicon nitride film, a silicon nitride oxide film, a silicon oxide film, or the like with a thickness of 50 to 200 nm.

For example, stacked layers of a silicon oxynitride film (a thickness of 5 to 300 nm, desirably 30 to 150 nm (e.g., 50 nm)) and a silicon nitride oxide film (a thickness of 5 to 150 nm, desirably 10 to 100 nm (e.g., 50 nm)) are formed as the protective layer over the single crystal semiconductor substrate 1108 by a plasma CVD method. As an example, a silicon oxynitride film is formed to a thickness of 50 nm over the single crystal semiconductor substrate 1108, and a silicon nitride oxide film is stacked to a thickness of 50 nm over the silicon oxynitride film. A silicon oxynitride film may be a silicon oxide film formed by a chemical vapor deposition method using an organosilane gas.

In addition, the single crystal semiconductor substrate 1108 may be degreased and washed, the oxide film at the surface may be removed, and thermal oxidation may be performed. As thermal oxidation, general dry oxidation may be performed; however, oxidation in an oxidizing atmosphere to which halogen is added is preferably performed. For example, heat treatment is performed at a temperature of greater than or equal to 700° C. in an atmosphere containing HCl at 0.5 to 10 volume % (preferably 3 volume %) with respect to oxygen. The thermal oxidation is preferably performed at a temperature of 950 to 1100° C. Processing time may be 0.1 to 6 hours, preferably 0.5 to 3.5 hours. The thickness of the oxide film to be formed is 10 to 1000 nm (preferably, 50 to 200 nm), and for example, the thickness is 100 nm.

As the one that contains a halogen, besides HCl, one or more selected from HF, $NF_3$, HBr, $Cl_2$, $ClF_3$, $BCl_3$, $F_2$, and $Br_2$ can be applied.

By performing heat treatment in such a temperature range, a gettering effect by a halogen element can be obtained. Gettering particularly has an effect of removing a metal impurity. That is, an impurity such as metal changes into a volatile chloride and is diffused into the air to be removed by an operation of chlorine. The gettering is effective in one in which the surface of the single crystal semiconductor substrate 1108 is subjected to chemical mechanical polishing (CMP) treatment. In addition, hydrogen has a function of compensating a defect at the interface between the single crystal semiconductor substrate 1108 and the inorganic insulating film (or the insulating layer) to be formed and reducing a localized state density at the interface, whereby the interface between the single crystal semiconductor substrate 1108 and the inorganic insulating film (or the insulating layer) is inactivated to stabilize electric characteristics.

Halogen can be contained in the oxide film formed by this heat treatment. A halogen element is contained at a concentration of $1 \times 10^{17}/cm^3$ to $5 \times 10^{20}/cm^3$, whereby the oxide film can function as a protective layer which captures an impurity such as metal and prevents contamination of the single crystal semiconductor substrate 1108.

When the weakened layer 1110 is formed, accelerating voltage and the total number of ions can be adjusted in accordance with the thickness of a film deposited over the single crystal semiconductor layer, the thickness of the targeted single crystal semiconductor layer which is to be separated from the single crystal semiconductor substrate and transferred to the formation substrate, and ion species which are added.

For example, a hydrogen gas is used as a material, and ions are added by an ion doping method at an acceleration voltage of 40 kV, and the total number of ions of $2 \times 10^{16}$ ions/$cm^2$, so that the weakened layer can be formed. If the protective layer is made to be thick, when ions are added under the same condition and the weakened layer is formed, a thin single crystal semiconductor layer can be formed as a targeted semiconductor layer which is separated from the single crystal semiconductor substrate and transferred (transposed) to the formation substrate. For example, although it depends on the proportion of ion species ($H^+$, $H_2^+$, and $H_3^+$ ions), in the case where the weakened layer is formed under the above conditions and a silicon oxynitride film (a thickness of 50 nm) and a silicon nitride oxide film (a thickness of 50 nm) are stacked as a protective layer over the single crystal semiconductor substrate, the thickness of the single crystal semiconductor layer to be transferred to the formation substrate is approximately 120 nm; or in the case where a silicon oxynitride film (a thickness of 100 nm) and a silicon nitride oxide film (a thickness of 50 nm) are stacked as a protective layer over the single crystal semiconductor substrate under the above conditions, the thickness of the single crystal semiconductor layer to be transferred to the formation substrate is approximately 70 nm.

In the case where helium (He) or hydrogen is used as a source gas, ions are added with an accelerating voltage in the range of 10 to 200 kV and with a dose in the range of $1 \times 10^{16}$ ions/cm² to $6 \times 10^{16}$ ions/cm² so that the weakened layer can be formed. In the case where helium is used as a source gas, He⁺ ions can be added as main ions without mass separation. In addition, in the case where hydrogen is used as a source gas, $H_3^+$ ions and $H_2^+$ ions can be added as main ions. Ion species changes depending on a plasma generation method, pressure, the supply quantity of a source gas, or accelerating voltage.

As another example of formation of the weakened layer, a silicon oxynitride film (a thickness of 50 nm), a silicon nitride oxide film (a thickness of 50 nm), and a silicon oxide film (a thickness of 50 nm) are stacked as a protective layer over the single crystal semiconductor substrate, and hydrogen is added at an acceleration voltage of 40 kV and a dose of $2 \times 10^{16}$ ions/cm² to form the weakened layer in the single crystal semiconductor substrate. Then, a silicon oxide film (a thickness of 50 nm) is formed as an insulating layer having a bonding surface over the silicon oxide film, which is a top layer of the protective layer. As another example of the formation of the weakened layer, a silicon oxide film (a thickness of 100 nm) and a silicon nitride oxide film (a thickness of 50 nm) are stacked as a protective layer over the single crystal semiconductor substrate, and hydrogen is added at an acceleration voltage of 40 kV and a dose of $2 \times 10^{16}$ ions/cm² to form the weakened layer in the single crystal semiconductor substrate. Then, a silicon oxide film (a thickness of 50 nm) is formed as an insulating layer having a bonding surface over the silicon oxide film, which is a top layer of the protective layer. Note that the silicon oxynitride film or the silicon nitride oxide film may be formed by a plasma CVD method, and the silicon oxide film may be formed by a CVD method using an organosilane gas.

Alternatively, an insulating layer may be formed between the inorganic insulating film and the single crystal semiconductor substrate. The insulating layer may be formed on one of or both the inorganic insulating film side and the single crystal semiconductor substrate side. The insulating layer which is formed over a surface to be bonded has a smooth surface and forms a hydrophilic surface. As the insulating layer, a silicon oxide film can be used. As the silicon oxide film, a silicon oxide film formed by a chemical vapor deposition method using an organosilane gas is preferable. Alternatively, a silicon oxide film formed by a chemical vapor deposition method using a silane gas may be used.

Examples of organosilane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, in the case where a silicon oxide layer is formed by a chemical vapor deposition method using organosilane as a source gas, it is preferable to mix a gas which provides oxygen. For a gas which provides oxygen, oxygen, nitrous oxide, nitrogen dioxide, or the like can be used. Further, an inert gas such as argon, helium, nitrogen, hydrogen, or the like may be mixed.

In addition, as the insulating layer which is formed over the surface to be bonded, a silicon oxide film formed by a chemical vapor deposition method using silane such as monosilane, disilane, or trisilane as a source gas can also be used. Also in this case, it is preferable to mix an inert gas, a gas which provides oxygen, or the like. In addition, the silicon oxide film to be the insulating layer which is bonded to the single crystal semiconductor layer may contain chlorine. Note that a chemical vapor deposition (CVD) method in this specification includes a plasma CVD method, a thermal CVD method, and a photo CVD method in its category.

Alternatively, as the insulating layer which is formed over the surface to be bonded, silicon oxide formed by heat treatment under an oxidizing atmosphere, silicon oxide which grows by reaction of an oxygen radical, chemical oxide formed using an oxidative chemical solution, or the like may be used. As the insulating layer, an insulating layer including siloxane (Si—O—Si) bond may be used. Alternatively, the organosilane gas may react with an oxygen radical or a nitrogen radical to form the insulating layer.

The surfaces of the inorganic insulating film and the insulating layer, which are to be bonded are set as follows: desirably, arithmetic mean roughness Ra is less than 0.8 nm and root-mean-square roughness Rms is less than 0.9 nm; more desirably, Ra is 0.4 nm or less and Rms is 0.5 nm or less; still desirably, Ra is 0.3 nm or less and Rms is 0.4 nm or less. For example, Ra is 0.27 nm and Rms is 0.34 nm. In this specification, Ra is arithmetic mean roughness, Rms is root-mean-square roughness, and the measurement range is 2 or 10 µm².

In bonding the inorganic insulating film and the single crystal semiconductor substrate to each other, strong bond can be obtained by providing an insulating layer formed of a silicon oxide film which is deposited preferably using organosilane as a material on one of or both surfaces to be bonded.

Figure 20B:
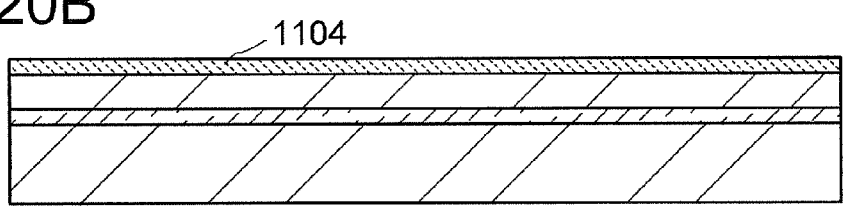

In this embodiment mode, a silicon oxide film is formed as an insulating layer 1104 over the surface to be bonded to the inorganic insulating film as shown in FIG. 20B. As the silicon oxide film, a silicon oxide film formed by a chemical vapor deposition method using an organosilane gas is preferable. Alternatively, a silicon oxide film formed by a chemical vapor deposition method using a silane gas can be used. In film formation by a chemical vapor deposition method, a film formation temperature of, for example, 350° C. or less (a specific example is 300° C.) is applied as the temperature that does not have degasification from the weakened layer 1110, which is formed in the single crystal semiconductor substrate. In addition, heat treatment temperature which is higher than the film formation temperature is used for heat treatment by which a single crystal semiconductor layer is separated from a single crystal semiconductor substrate.

In this embodiment mode, after a semiconductor element layer is formed over a formation substrate, a separation layer is provided between the formation substrate and the semiconductor element layer to separate the semiconductor element layer from the formation substrate. Accordingly, the single crystal semiconductor layer separated from the single crystal semiconductor substrate and bonded is formed over the separation layer and the inorganic insulating film provided over the formation substrate. If the surface of the separation layer is uneven, in a process in which the single crystal semiconductor substrate and the formation substrate are bonded to each other, an area in contact in the bonded surface becomes small, whereby it is difficult to obtain adequate bonding strength. Thus, it is necessary for the separation layer to be flattened.

Figure 18A:
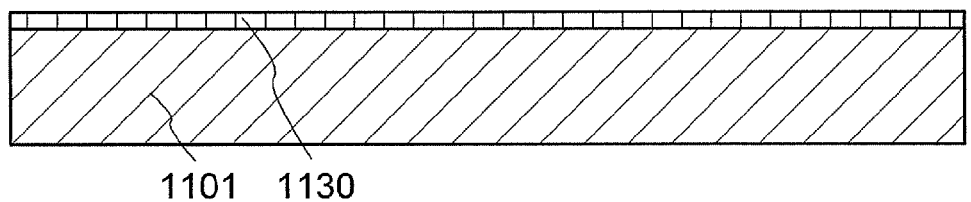
FIGS. 18A to 18C are views illustrating a manufacturing method of a semiconductor device, according to an aspect of this invention.
Figure 18B:
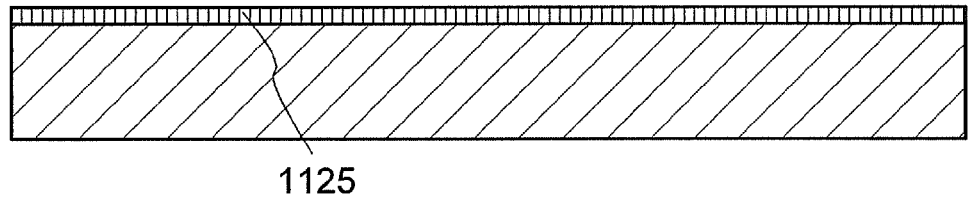
Figure 18C:
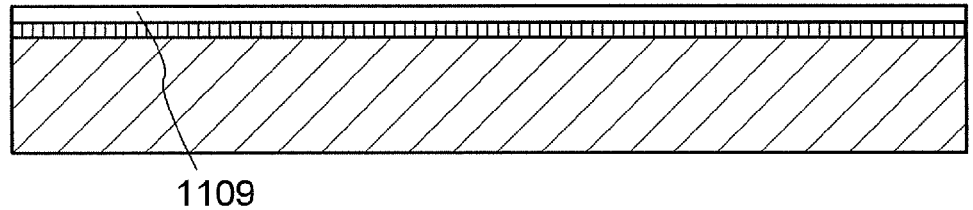

In FIG. 18A, a separation layer 1130 is formed over a formation substrate 1101. By performing flattening treatment on the separation layer 1130, a separation layer 1125 whose surface is flattened can be formed (see FIG. 18B). By forming an inorganic insulating film 1109 over the flattened separation layer 1125, the level of flatness of the surface of the inorganic insulating film 1109 can also be increased (see FIG. 18C).

As flattening treatment, polishing treatment or etching treatment may be performed. It is needless to say that both polishing treatment and etching treatment may be performed. As polishing treatment, a chemical mechanical polishing (CMP) method or a liquid jet polishing method can be employed. As etching treatment, wet etching or dry etching, or both of them can be employed as appropriate.

Alternatively, plasma treatment may be performed as flattening treatment. For example, a reverse sputtering method can be employed. By performing flattening treatment by a reverse sputtering method, a procedure from formation of the inorganic insulating film and the inorganic insulating layer to flattening can be done in the same apparatus, whereby throughput is improved, which is preferable.

A reverse sputtering method is performed by, for example, introducing an inert gas such as an Ar gas to a high vacuum chamber and generating a plasma state by applying an electric field to a surface to be processed. The plasma contains electrons and positive ions of Ar, and the positive ions of Ar are accelerated in the direction of cathode. The surface which is to be processed is sputtered by the positive ions of Ar accelerated. At that time, a convex portion of the surface which is to be processed is preferentially sputtered. Particles ejected from the surface which is to be processed adhere to a different spot in the surface which is to be processed. At that time, the particles preferentially adhere to a concave portion of the surface which is to be processed. In this manner, by reducing the convex portion and filling the concave portion, the flatness of the surface which is to be processed can be thought to be improved.

In this embodiment mode, the separation layer is formed by a sputtering method and flattened by a reverse sputtering method.

The formation substrate may be provided with a silicon nitride film or a silicon nitride oxide film which prevents diffusion of an impurity element as a blocking layer (also referred to as a barrier layer) between the formation substrate and the separation layer. Further, a silicon oxynitride film may be combined as an insulating film having a function of reducing stress.

Figure 20C:
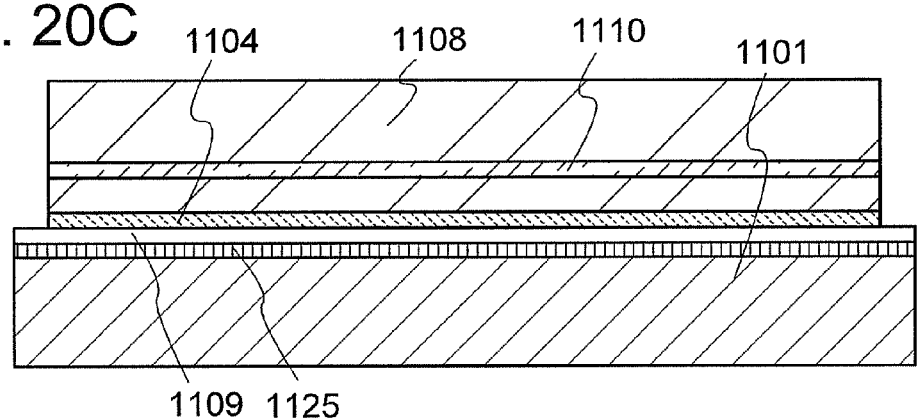

FIG. 20C illustrates an aspect in which the inorganic insulating film 1109 provided over the formation substrate 1101 is made in close contact with and bonded to a surface on which the insulating layer 1104 of the single crystal semiconductor substrate 1108 is formed. Since the surface of the inorganic insulating film 1109 is provided over the flattened separation layer 1125, the surface has a high degree of flatness. A surface to be bonded is purified sufficiently. The inorganic insulating film 1109 provided over the formation substrate 1101 and the surface of the single crystal semiconductor substrate 1108 on which the insulating layer 1104 is formed may be purified by megasonic cleaning or the like. In addition, the surface of the inorganic insulating film 1109 and the surface of the insulating layer 1104 may be cleaned with ozone water after megasonic cleaning, whereby an organic substance may be removed, and the hydrophilicity of the surfaces may be improved.

By making the inorganic insulating film 1109 over the formation substrate 1101 and the insulating layer 1104 face each other and pressing one part thereof from the outside, the inorganic insulating film 1109 and the insulating layer 1104 attract each other by increase in a Van der Waals force or contribution of hydrogen bonding due to local reduction in distance between the bonding surfaces. Further, since a distance between the inorganic insulating film 1109 over the formation substrate 1101 and the insulating layer 1104, which face each other, is also decreased in an adjacent region, a region in which a Van der Waals force strongly acts or a region in which hydrogen bonding is involved is increased, whereby bonding proceeds to the whole bonding surface. For example, a pressure of about 100 to 5000 kPa may be used. Alternatively, by arranging a supporting substrate and a semiconductor substrate so as to overlap with each other, bonding may proceed by the weight of the substrate which overlaps.

In order to obtain favorable bonding, the surface may be activated. For example, the surface which is to be bonded is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such a surface treatment makes bonding between different kinds of materials easier even at a temperature of 200 to 400° C.

In order to improve bonding strength of a bond interface between the formation substrate and the insulating layer, heat treatment is preferably performed. For example, heat treatment is performed in a temperature condition of 70 to 350° C. (e.g., at 200° C. for 2 hours) in an oven, a furnace, or the like.

Figure 20D:
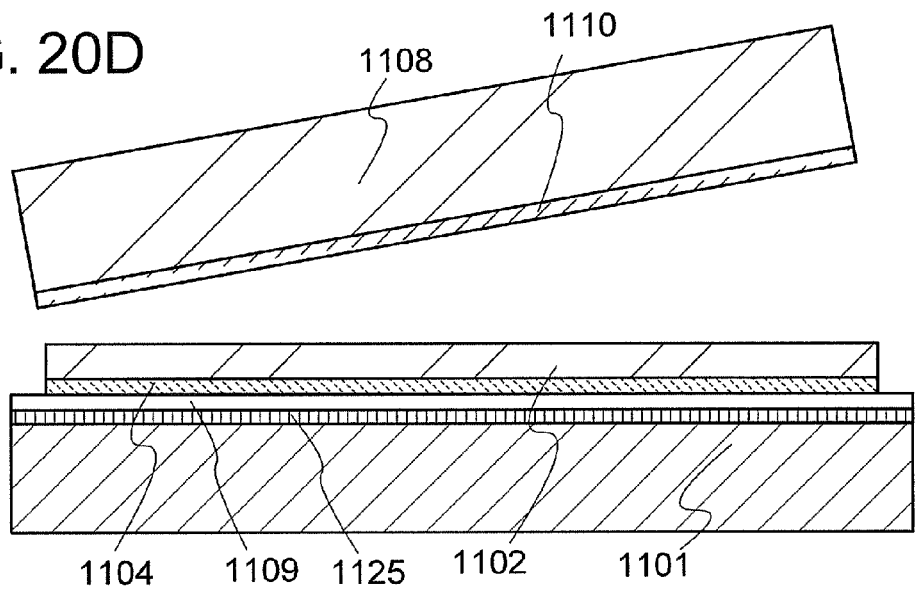

In FIG. 20D, after the formation substrate 1101 and the single crystal semiconductor substrate 1108 are attached to each other, heat treatment is performed, and the single crystal semiconductor substrate 1108 is separated from the formation substrate 1101 with the weakened layer 1110 serving as a cleavage plane. When heat treatment is performed at, for example, 400 to 700° C., a change occurs in the volume of microvoids formed in the weakened layer 1110, which enables cleavage to occur along the weakened layer 1110. Since the insulating layer 1104 is bonded to the formation substrate 1101 with the inorganic insulating film 1109 interposed therebetween, a single crystal semiconductor layer 1102 having the same crystallinity as the single crystal semiconductor substrate 1108 remains on the formation substrate 1101.

Heat treatment in a temperature range of 400 to 700° C. may be continuously performed with the same device as the above heat treatment for improving the bonding strength or with another device. For example, after heat treatment in a furnace at 200° C. for 2 hours, a temperature is increased to near 600° C. and held for 2 hours, a temperature is decreased to a temperature ranging from room temperature to 400° C., and then the substrate is taken out of the furnace. Alternatively, heat treatment may be performed with a temperature increasing from room temperature. Further, after heat treatment in a furnace at 200° C. for 2 hours, heat treatment may be performed at a temperature range of 600 to 700° C. for 1 minute to 30 minutes (e.g., at 600° C. for 7 minutes, or at 650° C. for 7 minutes) with a rapid thermal annealing (RTA) apparatus.

By heat treatment in a temperature range of 400 to 700° C., bonding between the insulating layer and the formation substrate shifts from hydrogen bonding to covalent bonding, and an element added to the weakened layer is taken out and pressure rises, whereby the single crystal semiconductor layer can be separated from the single crystal semiconductor substrate. After the heat treatment, the formation substrate and the single crystal semiconductor substrate are in a state where one of them is provided over the other, and the formation substrate and the single crystal semiconductor substrate can be separated from each other without application of large force. For example, one substrate provided over the other substrate is lifted by a vacuum chuck, so that the substrate can be easily separated. At this time, if a substrate on a lower side is fixed with a vacuum chuck or a mechanical chuck, both the formation substrate and the single crystal semiconductor substrate can be separated from each other without horizontal misalignment.

Note that in FIGS. 20A to 20D and FIGS. 21A to 21C, an example is shown in which the single crystal semiconductor substrate 1108 is smaller than the formation substrate 1101; however, this invention is not limited thereto, and the single crystal semiconductor substrate 1108 and the formation substrate 1101 may be the same size or the semiconductor substrate 1108 may be larger than the formation substrate 1101.

Figure 21A:
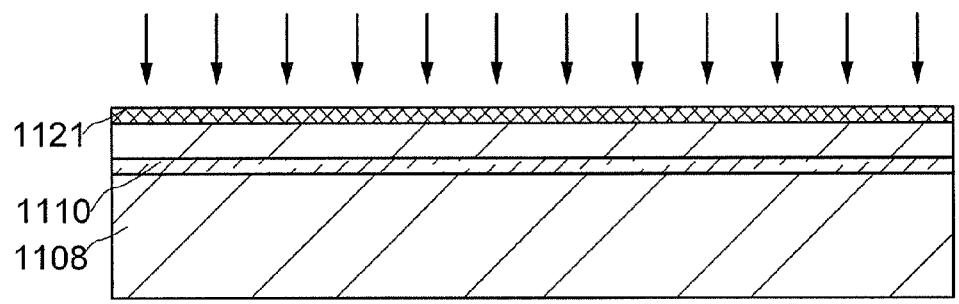
FIGS. 21A to 21C are views illustrating a manufacturing method of a semiconductor device, according to an aspect of this invention.
Figure 21B:
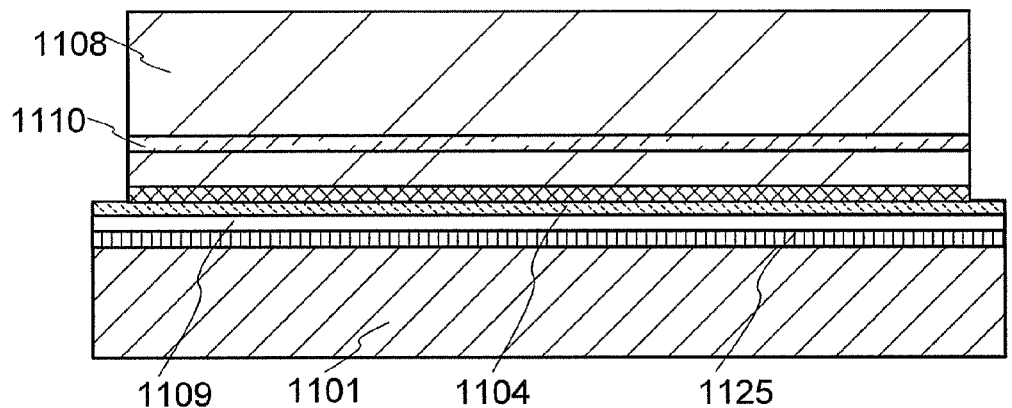
Figure 21C:
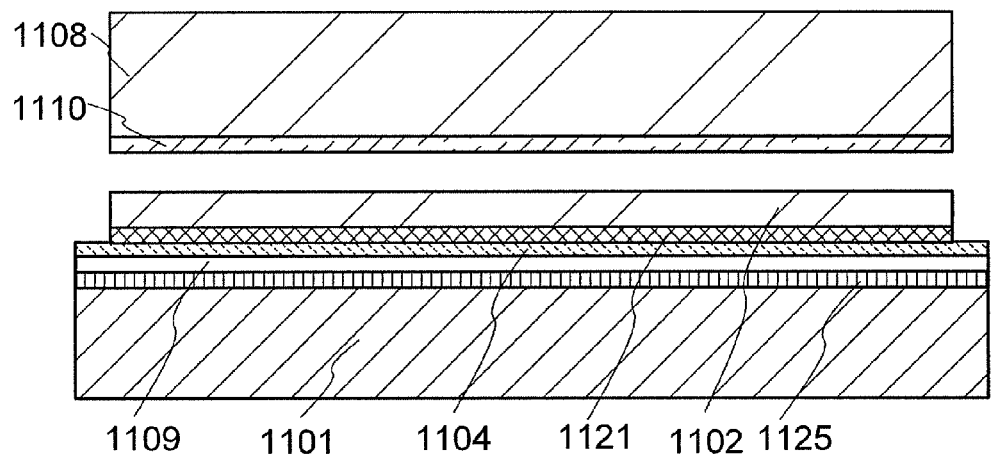

FIGS. 21A to 21C show a process in which an insulating layer is provided on a formation substrate side and a single crystal semiconductor layer is formed. FIG. 21A shows a step in which ions accelerated by an electric field are added to the single crystal semiconductor substrate 1108 provided with a silicon oxide film as a protective layer 1121 to form the weakened layer 1110 at a certain depth. Ions are added in a manner similar to that in FIG. 20A. The protective layer 1121 is formed on the surface of the single crystal semiconductor substrate 1108, so that the surface can be prevented from being damaged by the addition of ions and thus losing flatness. In addition, an effect to prevent diffusion of impurities with respect to the single crystal semiconductor layer 1102 that is formed from the single crystal semiconductor substrate 1108 by using the protective layer 1121 appears.

In FIG. 21B, a step is shown in which the formation substrate 1101 provided with the inorganic insulating film 1109 and the insulating layer 1104, and the protective layer 1121 of the single crystal semiconductor substrate 1108 are made to be in close contact with and bonded to each other. By arranging the insulating layer 1104 over the formation substrate 1101 in close contact with the protective layer 1121 of the single crystal semiconductor substrate 1108, they are bonded to each other.

After that, as shown in FIG. 21C, the single crystal semiconductor substrate 1108 is separated. Heat treatment for separating the single crystal semiconductor layer is performed in a manner similar to that shown in FIG. 20D. In this manner, a semiconductor substrate of this invention with an SOI structure in which a single crystal semiconductor layer is formed with the insulating layer interposed between the single crystal semiconductor layer and the inorganic insulating film can be obtained as shown in FIG. 21C.

In addition, in the single crystal semiconductor layer separated from the single crystal semiconductor substrate and transferred to the formation substrate, a crystal defect is caused due to the separation step and the ion irradiation step and unevenness can be caused due to loss of flatness on the surface of the single crystal semiconductor layer in some cases. When a transistor is formed as a semiconductor element using the single crystal semiconductor layer, it is difficult to form a thin gate insulating layer with high withstand voltage over the top surface of the single crystal semiconductor layer with such unevenness. In addition, if the single crystal semiconductor layer has a crystal defect, performance and reliability of the transistor are adversely affected; for example, a localized interface state density with the gate insulating layer is increased.

Therefore, the crystal defect is preferably reduced by irradiation of the single crystal semiconductor layer with an electromagnetic wave such as a laser beam. At least part of a region of the single crystal semiconductor layer is melted by irradiation with electromagnetic waves, and a crystal defect in the single crystal semiconductor layer can be reduced. Note that an oxide film (a native oxide film or a chemical oxide film) formed on the surface of the single crystal semiconductor layer is preferably removed using dilute hydrofluoric acid before irradiation with electromagnetic waves.

Any electromagnetic wave may be used as long as it can provide high energy to the single crystal semiconductor layer, and a laser beam can be preferably used.

The energy supply to the single crystal semiconductor layer can be performed by colliding particles having high energy with the single crystal semiconductor layer by irradiation or the like and mainly by heat conduction. As a heat source for supplying the particles having high energy, plasma can be used; normal-pressure plasma, high-pressure plasma, a thermal plasma jet, or a flame of a gas burner or the like can be used. Further, as another example of the heat source, an electron beam or the like can be given.

The wavelengths of electromagnetic waves are wavelengths that are absorbed by the single crystal semiconductor layer. The wavelengths can be determined in consideration for the skin depth of electromagnetic waves or the like. For example, the wavelengths of electromagnetic waves can be 190 to 600 nm. In addition, electromagnetic wave energy can be determined in consideration for the wavelengths of electromagnetic waves, the skin depth of electromagnetic waves, the thickness of the single crystal semiconductor layer to be irradiated, or the like.

A laser emitting the laser beam can be a continuous wave laser, a pseudo continuous wave laser, or a pulsed laser. A pulsed laser is preferable for partial melting. For example, an excimer laser such as a KrF laser, or a gas laser such as an Ar laser or a Kr laser can be used. In addition, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, and a $Y_2O_3$ laser can be given. An excimer laser is a pulsed laser, and some solid lasers such as a YAG laser can be used as a continuous wave laser, a pseudo continuous wave laser, and a pulsed laser. Note that in a solid-state laser, the second to fifth harmonics of a fundamental wave is preferably used. In addition, a semiconductor laser such as GaN, GaAs, GaAlAs, or InGaAsP can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. A flash annealing with the use of the above lamp light may be used. Since a flash annealing which is performed by preferably using a halogen lamp, a xenon lamp, or like takes very short treatment time, heating up of the formation substrate can be suppressed.

A shutter; a reflector such as a mirror or a half mirror; an optical system including a cylindrical lens, a convex lens, or the like may be provided to adjust the shape or path of electromagnetic waves.

Note that, as for an irradiation method of electromagnetic waves, electromagnetic waves may be selectively emitted, or light (electromagnetic waves) is scanned in the XY directions so that light (electromagnetic waves) can be emitted. In that case, a polygon mirror or a galvanometer mirror is preferably used for the optical system.

Irradiation with electromagnetic waves can be performed in an atmosphere which contains oxygen such as an atmospheric atmosphere or in an inert atmosphere such as a nitrogen atmosphere. To perform irradiation with electromagnetic waves in an inert atmosphere, irradiation with electromagnetic waves may be performed in an airtight chamber, and an atmosphere in this chamber may be controlled. In the case where a chamber is not used, a nitrogen atmosphere can be formed by spraying a surface, which is to be irradiated with electromagnetic waves, with an inert gas such as nitrogen gas or the like.

Further, polishing treatment may be performed on the surface of the single crystal semiconductor layer which is supplied with high energy such as irradiation of an electromagnetic wave to reduce a crystal defect. By the polishing treatment, the flatness of the surface of the single crystal semiconductor layer can be increased.

As the polishing treatment, a chemical mechanical polishing (CMP) method or a liquid jet polishing method can be employed. Note that the surface of the single crystal semiconductor layer is cleaned and purified before polishing treatment. The cleaning may be performed by megasonic cleaning, two-fluid jet cleaning, or the like; and dust or the like of the surface of the single crystal semiconductor layer is removed by cleaning. In addition, it is preferable to remove a native oxide film or the like on the surface of the single crystal semiconductor layer by using dilute hydrofluoric acid to expose the single crystal semiconductor layer.

In addition, polishing treatment (or etching treatment) may be performed on the surface of the single crystal semiconductor layer before irradiation with electromagnetic waves.

In this embodiment mode, when a single crystal silicon substrate is used as the single crystal semiconductor substrate 1108, a single crystal silicon layer can be obtained as the single crystal semiconductor layer 1102. Further, in the method for manufacturing a semiconductor devce in this embodiment mode, the process temperature can be set to 700° C. or less; therefore, a glass substrate can be used as the formation substrate 1101. That is, as is the case of conventional thin film transistors, a transistor can be formed over a glass substrate and a single crystal silicon layer can be used for the semiconductor layer. These make it possible to form a transistor with high performance and high reliability in which high speed operation is possible and which can be driven with a low subthreshold value, high field effect mobility, and low consumption voltage can be formed over a formation substrate such as a glass substrate.

Single crystal semiconductor layers 283 and 284 included in transistors 211 and 230, respectively, shown in FIGS. 3A to 3D and FIGS. 4A to 4E are single crystal semiconductor layers separated from single crystal semiconductor substrates and transferred to formation substrates 200 and 220, respectively. The single crystal semiconductor layers 283 and 284 can be formed by processing the single crystal semiconductor layer 1102 shown in FIG. 20D into a desired shape. Note that in FIGS. 3A to 3D, FIGS. 4A to 4E, and FIGS. 20A to 20D, the formation substrate 1101 corresponds to the substrates 200 and 220; the separation layer 1125, separation layers 201 and 221; the inorganic insulating film 1109, inorganic insulating films 202 and 222; and the insulating layer 1104, insulating layers 280 and 281. Note that although an example in which a semiconductor substrate with an SOI structure corresponding to the construction shown in FIG. 20D is employed is described, a semiconductor substrate with an SOI structure having different construction in this specification may be employed.

The inorganic insulating film 202, the insulating layer 280, the transistor 211, an insulating film 212, and an insulating film 213 are formed over the substrate 200 having an insulating surface, which is a formation substrate, with the separation layer 201 interposed therebetween, so that a semiconductor element layer 250 is formed. The transistor 211 is a thin film transistor and includes a single crystal semiconductor layer 283 having source and drain regions 204a and 204b, impurity regions 205a and 205b in which the concentration of the impurity is lower than that in the source and drain regions 204a and 204b, and a channel formation region 206, a gate insulating layer 207, a gate electrode layer 208, and insulating layers 209a and 209b with a side wall structure. The source and drain regions 204a and 204b are in contact with and electrically connected to wiring layers 210a and 210b which function as source and drain electrode layers. In this embodiment mode, the transistor 211 is an n-channel thin film transistor and impurity elements (e.g., phosphorus (P) or arsenic (As)) imparting n-type conductivity are contained in the source and drain regions 204a and 204b, and the impurity regions 205a and 205b which are LDD (lightly doped drain) regions.

Figure 3A:
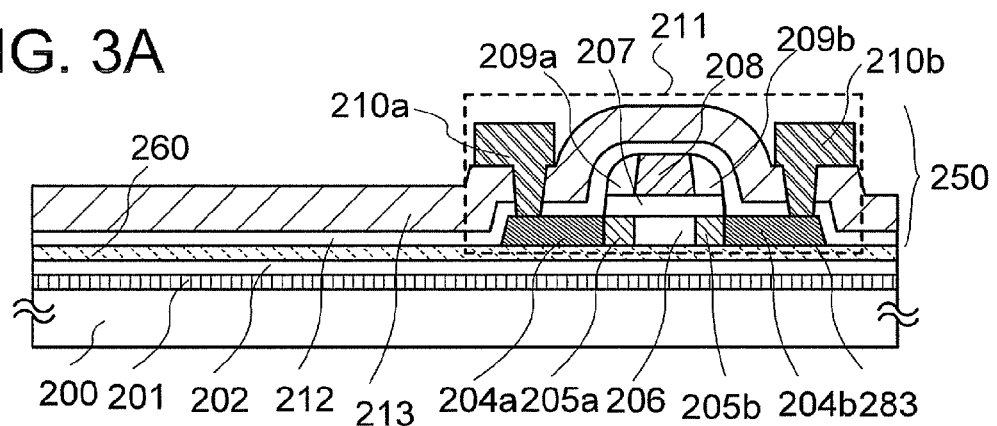
FIGS. 3A to 3D are views illustrating a manufacturing method of a semiconductor device, according to an aspect of this invention.
Figure 3B:
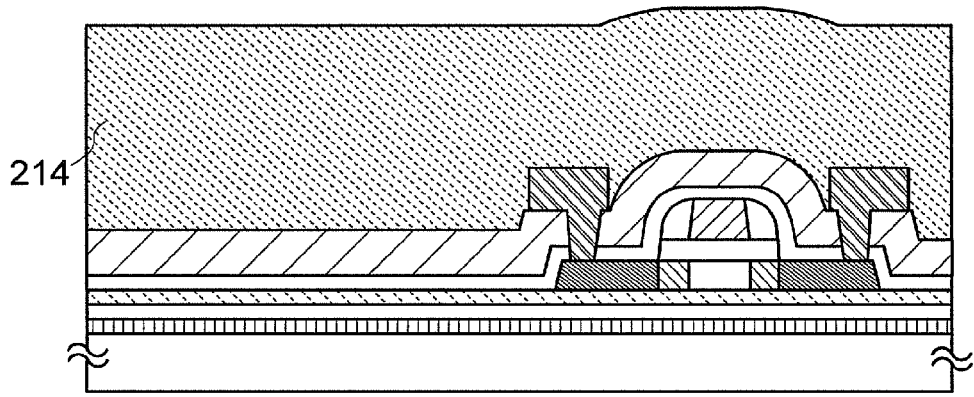
Figure 3C:
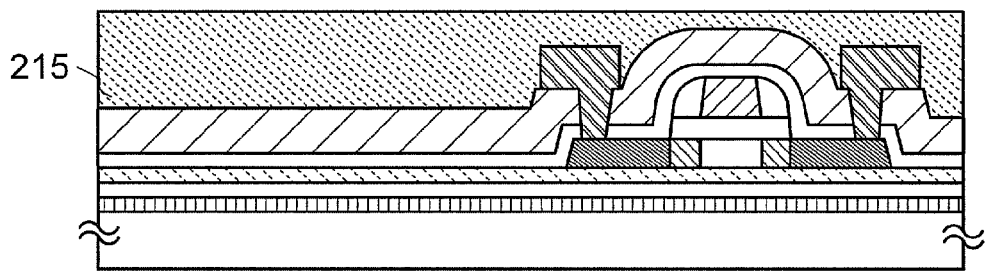

In order to flatten unevenness caused by the transistor 211 and the like of the semiconductor element layer 250, an inorganic insulating layer 214 is formed (see FIG. 3B). Flattening treatment is performed on the inorganic insulating layer 214 to form a flattened inorganic insulating layer 215 (see FIG. 3C).

Figure 3D:
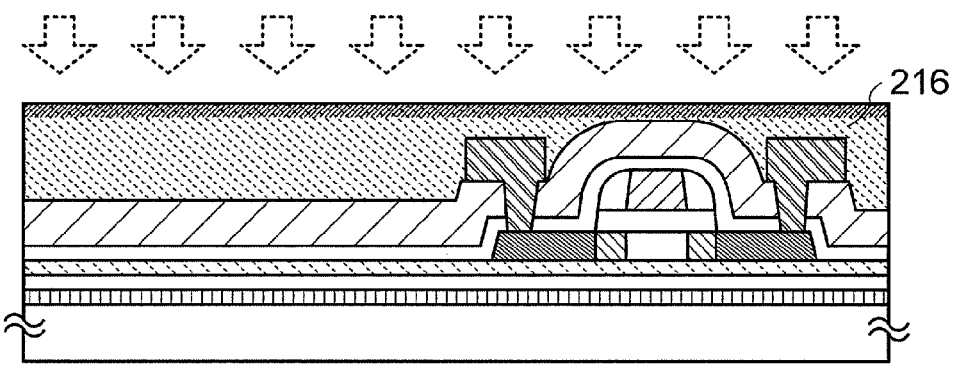

Since the flattened inorganic insulating layer 215 serves as a surface which is to be bonded to a semiconductor element layer formed over another substrate, in this embodiment mode, plasma treatment is performed on the inorganic insulating layer 215 for activation to form an inorganic insulating layer 216 whose surface is modified (see FIG. 3D). Through the above-described steps, steps up to the one before bonding the semiconductor element layer 250 which is to be in a bottom layer are completed.

On the other hand, steps for forming a semiconductor element layer 251 to be in a top layer, which is stacked over the semiconductor element layer 250 will be described with reference to FIGS. 4A to 4E.

The inorganic insulating film 222, the insulating layer 281, the transistor 230 including the single crystal semiconductor layer 284, the insulating film 223, and the insulating film 224 are formed over the substrate 220, which is a formation substrate and has an insulating surface, with the separation layer 221 interposed between the substrate 220 and the inorganic insulating film 222 to form the semiconductor element layer 251. Although transistor 230 is a thin film transistor having the same structure as the transistor 211, the transistor 230 is a p-channel thin film transistor which has conductivity opposite to that of the transistor 211 in this embodiment mode. Accordingly, the transistor 230 contains impurity elements (e.g., boron (B), aluminum (Al), or gallium (Ga)) imparting p-type conductivity to source and drain regions and an impurity region which is an LDD region.

Figure 4A:
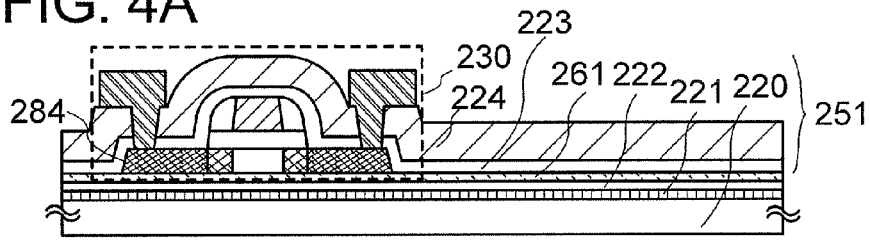
FIGS. 4A to 4E are views illustrating a manufacturing method of a semiconductor device, according to an aspect of this invention.
Figure 4B:
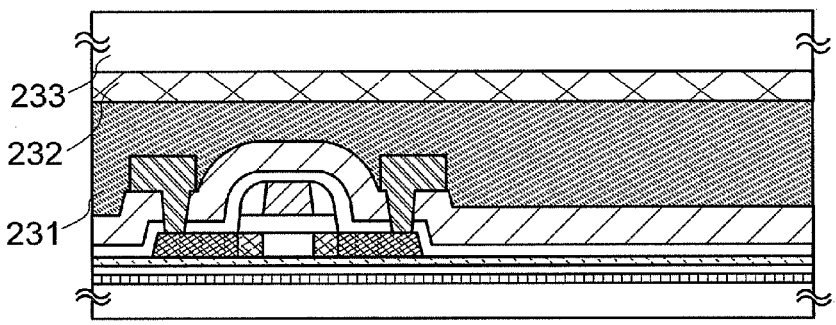
Figure 4C:
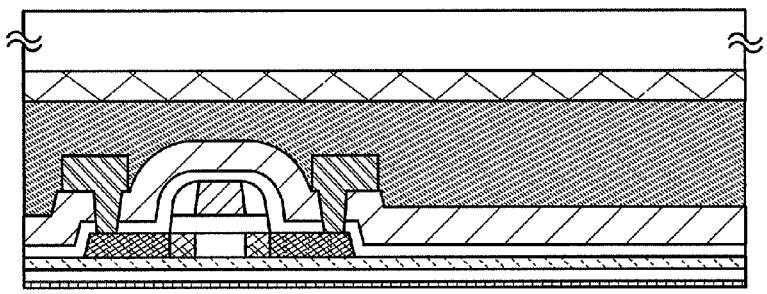

A resin layer 231 is provided over the semiconductor element layer 251, and a holding substrate 233 is bonded to the resin layer 231 by a sticking layer 232 (see FIG. 4B). Note that in this specification, a sticking layer is a film that has a function of temporarily bonding materials of different kinds to each other and can be separated by light or heat.

The semiconductor element layer 251 is separated from the substrate 220 by using the separation layer 221. Thus, the semiconductor element layer 251 is provided on the holding substrate 233 side (see FIG. 4C).

Any of the following methods can be appropriately used as a step for transferring the semiconductor element layer to another substrate: a method in which a separation layer and an insulating layer are formed between a substrate and a semiconductor element layer, a metal oxide film is formed between the separation layer and the insulating layer, the metal oxide film is weakened by crystallization, and the semiconductor element layer is separated; a method in which an amorphous silicon film containing hydrogen is provided between a substrate having high heat resistance and a semiconductor element layer, and the amorphous silicon film is irradiated with laser beam or etched to remove the amorphous silicon film, thereby separating the semiconductor element layer; a method in which a separation layer and an insulating layer are formed between a substrate and a semiconductor element layer, a metal oxide film is provided between the separation layer and the insulating layer, the metal oxide film is weakened by crystallization, part of the separation layer is etched away using a solution or a halogen fluoride gas such as $NF_3$, $BrF_3$, or $ClF_3$, and separation is performed at the weakened metal oxide film; a method in which a substrate over which an element formation layer is formed is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with a laser beam so that nitrogen, oxygen, or hydrogen contained in the separation layer is emitted as a gas, thereby promoting separation between the semiconductor element layer and the substrate.

By combining the above-described separation methods, the transferring step can be more easily performed. That is, separation can be conducted with physical force (e.g., by a machine or the like) after making it easier for the separation layer and the semiconductor element layer to be separated from each other by conducting laser beam irradiation, etching the separation layer with a gas or a solution, and/or mechanically removing the separation layer using a keen knife or scalpel.

Alternatively, the semiconductor element layer can be separated from the formation substrate by permeation of liquid to an interface between the separation layer and the inorganic insulating film.

Figure 4D:
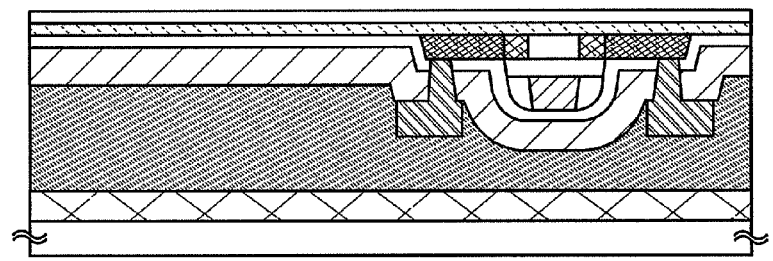

The separation layer 221 which remains on the inorganic insulating film 222 formed between the semiconductor element layer 251 and the separation 221 is removed to expose a flat surface of the inorganic insulating film 222 (see FIG. 4D). By removing the separation layer 221, which remains in an uneven form, from the surface of the inorganic insulating film 222, the surface of the inorganic insulating film 222 is flattened. However, flattening treatment may be further performed on the surface of the inorganic insulating film 222. For example, a tungsten film is used for the separation layer 221 and etching treatment by chlorine trifluoride can be performed on the surface of the inorganic insulating film 222 as flattening treatment.

Moreover, after the separation layer 221 is formed over the substrate 220, flattening treatment may be performed on the separation layer 221 before the inorganic insulating film 222 is deposited. By forming the inorganic insulating film 222 over the separation layer 221 on which flattening treatment is performed, the flatness of the surface of the inorganic insulating film 222 exposed by removal of the separation layer 221 can be increased.

As flattening treatment, polishing treatment or etching treatment may be performed. It is needless to say that both polishing treatment and etching treatment may be performed. As polishing treatment, a chemical mechanical polishing (CMP) method or a liquid jet polishing method can be employed. As etching treatment, wet etching or dry etching, or both of them can be employed as appropriate. Alternatively, plasma treatment may be performed as flattening treatment. For example, a reverse sputtering method can be employed.

Figure 4E:
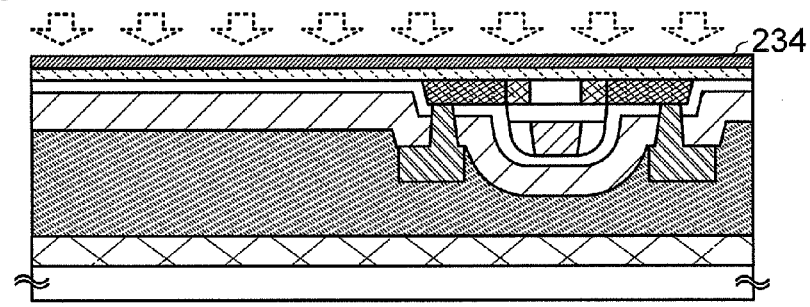

Since the exposed inorganic insulating film 222 serves as a surface which is to be bonded to a semiconductor element layer formed over another substrate, in this embodiment mode, plasma treatment is performed on the inorganic insulating film 222 for activation to form an inorganic insulating film 234 whose surface is subjected to modification treatment (see FIG. 4E). Through the above-described steps, steps up to the one before bonding the semiconductor element layer 251 which is to be in a top layer are completed.

A semiconductor element layer formed over a formation substrate with an inorganic insulating film interposed therebetween is separated from the formation substrate by using a separation layer, and the inorganic insulating film is exposed. The exposed inorganic insulating film is bonded to a flat inorganic insulating layer provided over a semiconductor element layer in a bottom layer, so that the semiconductor element layer in the bottom layer and an inorganic insulating layer in the top layer are bonded to each other. Plasma treatment is preferably performed on at least one of surfaces to be bonded of the exposed inorganic insulating film 222 and the flattened inorganic insulating layer 215, which is provided over the semiconductor element layer 250 in the bottom layer. In this embodiment mode, an example in which plasma treatment is performed on both surfaces to be bonded is described.

By making the inorganic insulating film 234 and the inorganic insulating layer 216, on which flattening and plasma treatment for activation are performed, in close contact with each other in order to bond them to each other, the semiconductor element layer 250 in the bottom layer and the semiconductor element layer 251 in the top layer are stacked (see FIG. 1A).

Plasma treatment for activating a surface makes bonding between materials of different kinds easier even at a room temperature to 400° C. Accordingly, a semiconductor device with a multi-layer structure can be manufactured through a low temperature process. In addition, since semiconductor element layers are bonded with a thin inorganic insulating layer and an inorganic insulating film, without using an organic material such as an adhesive, the semiconductor device can be reduced in thickness and size.

Moreover, it is preferable that surfaces to be bonded of the inorganic insulating film 234, the inorganic insulating layer 216, and an insulating layer be sufficiently purified. Note that the surfaces can be purified by megasonic cleaning or the like. In addition, the surfaces may be cleaned with ozone water after megasonic cleaning, an organic substance may be removed, and the hydrophilicity of the surfaces may be improved.

Then, by making the inorganic insulating film 234 and the inorganic insulating layer 216 face each other and pushing one portion from the outside, the inorganic insulating film 234 and the inorganic insulating layer 216 attract each other due to an increase in a Van der Waals force and contribution of hydrogen bonding because a distance between surfaces to be bonded is locally decreased. Further, since the distance between the inorganic insulating film 234 and the inorganic insulating layer 216, which face each other, in an adjacent region is reduced, a region in which Van der Waals force strongly acts or a region which is influenced by hydrogen bonding is widened. Accordingly, bonding proceeds and spreads to the entire bonding surfaces. For example, a pressure of about 100 to 5000 kPa may be used. Alternatively, bonding may be spread by making the inorganic insulating film 234 and the inorganic insulating layer 216 overlap with each other.

As another method for activating a surface in order to obtain favorable bond, a surface to be bonded may be irradiated with an atomic beam or an ion beam. When an atomic beam or an ion beam is used, an inert gas neutral atom beam or inert gas ion beam of argon or the like can be used. Alternatively, radical treatment may be performed.

In order to improve the bonding strength of a bond interface between the inorganic insulating film 234 and the inorganic insulating layer 216, heat treatment is preferably performed. For example, heat treatment is performed under a temperature condition of 70 to 350° C. (e.g., at 200° C. for 2 hours) in an oven, a furnace, or the like.

In addition, an insulating layer may be formed between the inorganic insulating film 234 and the inorganic insulating layer 216. The insulating layer may be formed on one or both of the inorganic insulating film 234 side and the inorganic insulating layer side. In that case, flattening treatment and plasma treatment for activation are performed on an insulating layer which is to be a surface to be bonded. The insulating layer formed on a surface to be bonded has a smooth surface and forms a hydrophilic surface. As the insulating layer, a silicon oxide film can be used. As the silicon oxide film, a silicon oxide film formed by a chemical vapor deposition method using an organosilane gas is preferable. Alternatively, a silicon oxide film formed by a chemical vapor deposition method using a silane gas may be used.

Examples of organosilane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, in the case where a silicon oxide layer is formed by a chemical vapor deposition method using organosilane as a source gas, it is preferable to mix a gas which provides oxygen. For a gas which provides oxygen, oxygen, nitrous oxide, nitrogen dioxide, or the like can be used. Further, an inert gas such as argon, helium, nitrogen, hydrogen, or the like may be mixed.

In addition, for the insulating layer which is formed over a surface to be bonded, a silicon oxide film formed by a chemical vapor deposition method using silane such as monosilane, disilane, or trisilane as a source gas can also be used. Also in this case, it is preferable to mix a gas which provides oxygen, an inert gas, or the like. In addition, a silicon oxide film which serves as the insulating layer to be bonded to a single crystal semiconductor layer may contain chlorine.

In addition, as the insulating layer which is formed over a surface to be bonded, silicon oxide formed by heat treatment under an oxidizing atmosphere, silicon oxide which grows by reaction of an oxygen radical, chemical oxide formed using an oxidative chemical solution, or the like can be used. As the insulating layer, an insulating layer including siloxane (Si—O—Si) bond may be used. Alternatively, an organosilane gas and an oxygen radical or a nitrogen radical may be reacted to form the insulating layer.

The surfaces of the inorganic insulating film, the inorganic insulating layer, and the insulating layer are set as follows: desirably, arithmetic mean roughness Ra is less than 0.8 nm and root-mean-square roughness Rms is less than 0.9 nm; more desirably, Ra is 0.4 nm or less and Rms is 0.5 nm or less; still desirably, Ra is 0.3 nm or less and Rms is 0.4 nm or less.

For example, Ra is 0.27 nm and Rms is 0.34 nm. In this specification, Ra is arithmetic mean roughness, Rms is root-mean-square roughness, and the measurement range is 2 or 10 $\mu m^2$.

In bonding the inorganic insulating film 234 to the inorganic insulating layer 216, strong bond can be obtained by providing an insulating layer formed of a silicon oxide film which is deposited preferably using organosilane as a source material on one of or both surfaces to be bonded.

Figure 1B:
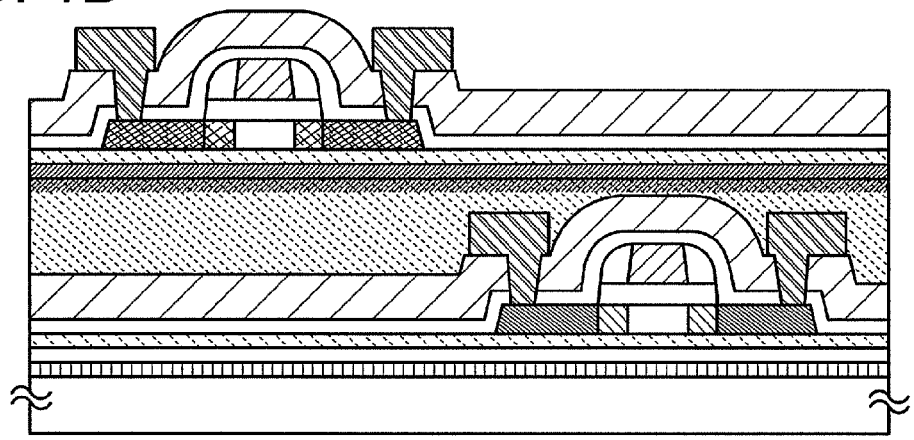

Next, the resin layer 231, the sticking layer 232, and the holding substrate 233 are separated from stacked layers of the semiconductor element layer 250 and the semiconductor element layer 251 to be removed (see FIG. 1B). In this embodiment mode, a water-soluble resin is used for a resin layer 231, and the sticking layer 232 and the holding substrate 233 are separated by melting and removing the resin layer. Another soluble resin or curable resin can also be used for the resin layer 231 so that the resin layer 231 is separated from the semiconductor element layer 251 chemically or physically.

Figure 1C:
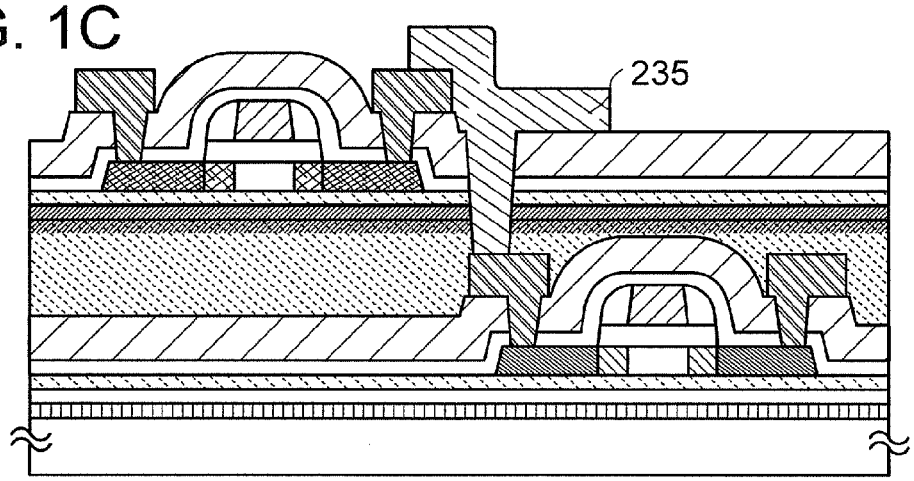

An opening (a contact hole) that penetrates the insulating film 224, the insulating film 223, the inorganic insulating film 234, and the inorganic insulating layer 216 is formed, and a wiring layer 235 that electrically connects the transistor 230 to the transistor 211 is formed (see FIG. 1C).

Figure 2A:
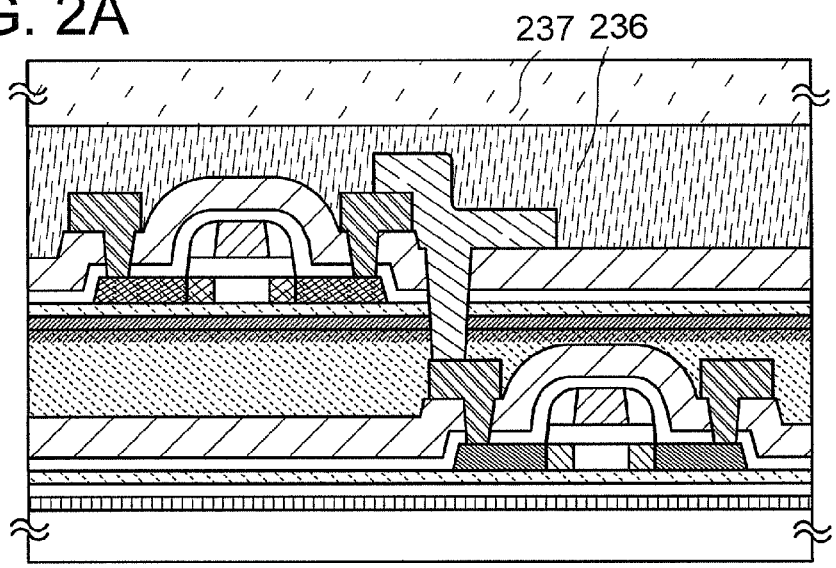
FIGS. 2A to 2C are views illustrating a manufacturing method of a semiconductor device, according to an aspect of this invention.
Figure 2B:
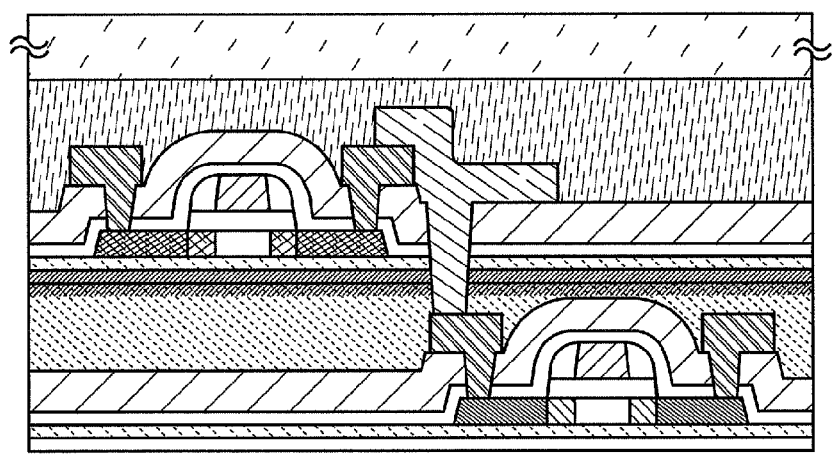
Figure 2C:
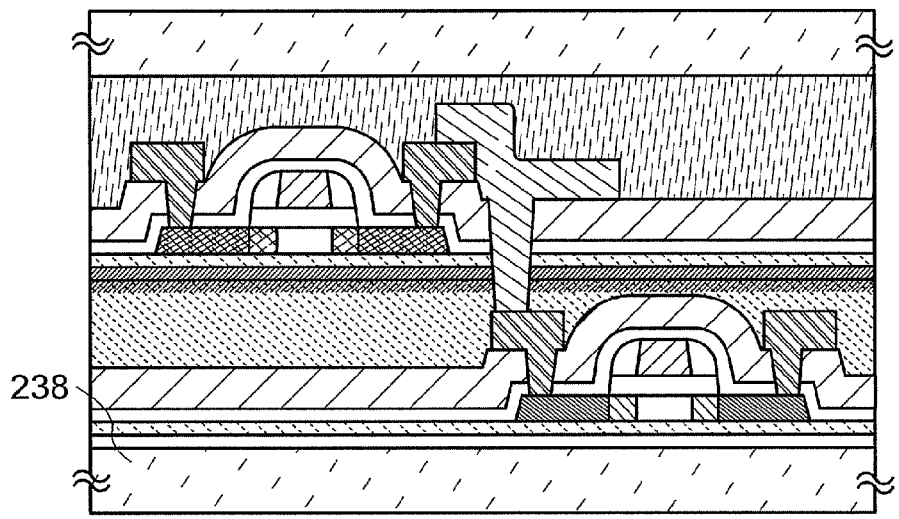

A resin layer 236 is formed over the semiconductor element layer 251 and the wiring layer 235, and a flexible substrate 237 is provided over the resin layer 236 (see FIG. 2A). The substrate 200 is separated by using the separation layer 201 and removed (see FIG. 2B). The separation layer which remains on the surface of the inorganic insulating film 202 is removed by etching or the like so that the surface of the inorganic insulating film 202 can be flattened. In the case where the inorganic insulating film 202 is further bonded to an inorganic insulating layer provided over another semiconductor element layer, it is preferable to flatten the inorganic insulating film 202. In this embodiment mode, a flexible substrate 238 is provided so as to be in contact with the inorganic insulating film 202 and seal the semiconductor element layer with a multi-layer structure (see FIG. 2C). The flexible substrate may be provided by adhering using an adhesive layer.

A semiconductor device manufactured in this embodiment mode may be a semiconductor device with flexibility by being provided over a flexible substrate.

Note that in the case where a semiconductor element layer of the lowest layer in a layered structure of semiconductor element layers is not separated from a substrate for formation, and the substrate for formation is used as a supporting substrate (sealing substrate) as it is, a separation layer need not be provided between the semiconductor element layer in the lowest layer and the substrate.

As the substrates 200 and 220 that are formation substrates, and the holding substrate 233, a glass substrate, a quartz substrate, a sapphire substrate, a ceramic substrate, a metal substrate over the surface of which an insulating layer is formed, or the like can be used. Further, a plastic substrate having heat resistance which can resist a processing temperature of this embodiment mode or a flexible substrate such as a film may also be used.

In the case where flattening treatment is performed on a substrate, a quartz substrate, a metal substrate such as a silicon substrate, or the like with high flatness and small flexure, is preferably used because the high flatness of the substrate is preferable. In contrast, in the case where the semiconductor element layer is separated from the formation substrate by using the separation layer, a flexible substrate such as a film or sheet whose shape can be changed in accordance with the semiconductor element layer is preferably used. The semiconductor element layer may be once separated from the formation substrate and transferred to a flexible film, and then a semiconductor element may be separated again and adhered to a metal substrate or the like with high flatness and low tendency to flex. In manufacturing steps of a semiconductor device, a formation substrate and a holding substrate may be selected as appropriate with respect to the steps to be performed.

As the flexible substrate such as the flexible substrates 237 and 238, a substrate formed from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film formed from polypropylene, polyester, vinyl, polyvinyl fluoride, vinyl chloride, or the like; paper formed from a fibrous material; a stacked film of a base film (such as polyester, polyamide, an inorganic evaporation film, or paper) and an adhesive synthetic resin film (such as an acrylic synthetic resin or an epoxy synthetic resin); or the like can be used. When the film is adhered to a body to be processed, an adhesive layer provided over the top surface of the film or a layer (not an adhesive layer) provided over an outermost layer is used. A condition can be selected in accordance with the kind of the film, and adhering can be performed by heating treatment or application of pressure. In addition, an adhesive layer may be provided for the substrate. The adhesive layers correspond to a layer having an adhesive such as a heat curing resin, an ultraviolet curing resin, an epoxy resin, and a resin additive.

By using a prepreg for the flexible substrate, damage caused by a point pressure or a linear pressure to a semiconductor device to be manufactured later can be prevented. Typically, a prepreg is formed in such a manner that, after a fibrous body of polyvinyl alcohol fiber, polyester fiber, polyamide fiber, polyethylene fiber, aramid fiber, polyparaphenylene benzobisoxazole fiber, glass fiber, carbon fiber, or the like is impregnated with varnish in which a matrix resin such as an epoxy resin, an unsaturated polyester resin, a polyimide resin, or a fluorine resin is diluted with an organic solvent, drying is performed so that the organic solvent is volatilized and the matrix resin is semi-cured.

A single crystal semiconductor layer in a bottom layer and a single crystal semiconductor layer in a top layer that are stacked with a gate insulating layer, an inorganic insulating layer, an inorganic insulating film, and the like interposed therebetween are electrically connected through a wiring layer that penetrates the gate insulating layer, the inorganic insulating layer and the inorganic insulating film. In the case where the single crystal semiconductor layer in the bottom layer and the single crystal semiconductor layer in the top layer are stacked so as to overlap with each other, the wiring layer may be formed in contact with the single crystal semiconductor layer in the bottom layer by penetrating the single crystal semiconductor layer in the top layer. By tightly stacking the single crystal semiconductor layers so as to overlap with each other, a semiconductor device with higher integration can be achieved.

Figure 10A:
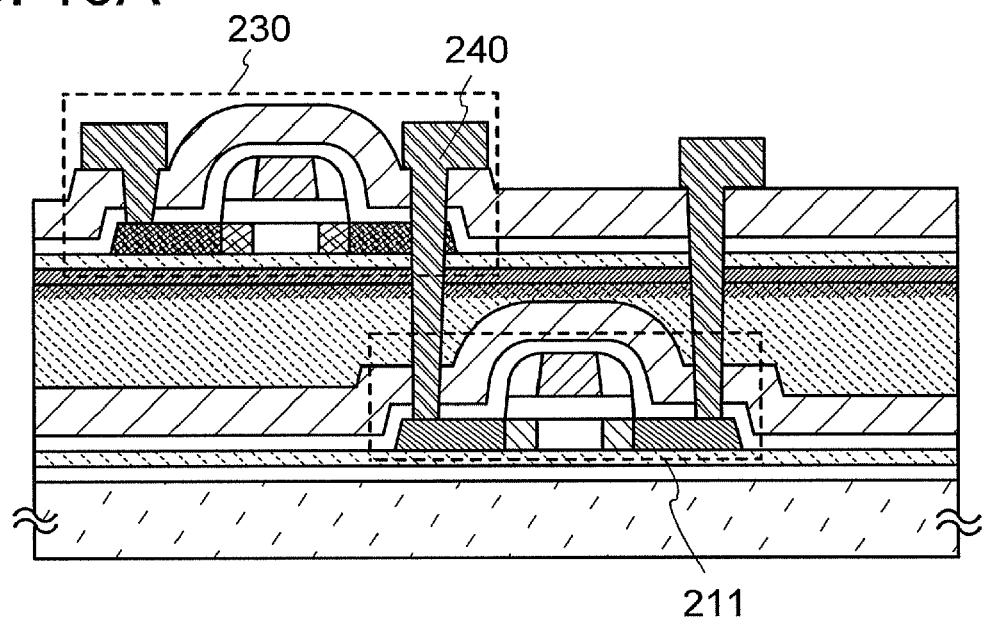
FIGS. 10A and 10B are views illustrating a manufacturing method of a semiconductor device, according to an aspect of this invention.
Figure 10B:
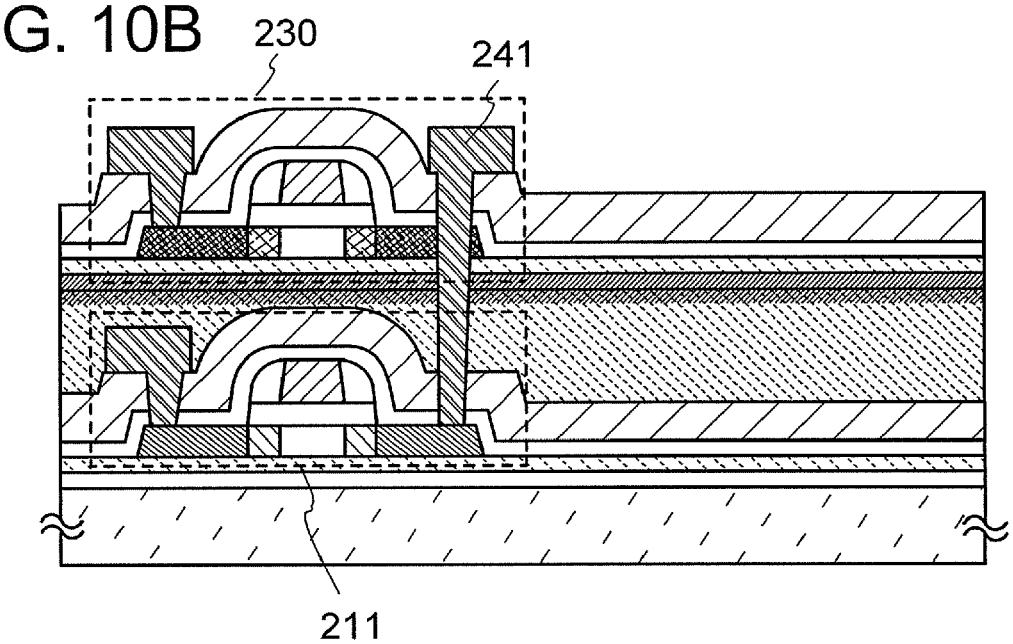
Figure 11A:
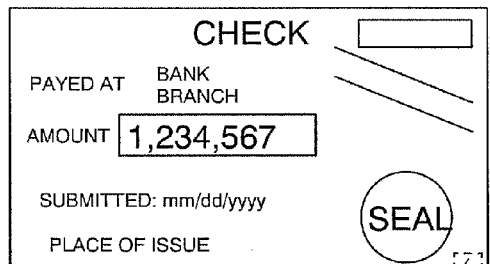
FIGS. 11A to 11G are diagrams each illustrating application of a semiconductor device, according to an aspect of this invention.
Figure 11B:
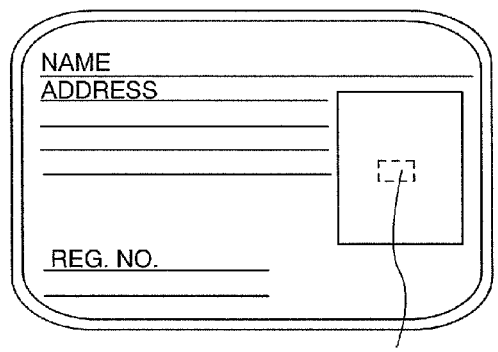
Figure 11C:
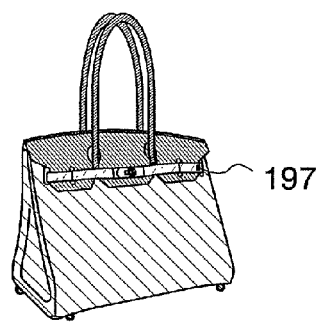
Figure 11D:
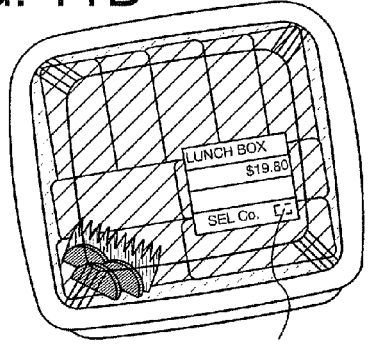
Figure 11E:
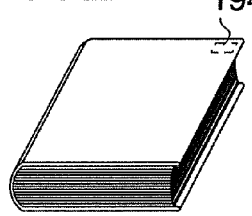
Figure 11F:
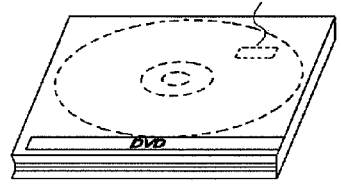
Figure 11G:
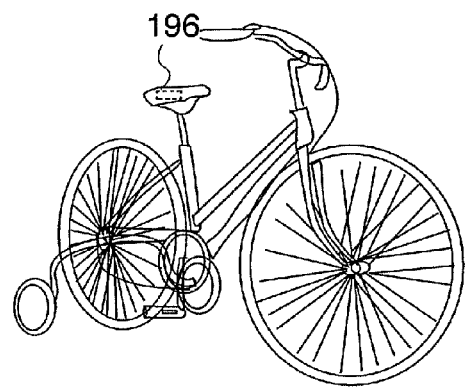

An example of a semiconductor device in which a single crystal semiconductor layer in a bottom layer and a single crystal semiconductor layer in a top layer are stacked so as to overlap with each other is shown in FIGS. 10A and 10B. In FIG. 10A, a source and drain region of a single crystal semiconductor layer in the transistor 211 which is a semiconductor element in the bottom layer and a source and drain region of a single crystal semiconductor layer in the transistor 230 which is a semiconductor element in the top layer are stacked so as to overlap with each other. The wiring layer 240 that electrically connects the transistor 211 to the transistor 230 is formed so as to penetrate the insulating films 224 and 223, the inorganic insulating film 234, the source and drain region of the single crystal semiconductor layer in the transistor 230, the inorganic insulating layer 216, and the insulating films 213 and 212, and reach the source and drain region of the single crystal semiconductor layer in the transistor 211.

Although FIG. 10A shows the example in which the single crystal semiconductor layer in the transistor 211 and the single crystal semiconductor layer in the transistor 230 are formed so as to partly overlap with each other, the single crystal semiconductor layers may be formed so as to almost entirely overlap with each other by using the same masks or the like as shown in FIG. 10B. The larger an area where the single crystal semiconductor layers overlap with each other becomes, the higher integration can become. In the semiconductor device shown in FIG. 10B, the transistor 211 and the transistor 230 are stacked so as to overlap with each other in almost the same position with an insulating layer interposed therebetween. The wiring layer 241 that electrically connects the transistor 211 to the transistor 230 is formed so as to penetrate the insulating films 224 and 223, the inorganic insulating film 234, the source and drain region of the single crystal semiconductor layer in the transistor 230, the inorganic insulating layer 216, and the insulating films 213 and 212, and reach the source and drain region of the single crystal semiconductor layer in the transistor 211.

Since a semiconductor device of this invention has a structure of high integration in which semiconductor elements are three-dimensionally stacked, the semiconductor elements may be adjacently arranged in contact with the same insulating layer, and may also be stacked in contact with different insulating layers with interlayer insulating layers formed above and below the semiconductor element. Accordingly, the degree of freedom in arrangement of semiconductor elements in the semiconductor device is high, and thus higher integration and performance can be achieved. As a semiconductor element, as well as a field effect transistor, a memory element using a single crystal semiconductor layer can be used. Therefore, a semiconductor device that satisfies various functions required for various purposes can be manufactured and provided.

The separation layers 201 and 221 are each formed by a sputtering method, a plasma CVD method, a coating method, a printing method, or the like, using a single layer or stacked layers formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) and silicon (Si); or an alloy material or a compound material containing any of the elements as its main component. The layer containing silicon may have any of an amorphous structure, a microcrystalline structure, and a polycrystalline structure. Note that a coating method includes a spin-coating method, a droplet discharge method, and a dispensing method in its category here.

In the case where the separation layers 201 and 221 each has a single-layer structure, each of them is preferably formed using a tungsten layer, a molybdenum layer, or a layer containing a mixture of tungsten and molybdenum. Alternatively, a layer containing tungsten oxide or tungsten oxynitride, a layer containing molybdenum oxide or molybdenum oxynitride, or a layer containing an oxide or oxynitride of a mixture of tungsten and molybdenum is formed. Note that the mixture of tungsten and molybdenum corresponds, for example, to an alloy of tungsten and molybdenum.

In the case where the separation layers 201 and 221 each has a layered structure, a tungsten layer, a molybdenum layer, or a layer containing a mixture of tungsten and molybdenum is formed as a first layer, and oxide, nitride, oxynitride, or nitride oxide of tungsten, molybdenum, or a mixture of tungsten and molybdenum, is formed as a second layer.

In the case where the separation layers 201 and 221 are each formed to have a layered structure of a layer containing tungsten and a layer containing tungsten oxide, the layer containing tungsten may be formed first and an insulating layer made of oxide may be formed thereon, so that a layer containing tungsten oxide is formed in the interface between the layer containing tungsten and the insulating layer. Moreover, the surface of the layer containing tungsten may be subjected to treatment such as thermal oxidation treatment, oxygen plasma treatment, or treatment using a solution having strong oxidizability such as ozone water, or the like thereby forming the layer containing tungsten oxide. In addition, plasma treatment or heat treatment may be performed in an oxygen atmosphere, a nitrogen atmosphere, a nitrous oxide atmosphere, an atmosphere of nitrous oxide alone, or an atmosphere of mixture of the above-described gas and another gas. The same applies to the case of forming a layer containing a nitride, oxynitride or nitride oxide of tungsten. After a layer containing tungsten is formed, a silicon nitride layer, a silicon oxynitride layer, or a silicon nitride oxide layer may be formed thereover.

According to the above step, the separation layers 201 and 221 are formed so as to be in contact with the substrates 200 and 220, respectively; however, this invention is not limited to this step. Insulating layers serving as bases may be formed so as to be in contact with the substrates 200 and 220, and the separation layers 201 and 221 may be provided so as to be in contact with the respective insulating layers.

The inorganic insulating films 202 and 222 are each formed using an inorganic compound with a single-layer structure or a layered structure by a sputtering method, a plasma CVD method, a coating method, a printing method, or the like. As a typical example of the inorganic compound, oxidized silicon or nitrided silicon is given. As a typical example of the oxidized silicon and nitrided silicon, silicon oxide, silicon oxynitride, silicon nitride, silicon nitride oxide, or the like is given.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Moreover, the inorganic insulating films 202 and 222 may each have a layered structure. For example, inorganic compounds may be stacked. Typically, the inorganic insulating layers 202 and 222 may be formed by stacking silicon oxide, silicon nitride oxide, and silicon oxynitride.

The gate insulating layer 207 may be formed of silicon oxide or a layered structure of silicon oxide and silicon nitride. The gate insulating layer 207 may be formed by depositing an insulating film by a plasma CVD method or a low pressure CVD method or is preferably formed by solid phase oxidation or solid phase nitridation by plasma treatment. This is because a gate insulating layer which is formed using a single crystal semiconductor layer that is oxidized or nitrided by plasma treatment is dense, has high withstand voltage, and is excellent in reliability. For example, the surface of the single crystal semiconductor layer is oxidized or nitrided by diluting nitrous oxide ($N_2O$) with Ar by one to three times (flow rate) and applying microwave electric power (2.45 GHz) of 3 to 5 kW under a pressure of 10 to 30 Pa. Through this treatment, an insulating film with a thickness of 1 to 10 nm (preferably 2 to 6 nm) is formed. Further, nitrous oxide ($N_2O$) and silane ($SiH_4$) are introduced, microwave electric power (2.45 GHz) of 3 to 5 kW is applied under a pressure of 10 to 30 Pa, and a silicon oxynitride film is formed by a vapor deposition method to form a gate insulating layer. The combination of the solid phase reaction and the reaction by the vapor deposition method can form a gate insulating layer with a low interface state density and an excellent withstand voltage.

As the gate insulating layer 207, a high dielectric constant material such as zirconium dioxide, hafnium oxide, titanium dioxide, or tantalum pentoxide may be used. When a high dielectric constant material is used for the gate insulating layer 205, gate leak current can be reduced.

The gate electrode layer 208 can be formed using a CVD method, a sputtering method, a droplet discharge method, and the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film.

A light-transmitting material having transmitting property to visible light can also be used for the gate electrode layer. As the light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

If etching processing is required to form the gate electrode layer, a mask may be formed and dry etching or wet etching may be performed. By using an ICP (inductively coupled plasma) etching method and controlling etching conditions (e.g., the amount of electric power applied to a coiled electrode, the amount of electric power applied to an electrode on a substrate side, or the electrode temperature on the substrate side) as appropriate, the electrode layer can be etched into a tapered shape. Note that as an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be used as appropriate.

The insulating layers 209a and 209b having a sidewall structure may be formed in a self-aligning manner by forming an insulating layer, which covers the gate electrode layer and the single crystal semiconductor layer, and processing the insulating layer by anisotropic etching of an RIE (reactive ion etching) method. Here, there are no particular limitations on the insulating layer, but the insulating layer is preferably formed using silicon oxide which is formed by reacting TEOS (tetraethyl orthosilicate), silane, or the like and oxygen, nitrous oxide, or the like and which has favorable step coverage. The insulating layer can be formed by a thermal CVD method, a plasma CVD method, a normal-pressure CVD method, a bias ECRCVD method, a sputtering method, or the like.

Although a single gate structure is described in this embodiment mode, a multi-gate structure such as a double-gate structure may also be employed. In this case, gate electrode layers may be provided above and below the single crystal semiconductor layer or a plurality of gate electrode layers may be provided on only one side (that is, above or below) of the single crystal semiconductor layer.

Alternatively, a structure in which a silicide is provided for a source and drain region of a transistor may be employed. A silicide is formed by forming a conductive film over the source and drain regions of the single crystal semiconductor layer and making silicon in the source and drain regions of the single crystal semiconductor layer which is the source and drain region exposed and the conductive film react by heat treatment, a GRTA method, an LRTA method, or the like. Alternatively, the silicide may be formed by laser irradiation or light irradiation using a lamp. As a material used for a conductive film for forming the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

The wiring layers 210a, 210b, and 235 can be formed by forming a conductive film by a PVD method, a CVD method, an evaporation method, or the like and then etching the conductive layer into a desired shape. In addition, source and drain electrode layers can be formed selectively in a predetermined position by a printing method, an electroplating method, or the like. In addition, a reflow method or a damascene method may be used. As a material of the source and drain electrode layers, a metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanium oxide, or the like can be used.

Silicon oxide, silicon nitride, silicon oxynitride, aluminum oxide, aluminum nitride, aluminum oxynitride, or another inorganic insulating material can be used for the insulating films 212, 213, 223, and 224, and the inorganic insulating layer 214.

There are no limitations on the order of stacking semiconductor elements (e.g., the order of stacking an n-channel transistor and a p-channel transistor in a CMOS structure) and conductivity types can be freely combined. Both transistors to be stacked may be n-channel transistors or p-channel transistors. Alternatively, a plurality of transistors may be provided in the same layer, and both an n-channel transistor and p-channel transistor, which have different conductivity types from each other, may be provided in the same layer.

Although a layered structure of two layers is shown in this embodiment mode, a layered structure of more layers may be employed. A plurality of semiconductor elements may be stacked by bonding an insulating layer formed over a substrate to a single crystal semiconductor layer.

Figure 17:
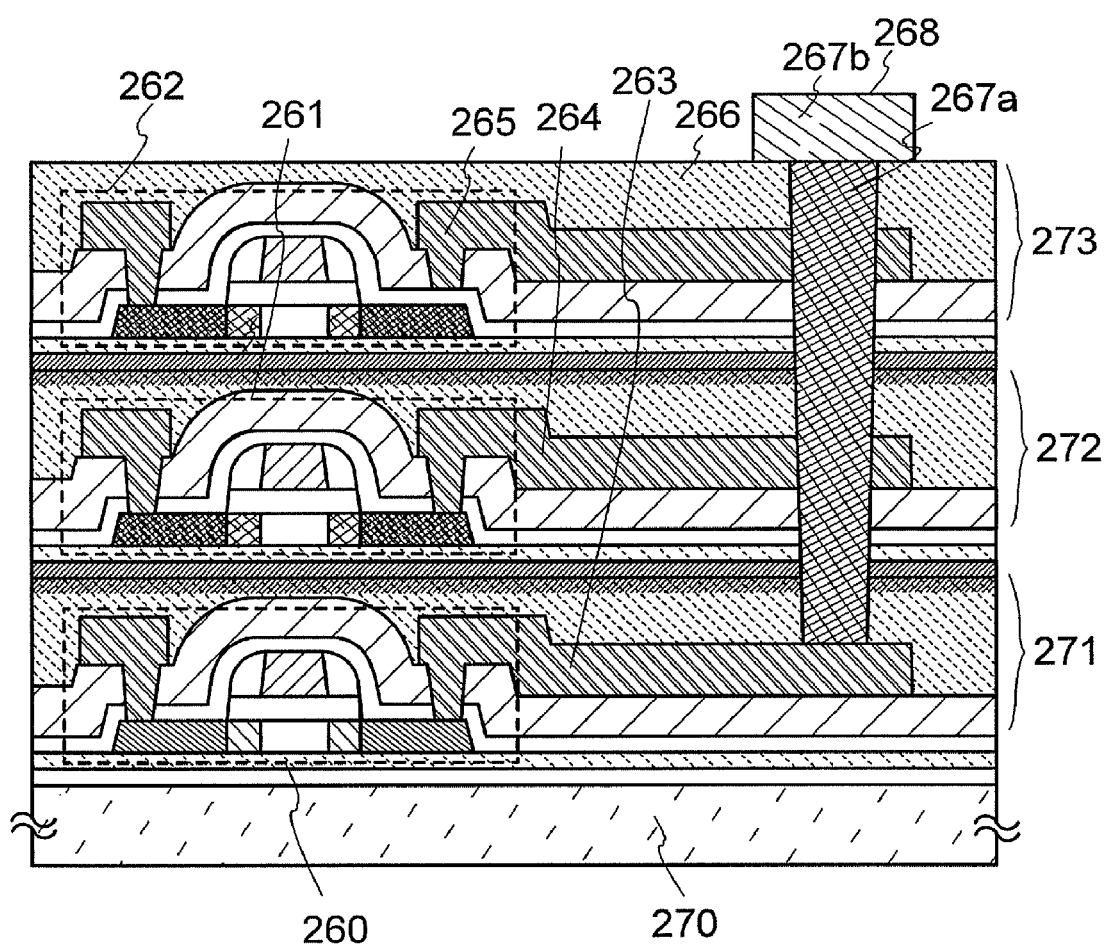
FIG. 17 is a view illustrating a manufacturing method of a semiconductor device, according to an aspect of this invention.

As an example of a multi-layer structure, an example of stacking three semiconductor element layers is shown in FIG. 17. A semiconductor device shown in FIG. 17 has a layered structure in which a semiconductor element layer 271 including a transistor 260, a semiconductor element layer 272 including a transistor 261, a semiconductor element layer 273 including a transistor 262 are stacked from a substrate 270 side. The semiconductor element layer 271, the semiconductor element layer 272, and the semiconductor element layer 273 are electrically connected through a wiring layer 268 that penetrates these three layers. The wiring layer 268 is formed so as to be in contact with a wiring layer 263 of the transistor 260, a wiring layer 264 of the transistor 261, and a wiring layer 265 of the transistor 262, and has a layered structure in which a wiring layer 267a which is an embedded wiring layer is formed so as to embed an opening which is a contact hole, and a wiring layer 267b which is a leading wiring layer is formed over the embedded wiring layer. The embedded wiring layer may include a barrier metal film or a seed film in the openings. Please note that reference numeral 266 denotes an inorganic insulating layer.

In the case where a contact hole for forming a wiring layer is formed in stacked layers including multiple layers, a side surface of the contact hole may have a plurality of taper angles in some cases. For example, in the case where an etching process include a plurality of steps which employ different etching gasses, taper angles and diameters of the opening may be varied depending on the etching conditions.

Accordingly, in this embodiment which employs this invention, a semiconductor device with a multi-layer structure can be manufactured through a low temperature process. In addition, since semiconductor element layers are bonded with a thin inorganic insulating layer and an inorganic insulating film, without using an organic material such as an adhesive, the semiconductor device can be reduced in thickness and size.

Since the inorganic insulating layer provided between the semiconductor element layers to be stacked is thin, a wiring layer which is formed by penetrating the inorganic insulating layer provided between single crystal semiconductor layers can be easily manufactured, whereby yield and productivity can be improved. Accordingly, electrical defects due to a defective shape in electrical connection between the semiconductor elements to be stacked are reduced and thus a semiconductor device with high reliability can be manufactured.

In addition, since the semiconductor element layers manufactured over the different substrates through different processes are stacked for integration, the semiconductor element layers each having excellent characteristics can be formed in an optimized condition (a material, a thickness, and an element structure) without being influenced by manufacturing conditions of the semiconductor element layers in different layers. Accordingly, a semiconductor device with a multilayer structure of a plurality of semiconductor elements can also have high performance.

Accordingly, a semiconductor device of this invention has a structure of high integration in which semiconductor elements are three-dimensionally stacked. Therefore, the degree of freedom in arrangement of semiconductor elements in the semiconductor device is high, and thus higher integration and performance can be achieved. As a semiconductor element, as well as a field effect transistor, a memory element using a single crystal semiconductor layer can be used. Therefore, a semiconductor device that satisfies various functions required for various purposes can be manufactured and provided.

Embodiment Mode 2

In this embodiment mode, a different example of steps for bonding a single crystal semiconductor layer from a single crystal semiconductor substrate to a formation substrate in Embodiment Mode 1 will be described with reference to FIGS. 19A to 19E. Therefore, repeated descriptions for the same components as or components having similar functions to the components in Embodiment Mode 1 are omitted.

Figure 19A:
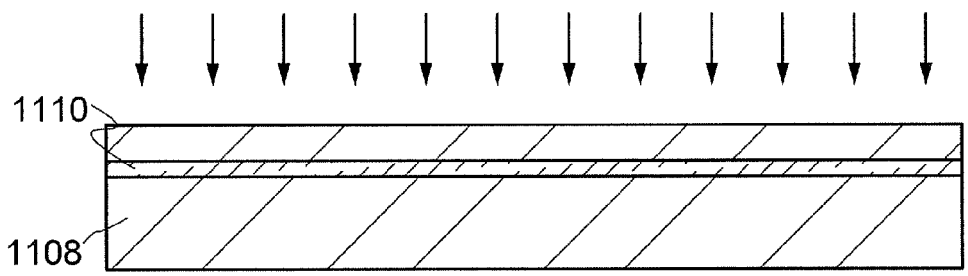
FIGS. 19A to 19E are views illustrating a manufacturing method of a semiconductor device, according to an aspect of this invention.

The single crystal semiconductor substrate 1108 shown in FIG. 19A is purified and ions accelerated by an electric field is added at a predetermined depth from its surface, thereby forming the weakened layer 1110.

Figure 19B:
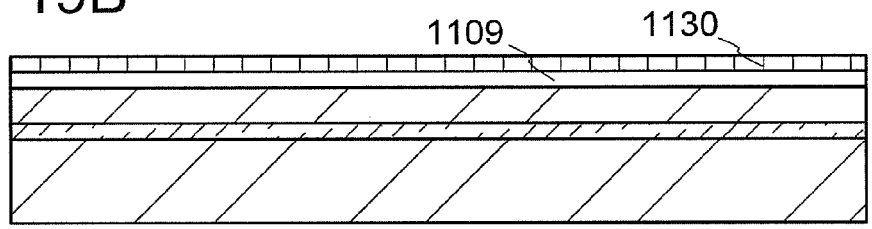

Next, the inorganic insulating film 1109 is formed over the single crystal semiconductor substrate 1108 in which the weakened layer 1110 is provided, and the separation layer 1130 is formed over the inorganic insulating film 1109 (see FIG. 19B). In this manner, the separation layer may be provided on the single crystal semiconductor side. In other words, the separation layer and the inorganic insulating film may be provided between the formation substrate and the single crystal semiconductor layer.

Figure 19C:
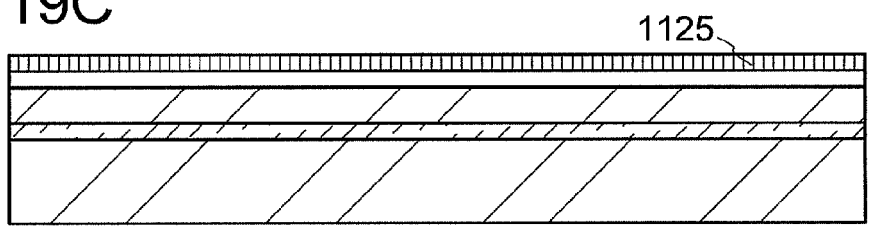

As in Embodiment Mode 1, flattening treatment is performed on the separation layer 1130, and the flattened separation layer 1125 is formed (see FIG. 19C).

Figure 19D:
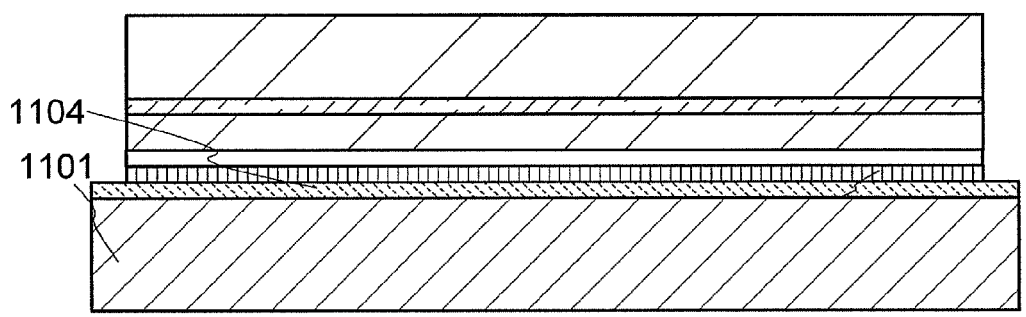

The formation substrate 1101 over which the insulating layer 1104 is formed and a surface on which the flattened separation layer 1125 of the single crystal semiconductor substrate 1108 are made in close contact with and bonded to each other (see FIG. 19D). The insulating layer 1104 over the formation substrate 1101 and the separation layer 1125 over the single crystal semiconductor substrate 1108 are bonded by being in close contact with each other.

The insulating layer 1104 may be formed on the formation substrate 1101 side, the separation layer 1125 side, or both sides. In addition, in the case where the formation substrate 1101 and the separation layer 1125 can be directly bonded, the insulating layer 1104 need not be formed.

Figure 19E:
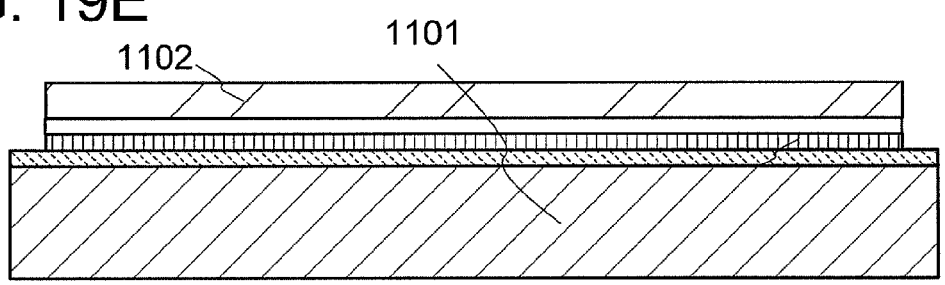

After that, as shown in FIG. 19E, the single crystal semiconductor substrate 1108 is separated, and the single crystal semiconductor layer 1102 is formed over the formation substrate 1101. In this manner, the semiconductor substrate with an SOI structure of this invention, which includes a single crystal semiconductor layer, with a separation layer interposed between the between the formation substrate 1101 and the single crystal semiconductor layer 1102 can be obtained.

In this embodiment mode, when a single crystal silicon substrate is used as the single crystal semiconductor substrate 1108, a single crystal silicon layer can be obtained as the single crystal semiconductor layer 1102. In addition, a manufacturing method of the semiconductor device of this embodiment mode can be a low temperature process. Accordingly, a transistor having high performance and high reliability, which is capable of operating at high speed and driving with low power consumption, and has a low subthreshold value and high electric field-effect mobility can be manufactured over a formation substrate.

This embodiment mode can be implemented in combination with Embodiment mode 1 as appropriate.

Embodiment Mode 3

In this embodiment mode, a different example of steps for bonding a single crystal semiconductor layer from a single crystal semiconductor substrate to a formation substrate in Embodiment Mode 1 will be described. Therefore, repeated descriptions for the same components as or components having similar functions to the components in Embodiment Mode 1 are omitted.

In this embodiment mode, when single crystal semiconductor layers are transferred from a single crystal semiconductor substrate, the single crystal semiconductor substrate is etched selectively (this step is also referred to as groove processing), and a plurality of single crystal semiconductor layers divided such that they have the size of semiconductor elements to be manufactured are transferred to a formation substrate. Thus, a plurality of island-shaped single crystal semiconductor layers can be formed over the formation substrate. Since the single crystal semiconductor layers which are processed into an element size in advance are transferred, transfer to the formation substrate can be performed in units of the single crystal semiconductor layers; thus, the size and shape of the single crystal semiconductor substrate are not restricted. Therefore, transfer of single crystal semiconductor layers to a large-sized formation substrate can be performed more efficiently.

Further, the single crystal semiconductor layers formed over the formation substrate may be etched for precise control by processing and modifying the shape of the single crystal semiconductor layers. Accordingly, discrepancy in formation position and defects in shape of the single crystal semiconductor layers due to pattern misalignment caused by light exposure going around a resist mask, or the like during resist mask formation; position misalignment caused by an attaching step during transfer; or the like can be modified.

Thus, a plurality of single crystal semiconductor layers having a desired shape can be formed over a formation substrate with a high yield. Accordingly, a semiconductor device, which includes a semiconductor element and an integrated circuit that have more precision and high performance, can be manufactured over a large-sized substrate with high throughput and high productivity.

Figure 25A:
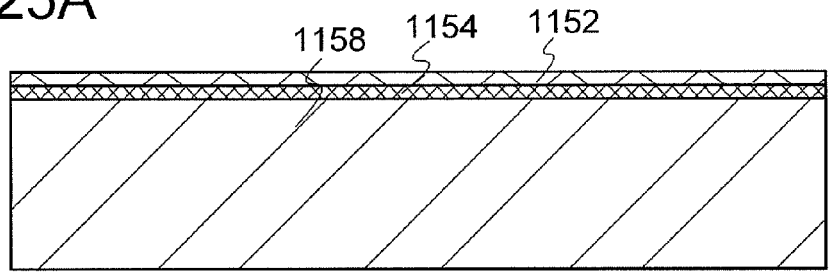
FIGS. 25A to 25E are views illustrating a manufacturing method of a semiconductor device, according to an aspect of this invention.

FIG. 25A shows a state in which a protective layer 1154 and a silicon nitride film 1152 are formed over a single crystal semiconductor substrate 1158. The silicon nitride film 1152 is used as a hard mask for groove processing for the single crystal semiconductor substrate 1158. The silicon nitride film 1152 may be formed by a vapor deposition method using silane and ammonia.

Figure 25B:
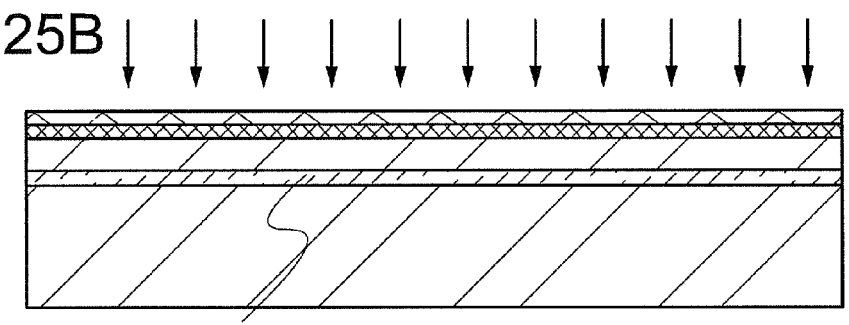

Next, ions are added to the single crystal semiconductor substrate 1158 to entirely form a weakened layer 1150 in the single crystal semiconductor substrate 1158 (see FIG. 25B). The ions are added in consideration of the thickness of a single crystal semiconductor layer to be transferred to a formation substrate. Accelerating voltage for adding ions to a deep part of the single crystal semiconductor substrate 1158 is set in consideration of such a thickness. By this treatment, the weakened layer 1150 is formed in a region at a certain depth from the surface of the single crystal semiconductor substrate 1158.

The groove processing is performed taking the shape of a single crystal semiconductor layer of a semiconductor element into consideration. That is, the groove processing is performed on the single crystal semiconductor substrate 1158 such that a single crystal semiconductor layer of a semiconductor element can be transferred to a formation substrate and a portion of the single crystal semiconductor layer remains as a convex portion.

Figure 25C:
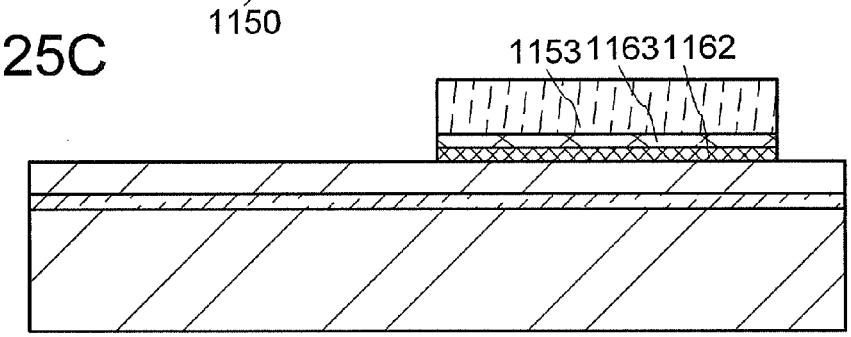

A mask 1153 is formed with a photo resist. The silicon nitride film 1152 and the protective layer 1154 are etched by using the mask 1153 to form a protective layer 1162 and a silicon nitride layer 1163 (see FIG. 25C).

Figure 25D:
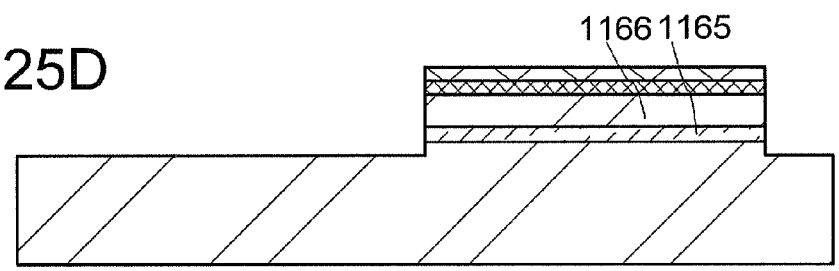

Next, the single crystal semiconductor substrate 1158 is etched by using the silicon nitride layer 1163 as a hard mask to form the single crystal semiconductor substrate 1158 including a weakened layer 1165 and a single crystal semiconductor layer 1166 (see FIG. 25D). In this invention, a semiconductor region which is part of the single crystal semiconductor substrate processed into a convex shape by the weakened layer and groove processing is referred to as the single crystal semiconductor layer 1166 as shown in FIG. 25D.

The depth of grooves in the single crystal semiconductor substrate 1158, which is to be etched, is set as appropriate in consideration of the thickness of the single crystal semiconductor layer to be transferred to the formation substrate. The thickness of the single crystal semiconductor layer can be determined according to a depth where hydrogen ions reach by addition. The depth of the grooves to be formed in the single crystal semiconductor substrate 1158 is preferably deeper than the weakened layer. In the groove processing, the grooves are processed to be deeper than the weakened layer, so that the weakened layer can remain only in a region of a single crystal semiconductor layer which should be separated.

Figure 25E:
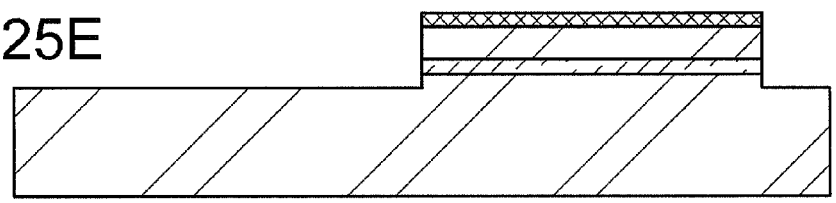
Figure 26A:
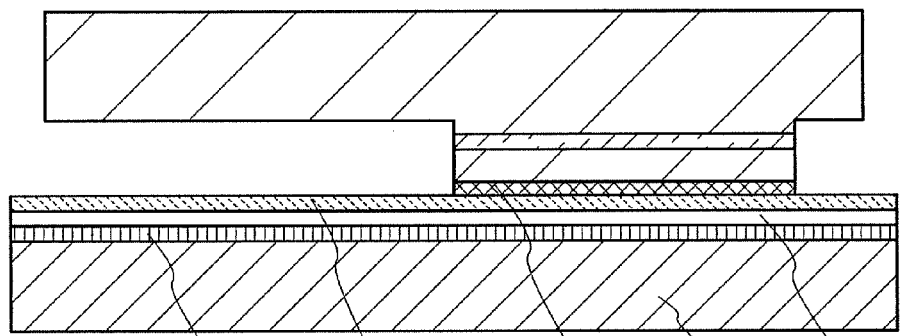
FIGS. 26A to 26D are views illustrating a manufacturing method of a semiconductor device, according to an aspect of this invention.

The silicon nitride layer 1163 on a surface is removed (see FIG. 25E). Then, the surface of the protective layer 1162 over the single crystal semiconductor layer 1158 and a formation substrate 1151 are bonded to each other (see FIG. 26A).

A separation layer 1170, an inorganic insulating film 1159, and an insulating layer 1157 are formed over the surface of the formation substrate 1151. The inorganic insulating film 1159 has a function of preventing impurities such as sodium ions contained in the formation substrate 1151 from diffusing into and contaminating the single crystal semiconductor layer. On the other hand, the insulating layer 1157 is provided to be bonded to the protective layer 1162.

The protective layer 1162 whose surface is purified on the single crystal semiconductor substrate 1158 side and the insulating layer 1157 on the formation substrate side are bonded by being in close contact with each other. Bonding can be performed at room temperature. This bonding is performed at the atomic level, and strong bond is obtained at room temperature by a Van der Waals force. Since groove processing is performed on the single crystal semiconductor substrate 1158, a convex portion that forms the single crystal semiconductor layer is in contact with the formation substrate 1151.

Figure 26B:
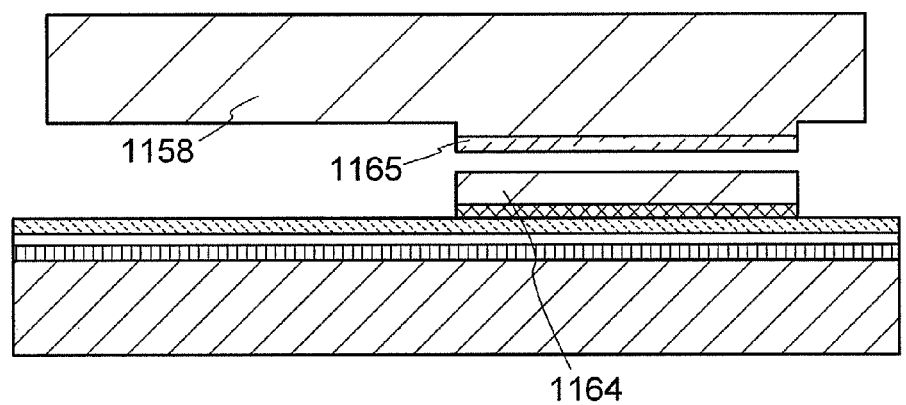

By performing heat treatment after the single crystal semiconductor substrate 1158 and the formation substrate 1151 are bonded to each other, the single crystal semiconductor layer 1164 can be separated from the single crystal semiconductor substrate 1158 and fixed over the formation substrate 1151 as shown in FIG. 26B. Separation of the single crystal semiconductor layer is caused in the following manner: the volume of microvoids formed in the weakened layer 1150 is changed, and a broken-out section is generated along the weakened layer 1150. After that, in order to create a firmer bond, it is preferable to perform heat treatment. In this manner, the single crystal semiconductor layer is formed over an insulating surface. FIG. 26B shows a state in which the single crystal semiconductor layer 1164 is bonded to the formation substrate 1151.

Since the single crystal semiconductor layers which are processed into an element size in advance are transferred, transfer to the formation substrate can be performed in units of the single crystal semiconductor layers; thus, the size and shape of the single crystal semiconductor substrate are not restricted. Thus, single crystal semiconductor layers having various shapes can be formed over a single crystal semiconductor substrate. For example, single crystal semiconductor layers can be freely formed with respect to every mask formed using a light-exposure apparatus (a stepper) at the time of etching, with respect to a light-exposure apparatus (a stepper) for forming the mask patterns, and with respect to panel or chip size of a semiconductor device which is cut from a large-sized substrate.

The single crystal semiconductor layer 1164 may be used as a single crystal semiconductor layer of a semiconductor element as it is, or may be further etched so that the shape thereof is processed.

Figure 26C:
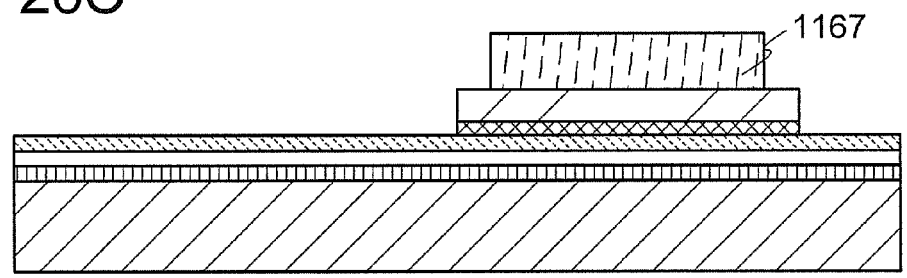
Figure 26D:
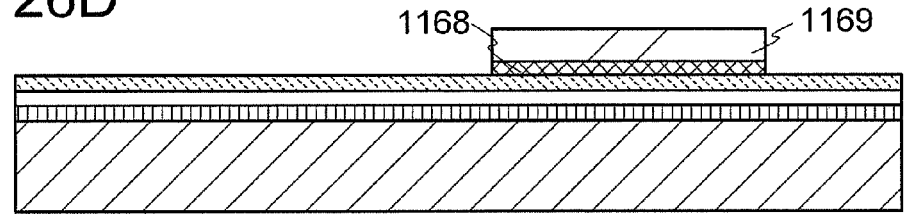

FIGS. 26C and 26D show an example in which the single crystal semiconductor layer 1164 transferred is further etched so that the shape thereof is processed. A mask 1167 is formed so as to expose a peripheral portion which is unnecessary portion of the single crystal semiconductor layer 1164.

By using the mask 1167, the single crystal semiconductor layer 1164 is etched to form a single crystal semiconductor layer 1169. In this embodiment mode, the protective layer 1162 under the single crystal semiconductor layer is also etched together with the single crystal semiconductor layer to be a protective layer 1168 (see FIG. 26D). In this manner, misalignment of a formation region, defects in shape, or the like which occurs in a manufacturing process can be modified by further processing shapes, after transfer to a formation substrate.

This embodiment mode can be implemented in combination with Embodiment modes 1 and 2 as appropriate.

Embodiment Mode 4

In this embodiment mode, a different example of steps for bonding a single crystal semiconductor layer from a single crystal semiconductor substrate to a formation substrate in Embodiment Mode 1 will be described. Therefore, repeated descriptions for the same components as or components having similar functions to the components in Embodiment Mode 1 are omitted.

In this embodiment mode, an example is shown in which a single crystal semiconductor layer is separated from a single crystal semiconductor substrate and is bonded to a formation substrate.

Figure 22A:
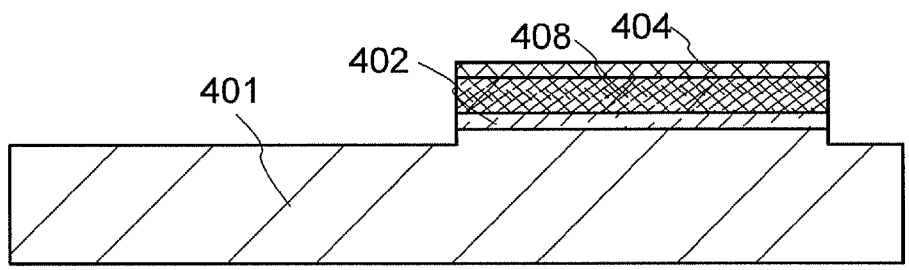
FIGS. 22A to 22D are views illustrating a manufacturing method of a semiconductor device, according to an aspect of this invention.

As shown in FIGS. 25A to 25E in Embodiment Mode 2, a weakened layer is formed in a single crystal semiconductor substrate and grooves are formed. Groove processing is performed in consideration of the shape of a single crystal semiconductor layer of a semiconductor element. That is, the groove processing is performed on a single crystal semiconductor substrate 401 such that a single crystal semiconductor layer of a semiconductor element can be transferred to a formation substrate and a portion of the single crystal semiconductor layer remain as a convex portion. In FIG. 22A, the single crystal semiconductor substrate 401, a weakened layer 402, a single crystal semiconductor layer 408 which is part of the single crystal semiconductor substrate, and an insulating film 404 are formed. In this embodiment mode, silicon oxide is used as the insulating film 404.

Next, heat treatment is performed, whereby adjacent microvoids in the weakened layer 402 are coupled and the volume of the microvoid is increased. As a result, the single crystal semiconductor substrate 401 cleaves along the weakened layer 402, and the single crystal semiconductor layer 408 is separated from the single crystal semiconductor substrate 401 together with the insulating film 404. Heat treatment may be performed at a temperature ranging from, for example, 400 to 600° C.

Note that heat treatment may be performed by using the dielectric heating generated by high-frequency waves such as microwaves. The heat treatment using the dielectric heating can be performed by irradiating the single crystal semiconductor substrate 401 with a high-frequency wave with a frequency of 300 MHz to 3 THz produced by a high-frequency generator. In specific, for example, by irradiating the single crystal semiconductor substrate 401 with a microwave with a frequency of 2.45 GHz of 900 W for 14 minutes, the adjacent microvoids in the weakened layer are coupled and ultimately the single crystal semiconductor substrate 401 can cleaves.

Figure 22B:
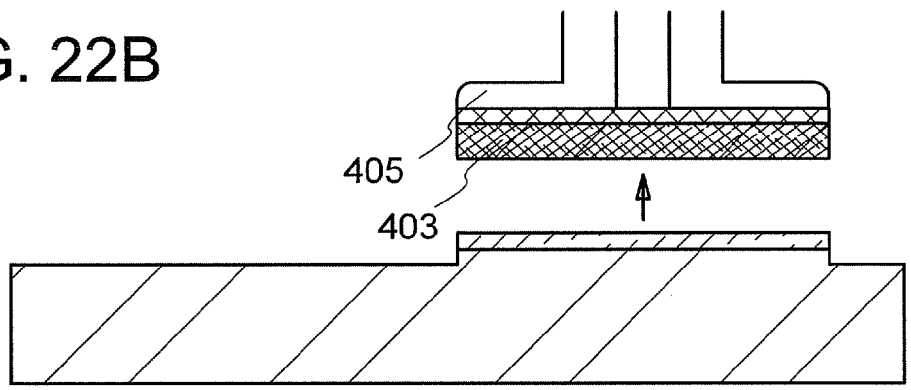

Then, as shown in FIG. 22B, a collet 405 is firmly put on to the insulating film 404 formed over the single crystal semiconductor layer 408, and the single crystal semiconductor layer 408 is separated from the single crystal semiconductor substrate 401. Even if the cleavage of the single crystal semiconductor substrate 401 caused by the heat treatment is not adequate, the single crystal semiconductor layer 408 can be separated completely from the single crystal semiconductor substrate 401 by application of force with the use of the collet 405, and a single crystal semiconductor layer 403 can be obtained. As the collet 405, a means that can be firmly put on part of the single crystal semiconductor layer 408 as selected, such as a chuck, e.g., a vacuum chuck or mechanical chuck, or a micro needle to the tip of which an adhesive is applied can be employed. FIG. 22B illustrates a case in which a vacuum chuck is used as the collet 405.

As an adhesive which is attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. The coagulation point of MW-1 is approximately at 17° C., and MW-1 has an adhering effect at a temperature less than or equal to the coagulation point (preferably at less than or equal to 10° C.) and does not have an adhering effect at a temperature greater than or equal to the coagulation point (preferably approximately 25° C.).

Note that before cleaving the single crystal semiconductor substrate 401, hydrogenation may be performed on the single crystal semiconductor substrate 401. The hydrogenation is performed, for example, at 350° C. in a hydrogen atmosphere for approximately two hours.

Figure 22C:
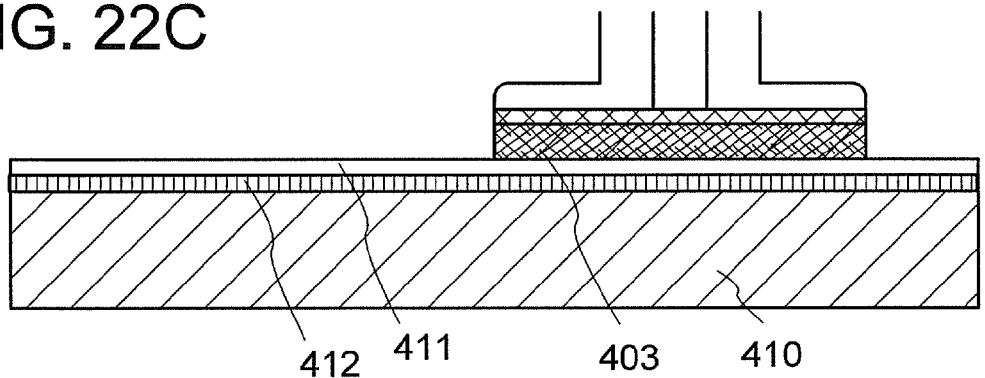

Next, as shown in FIG. 22C, the single crystal semiconductor layer 403 and a formation substrate 410 are attached to each other so as to make the surface of the single crystal semiconductor layer 403, which is exposed by the separation, face the formation substrate 410 side. In this embodiment mode, a separation layer 412 and an inorganic insulating film 411 are formed over the formation substrate 410, and by bonding between the inorganic insulating film 411 and the single crystal semiconductor layer 403, the single crystal semiconductor layer 403 and the formation substrate 410 can be attached to each other. After the single crystal semiconductor layer 403 and the inorganic insulating film 411 are bonded to each other, heat treatment at a temperature of 400 to 600° C. is preferably performed to further enhance the bonding.

The single crystal semiconductor layer 403 and the formation substrate 410 are bonded to each other by Van der Waals force, so that they are firmly bonded to each other even at room temperature. Note that since the above-described bonding can be performed at a low temperature, various substrates can be used for the formation substrate 410. As the formation substrate 410, for example, a substrate such as a quartz substrate or a sapphire substrate can be used as well as a glass substrate made of aluminosilicate glass, barium borosilicate glass, aluminoborosilicate glass, or the like. Furthermore, as the formation substrate 410, a single crystal semiconductor substrate formed of silicon, gallium arsenide, indium phosphide, or the like can be used. Alternatively, a metal substrate including a stainless-steel substrate can be used as the formation substrate 410.

Note that an insulating layer may be further provided between the inorganic insulating film 411 and the single crystal semiconductor layer 403.

Note that before or after the single crystal semiconductor layer 403 is attached to the formation substrate 410, thermal annealing may be performed on the surface of the single crystal semiconductor layer 403, which is exposed by the separation, by laser beam irradiation. By performing thermal annealing before the single crystal semiconductor layer 403 is attached to the formation substrate 410, the surface exposed by the separation is flattened and bonding strength can be further increased. In addition, by performing thermal annealing after the single crystal semiconductor layer 403 is attached to the formation substrate 410, part of the single crystal semiconductor layer 403 melts and bonding strength can be further increased.

In addition, the single crystal semiconductor layer 403 may be attached to the formation substrate 410 not only by bonding but also by application of oscillation with a high frequency of 10 MHz to 1 THz to the single crystal semiconductor layer 403 to generate friction heat between the single crystal semiconductor layer 403 and the formation substrate 410, so that part of the single crystal semiconductor layer 403 melts.

Note that when MW-1 is used as a low-temperature coagulant, at a temperature at which a low-temperature coagulant does not have an adhering effect (for example, approximately at 25° C.), the low-temperature coagulant which is attached to the tip of the microneedle is brought into contact with the insulating film 404. Next, a temperature is lowered to a temperature (e.g., approximately 5° C.) at which the low-temperature coagulant has an adhering effect and the low-temperature coagulant is solidified, whereby the microneedle is firmly put on the insulating film 404. Then, after attaching the single crystal semiconductor layer 403 which is separated from the single crystal semiconductor substrate 401 to the formation substrate 410, the temperature is raised up again to a temperature at which the low-temperature coagulant does not have an adhering effect (for example, approximately at 25° C.), whereby the microneedle can be separated from the single crystal semiconductor film 403.

Figure 22D:
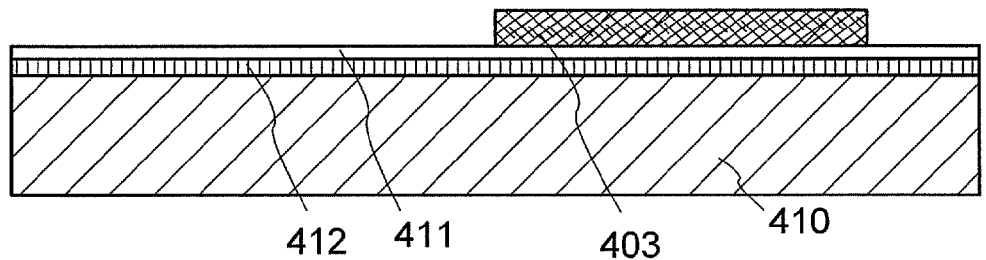

The insulating film 404 over the single crystal semiconductor layer 403 is removed and an island-shaped single crystal semiconductor layer 403 is formed over the formation substrate 410 and the inorganic insulating film 411 (see FIG. 22D). The single crystal semiconductor layer 403 may be further etched so that the shape thereof is processed.

As shown in FIGS. 22A to 22D, by making the surface of the single crystal semiconductor layer, which is exposed by the cleavage, face to the formation substrate side, the surface on a side with higher flatness becomes in contact with a gate insulating film. Therefore, interface state density between the single crystal semiconductor layer and the gate insulating film can be low and even. Accordingly, polishing for flattening the surface of the single crystal semiconductor layer which is in contact with the gate insulating film can be omitted or time for the polishing can be shortened, whereby cost can be suppressed and throughput can be increased.

Note that the single crystal semiconductor layer may be attached to the formation substrate so as to make the surface of the single crystal semiconductor layer, which is exposed by the cleavage, in contact with the gate insulating film. This example will be described with reference to FIGS. 23A to 23D and FIGS. 24A to 24C.

Figure 23A:
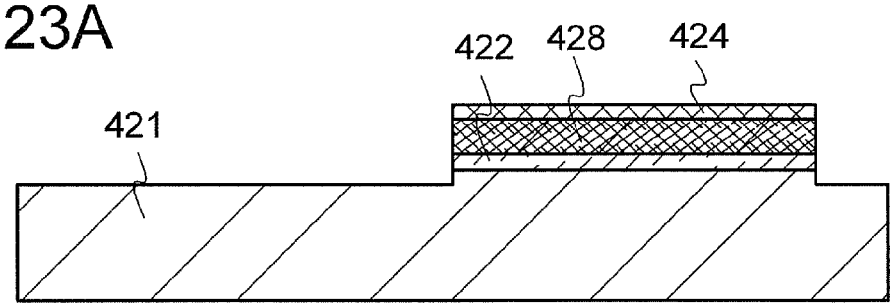
FIGS. 23A to 23D are views illustrating a manufacturing method of a semiconductor device, according to an aspect of this invention.

In FIG. 23A, as in FIG. 22A, a single crystal semiconductor substrate 421, a weakened layer 422, a single crystal semiconductor layer 428 which is part of the single crystal semiconductor substrate, and an insulating film 424 are formed. In this embodiment mode, silicon oxide is used as the insulating film 424.

Figure 23B:
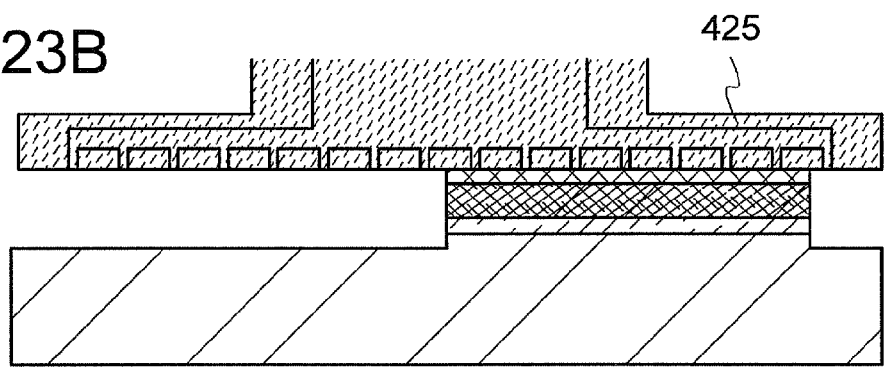

Next, as shown in FIG. 23B, the single crystal semiconductor substrate 421 is firmly put on a holding means 425. The single crystal semiconductor substrate 421 is firmly put on the holding means 425 so as to make the single crystal semiconductor layer 428 face to the holding means 425 side. As the holding means 425, a large vacuum chuck or mechanical chuck that can withstand heat treatment later and can be firmly put on a plurality of single crystal semiconductor layers (the single crystal semiconductor layer 428 in FIGS. 23A to 23D) so that the single crystal semiconductor substrate 421 can overlap with the plurality of single crystal semiconductor layers, such as a porous vacuum chuck or non-contact vacuum chuck can be used. In this embodiment mode, an example in which a vacuum chuck is used as the holding means 425 is shown.

Figure 23C:
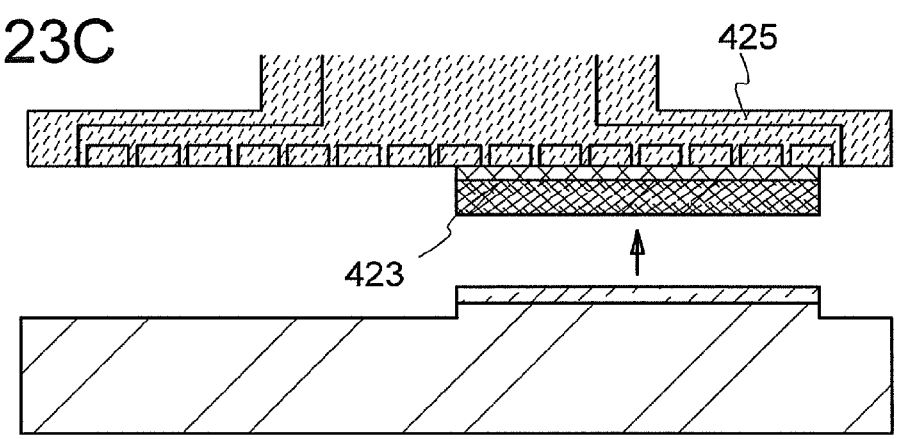

Next, heat treatment is performed, whereby the adjacent microvoids in the weakened layer 422 are coupled and the volume of the microvoid is increased. As a result, as shown in FIG. 23C, the single crystal semiconductor substrate 421 cleaves along the weakened layer 422 and the single crystal semiconductor layer 428 which is part of the single crystal semiconductor substrate 421 is separated as a single crystal semiconductor layer 423 together with the insulating film 424 from the single crystal semiconductor substrate 421. For example, heat treatment may be performed at a temperature ranging from 400 to 600° C.

Note that heat treatment may be performed by dielectric heating with the use of high frequency such as microwaves.

In addition, before the single crystal semiconductor substrate 421 cleaves, hydrogenation treatment may be performed thereon.

Figure 23D:
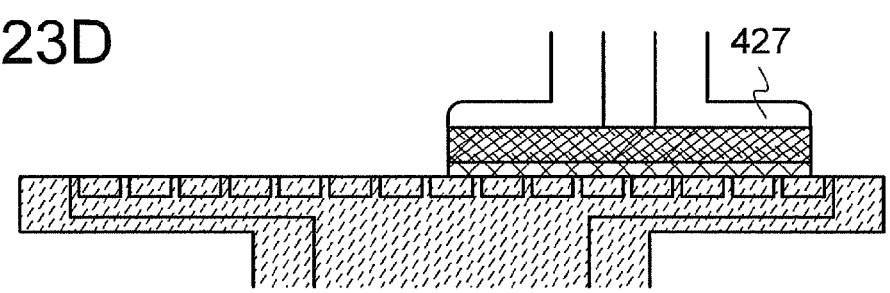
Figure 24A:
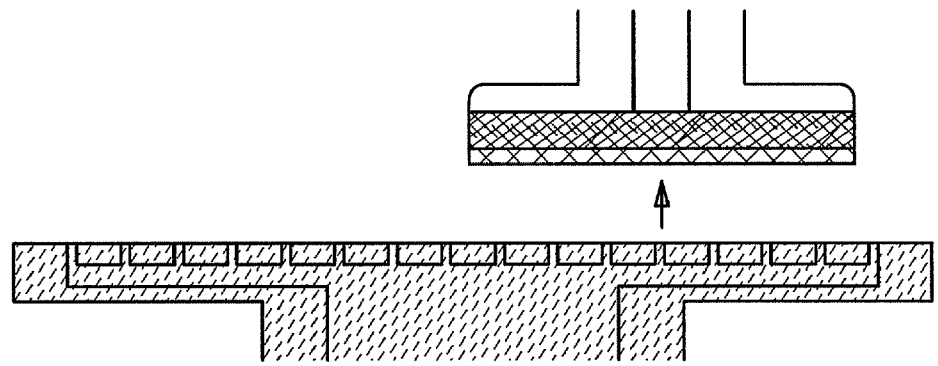
FIGS. 24A to 24C are views illustrating a manufacturing method of a semiconductor device, according to an aspect of this invention.

Then, as shown in FIG. 23D and FIG. 24A, a collet 427 is firmly put on the surface of the single crystal semiconductor layer 423, which is exposed by the cleavage, and the single crystal semiconductor layer 423 is separated from the holding means 425. As the collet 427, a means that can be firmly put on the single crystal semiconductor layer 423 as selected, such as a chuck, e.g., a vacuum chuck or mechanical chuck, or a micro needle to the tip of which an adhesive is applied can be employed. FIG. 23D and FIG. 24A illustrate a case in which a vacuum chuck is used as the collet 427.

Note that in this embodiment mode, although an example in which the collet 427 is firmly put on the surface of the single crystal semiconductor layer 423, which is exposed by the cleavage, is shown, a protective film such as an insulating film may be formed in order to prevent damage due to the collet 427. However, the protective film is removed after the single crystal semiconductor layer 423 is attached to the formation substrate 430 later.

As an adhesive which is attached to a microneedle, an epoxy-based adhesive, a ceramic-based adhesive, a silicone-based adhesive, a low-temperature coagulant, or the like can be used.

Figure 24B:
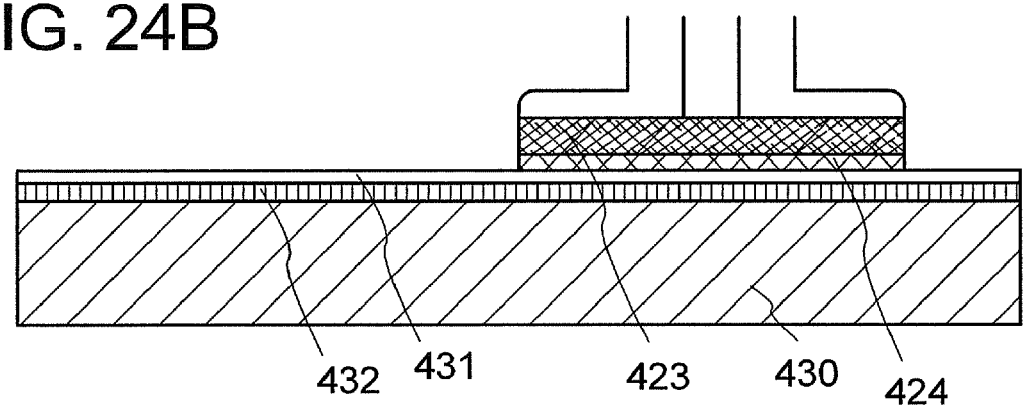
Figure 24C:
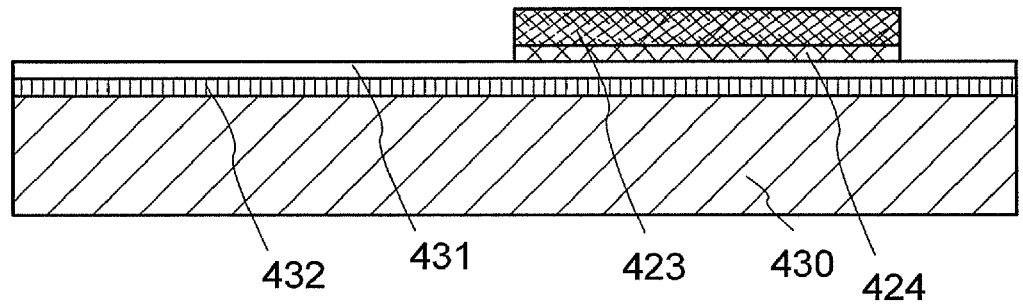

Next, as shown in FIG. 24B, the single crystal semiconductor layer 423 and the formation substrate 430 are attached to each other so as to make the insulating film 424 face the formation substrate 430 side, that is, so as to make a surface opposite to the surface of the single crystal semiconductor layer 423, which is exposed by the separation, face the formation substrate 430 side. In this embodiment mode, a separation layer 432 and an inorganic insulating film 431 are formed over the formation substrate 430, and by bonding between the insulating film 424 and the inorganic insulating film 431, the single crystal semiconductor layer 423 and the formation substrate 430 can be attached to each other (see FIG. 24C). After the insulating film 424 and the inorganic insulating film 431 are bonded to each other, heat treatment at a temperature of 400 to 600° C. is preferably performed to further enhance the bonding.

The insulating film 424 and the inorganic insulating film 431 are bonded to each other by Van der Waals force, so that they are firmly bonded to each other even at room temperature. Note that since the above-described bonding can be performed at a low temperature, various substrates can be used for the formation substrate 430.

Note that there are the case where the single crystal semiconductor substrate is warped or deformed and the case where an end portion of the single crystal semiconductor substrate is slightly rounded. Moreover, at the time of adding hydrogen, a rare gas, hydrogen ions, or rare gas ions for separating the single crystal semiconductor layer from the single crystal semiconductor substrate, the gas or ions cannot be added sufficiently to an end portion of the single crystal semiconductor substrate. Therefore, it is difficult to separate a semiconductor film at the end portion of the single crystal semiconductor substrate. When the semiconductor film is formed by cleaving the single crystal semiconductor substrate after bonding the single crystal semiconductor substrate to the formation substrate, the distance between single crystal semiconductor layers is several millimeters to several centimeters. However, in this embodiment mode, before the single crystal semiconductor substrate is attached to the formation substrate, the single crystal semiconductor substrate is cleaved to form the single crystal semiconductor layer. Thus, when the single crystal semiconductor layer is attached to the formation substrate, the distance between the single crystal semiconductor layers can be suppressed as small as about several tens of micrometers, and it is easy to form a semiconductor device without the influence of the space between the semiconductor layers.

In a method for manufacturing a semiconductor device of this embodiment mode, since a plurality of single crystal semiconductor layers can be attached to one formation substrate using a plurality of single crystal semiconductor substrates, processing can be performed with high throughput. In addition, a plane orientation of the semiconductor film can be selected as appropriate in accordance with the polarity of a semiconductor element; therefore, the mobility of the semiconductor element can be increased and a semiconductor device that can operate at higher speed can be provided.

In addition, a plurality of single crystal semiconductor layers can be formed by cleavage at plural portions of a single crystal semiconductor substrate and the plurality of single crystal semiconductor layers can be attached to a formation substrate. Therefore, positions to which the plurality of single crystal semiconductor layers are attached can be selected in accordance with polarity and layout of semiconductor elements in a semiconductor device.

This embodiment mode can be implemented in combination with Embodiment modes 1 and 2 as appropriate.

Embodiment Mode 5

In this embodiment mode, one example of a semiconductor device including a memory will be described according to a semiconductor device aimed at higher integration, further reduction in thickness and size, and a manufacturing method thereof with reference to drawings.

A semiconductor device of this embodiment mode includes a memory cell array and a driver circuit portion that drives the memory cell array in a memory. A memory element and a controlling thin film transistor provided for the memory cell array have high driving voltage and are required to have high resistance to voltage. On the other hand, a thin film transistor provided for the driver circuit portion is required to operate at high speed. Therefore, a semiconductor element layer of the memory cell array and a semiconductor element layer of the driver circuit portion are manufactured by using different substrates. By using this invention, the semiconductor element layer of the memory cell array and the semiconductor element layer of the driver circuit portion, which are formed by using different substrates are stacked so that a semiconductor device with a multi-layer structure is manufactured.

In this embodiment mode, the semiconductor device is manufactured by using the semiconductor element layer of the driver circuit portion as a bottom layer, and the semiconductor element layer of the memory cell array as a top layer. First, manufacturing steps of the semiconductor element layer of the driver circuit portion in the bottom layer will be described with reference to FIGS. 5A to 5E and FIGS. 6A to 6C.

A separation layer 101 is formed over a substrate 100 which is a formation substrate having an insulating surface, and an inorganic insulating film 102 is formed over the separation layer 101. The inorganic insulating film 102 also functions as a base film.

Next, a single crystal semiconductor layers 103 and 104, which are separated from a single crystal semiconductor substrate and bonded to the substrate 100 as in Embodiment Mode 1, are formed over the inorganic insulating film 102 with an insulating layer 180 interposed therebetween. A structure without the insulating layer 180, in which the inorganic insulating film 102 and the single crystal semiconductor layers 103 and 104 are directly bonded to each other can be employed.

To the single crystal semiconductor layers 103 and 104, in order to control a threshold voltage, a p-type impurity such as boron, aluminum, or gallium or an n-type impurity such as phosphorus or arsenic is preferably added to correspond so as to a formation region of an n-channel field-effect transistor or a p-channel field-effect transistor.

The thickness of each of the single crystal semiconductor layer 103 and the single crystal semiconductor layer 104 provided for the driver circuit portion may be thinner than the single crystal semiconductor layer provided for the memory cell array, preferably 5 nm or more and 30 nm or less, more preferably 10 nm or more and 20 nm or less.

By forming the single crystal semiconductor layer to be thin, the short channel effect can be suppressed. In addition, the threshold voltage of the transistor can be reduced, and the transistor can be driven at a low voltage. For end portions of the single crystal semiconductor layers, inclination angles (taper angles) may be provided.

Etching may be carried out by either plasma etching (dry etching) or wet etching. For treating a large-sized substrate, plasma etching is suitable. As an etching gas, a fluorinated gas or a chlorinated gas such as $CF_4$, $NF_3$, $Cl_2$, and $BCl_3$ is employed, and an inert gas such as He and Ar may be added thereto as appropriate. When an etching process using an atmospheric discharge is employed, local discharge process is also possible, and it is not necessary to form a mask over the entire surface of the substrate.

Figure 5A:
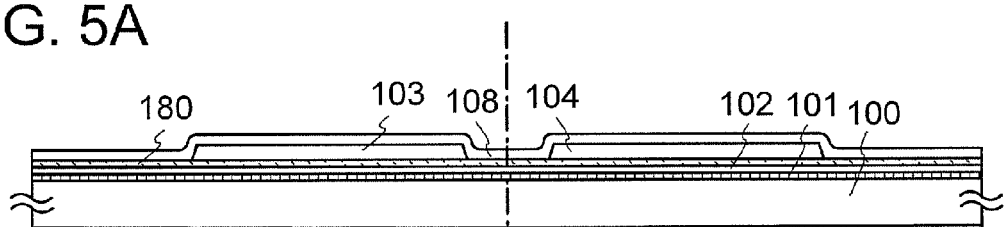
FIGS. 5A to 5E are views illustrating a manufacturing method of a semiconductor device, according to an aspect of this invention.
Figure 5B:
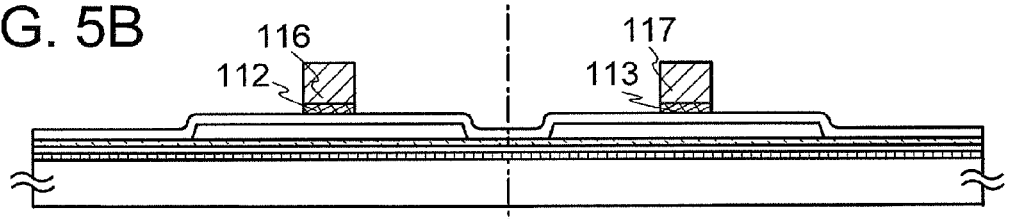
Figure 5C:
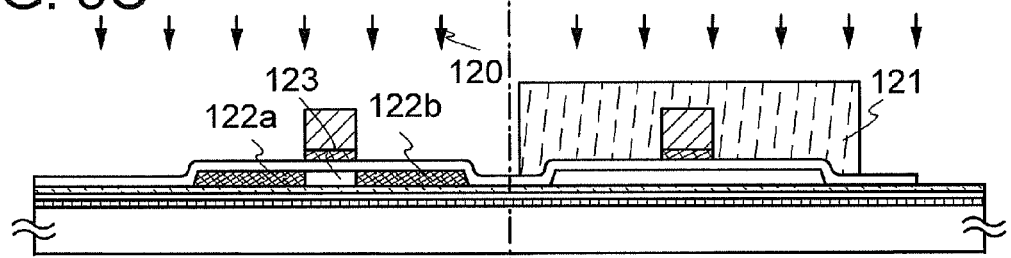
Figure 5D:
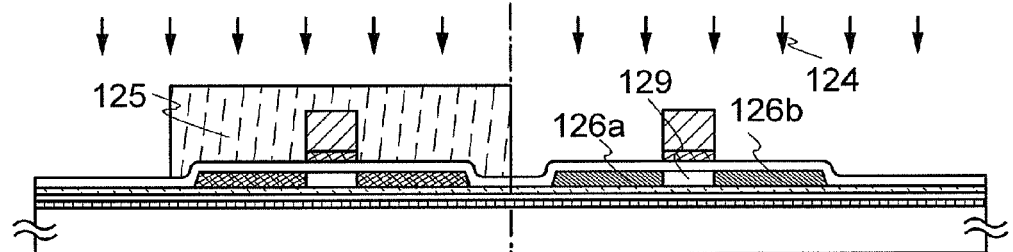

An oxide film over the single crystal semiconductor layer is removed, and a gate insulating layer 108 that covers the single crystal semiconductor layers 103 and 104 is formed (see FIG. 5A). The gate insulating layer 108 can be formed by a plasma CVD method or a sputtering method. The thickness of the gate insulating layer 108 included in the thin film transistor, which is provided in the driver circuit portion, is preferably 1 nm or more and 10 nm or less, and more preferably about 5 nm. Thinning of the gate insulating layer 108 has an effect of driving the transistor in the driver circuit portion at high speed and low voltage.

The gate insulating layer 108 may be formed using silicon oxide, or with a layered structure of silicon oxide and silicon nitride. The gate insulating layer 108 may be formed by stacking an insulating film by a plasma CVD method or a low-pressure CVD method, or may be formed by solid-phase oxidation or solid-phase nitridation using plasma treatment. This is because a gate insulating layer which is formed using a single crystal semiconductor layer that is oxidized or nitrided by plasma treatment is dense and has high withstand voltage and is excellent in reliability.

As the gate insulating layer 108, a high dielectric constant material may be used. When a high dielectric constant material is used for the gate insulating layer 108, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. In addition, in order to form a dense insulating film having less gate leakage current at a low temperature, a rare gas element such as argon may be contained in a reaction gas so that the rare gas element may be mixed in the insulating film to be formed.

Then, a first conductive film having a thickness of 20 to 100 nm and a second conductive film having a thickness of 100 to 400 nm, each of which serves as a gate electrode layer, are stacked over the gate insulating layer 108. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), chromium (Cr), and neodymium (Nd), or an alloy or compound material containing the above material as a main component. Alternatively, the first conductive film and the second conductive film may be made of a semiconductor film typified by a polycrystalline silicon film doped with an impurity element such as phosphorus, or an AgPdCu alloy film. The conductive film is not limited to a two-layer structure, and it is also possible to adopt, for example, a three-layer structure of a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film, which are stacked in this order. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Alternatively, a single layer structure may be adopted as well. In this embodiment mode, tantalum nitride is formed to have a thickness of 30 nm as the first conductive film, and tungsten (W) is formed to have a thickness of 370 nm as the second conductive film.

The thin film transistor of this embodiment mode, which is provided in the driver circuit portion, preferably has a channel length shorter than the thin film transistor, which is provided in the memory cell array. The channel length of the thin film transistor, which is provided in the driver circuit portion, of this embodiment mode is preferably 0.1 to 1 μm.

Next, first gate electrode layers 112 and 113, and second gate electrode layers 116 and 117 are formed by etching the first conductive film and the second conductive film, respectively. Then, a mask 121 that covers the single crystal semiconductor layer 104 is formed. An impurity element 120 imparting p-type conductivity is added using the mask 121, a first gate electrode layer 112, and a second gate electrode layer 116 as masks to form a p-type impurity region 122a and a p-type impurity region 122b. In this embodiment mode, boron (B) is used as the impurity element. Here, an impurity element is added so that the p-type impurity region 122a and the p-type impurity region 122b contain the impurity element imparting p-type conductivity at a concentration of about $1 \times 10^{20}$ to $5 \times 10^{21}$ atoms/cm$^3$. In addition, a channel formation region 123 is formed in the single crystal semiconductor layer 103 (see FIG. 5C).

The p-type impurity region 122a and the p-type impurity region 122b are high-concentration p-type impurity regions and serve as a source and drain region.

Next, a mask 125 that covers the single crystal semiconductor layer 103 is formed. An impurity element 124 imparting n-type conductivity is added using the mask 125, a first gate electrode layer 113, and a second gate electrode layer 117 as masks to form an n-type impurity region 126a and an n-type impurity region 126b. In this embodiment mode, phosphorus (P) is used as the impurity element. Here, an impurity element is added so that the n-type impurity region 126a and the n-type impurity region 126b contain the impurity element imparting n-type conductivity at a concentration of about $5 \times 10^{19}$ to $5 \times 10^{20}$ atoms/cm$^3$. In addition, a channel formation region 129 is formed in the single crystal semiconductor layer 104 (see FIG. 5D).

The n-type impurity region 126a and the n-type impurity region 126b are high-concentration n-type impurity regions and serve as a source and drain region.

The mask 125 is removed by $O_2$ ashing or using a resist removing solution, and the oxide film is also removed. After that, an insulating film, namely a sidewall may be formed so as to cover side surfaces of each gate electrode layer. The sidewall can be formed by plasma CVD or a low pressure CVD (LPCVD) using an insulating film containing silicon.

Heat treatment, irradiation with intense light, or irradiation with a laser beam may be performed to activate the impurity element. In that case, the impurity element can be activated, while at the same time plasma damage to the gate insulating layer and plasma damage to the interface between the gate insulating layer and the single crystal semiconductor layers can be recovered.

Subsequently, an interlayer insulating layer is formed to cover the gate electrode layers and the gate insulating layer. In this embodiment mode, a layered structure of insulating films 167 and 168 is employed. The insulating films 167 and 168 each may be a silicon nitride film, a silicon nitride oxide film, a silicon oxynitride film, or a silicon oxide film formed by a sputtering method or a plasma CVD method. Further, another insulating film containing silicon may also be employed to have a single-layer structure or a layered structure including three or more layers.

In addition, heat treatment is performed in a nitrogen atmosphere at 300 to 550° C. for 1 to 12 hours to hydrogenate the single crystal semiconductor layer. Preferably, the heat treatment is performed at a temperature of 400 to 500° C. This step is carried out for terminating dangling bonds in the single crystal semiconductor layer by hydrogen contained in the insulating film 167 which is an interlayer insulating layer. In this embodiment mode, heat treatment is performed at 410° C. for one hour.

In addition, the insulating films 167 and 168 can also be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), and other substance containing an inorganic insulating material. A siloxane resin may also be used. The siloxane resin corresponds to a resin including a Si—O—Si bond.

Next, contact holes (opening portions) that reach the single crystal semiconductor layers are formed in the insulating films 167 and 168 and the gate insulating layer 108, using a resist mask. Etching may be performed once or more depending on the selectivity of materials. The insulating films 168 and 167, and the gate insulating layer 108 are removed by etching, so that the opening portions that reach the p-type impurity regions 122a and 122b which are source and drain regions and the n-type impurity regions 126a and 126b which are source and drain regions are formed. For the etching, wet etching, dry etching, or the both may be employed. A hydrofluoric acid-based solution such as a mixed solution of ammonium hydrogen fluoride and ammonium fluoride may be used as an etchant of wet etching. As the etching gas, chlorine-based gas typified by $Cl_2$, $BCl_3$, $SiCl_4$, or $CCl_4$; fluorine-based gas typified by $CF_4$, $SF_6$, or $NF_3$; or $O_2$ can be used as appropriate. An inert gas may be added to the etching gas. As the inert element to be added, one or more kinds of elements selected from He, Ne, Ar, Kr, and Xe may be used.

A conductive film is formed so as to cover the opening portions, and the conductive film is etched to form wiring layers 169a, 169b, 170a, and 170b, which are source and drain electrode layers electrically connected to portions of respective source and drain regions. In addition, a wiring layer 154 is formed in the same steps as those for the wiring layers 169a, 169b, 170a, and 170b. The wiring layer 154 functions as a wiring for electrically connecting a semiconductor element layer 151 in a top layer to a semiconductor element layer 150 in a bottom layer in a later step. The wiring layer can be formed by forming the conductive film by a PVD method, a CVD method, an evaporation method, or the like, and then, etching the conductive film into a desired shape. In addition, a conductive layer can be selectively formed in a predetermined position by a droplet discharge method, a printing method, an electrolytic plating method, or the like. In addition, a reflow method or a damascene method may be used. Each of the source and drain electrode layers is formed of a metal such as Ag, Au, Cu, Ni, Pt, Pd, Ir, Rh, W, Al, Ta, Mo, Cd, Zn, Fe, Ti, Zr, Ba, or the like; Si or Ge; or an alloy or a nitride thereof. A layered structure of these elements may be used as well. In this embodiment mode, a layered structure is formed by stacking titanium (Ti) with a thickness of 60 nm, a titanium nitride film with a thickness of 40 nm, aluminum with a thickness of 700 nm, and titanium (Ti) with a thickness of 200 nm, and then processed into a desired shape.

Figure 5E:
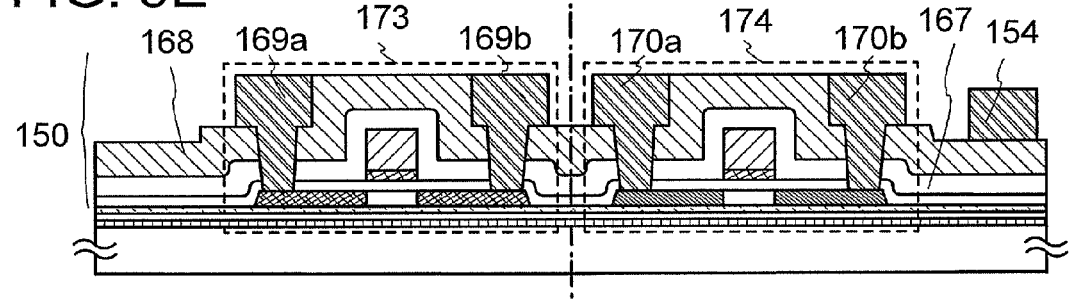

Through the above-described steps, a semiconductor element layer 150 including a thin film transistor 173 which is a p-channel thin film transistor having a p-type impurity region and a thin film transistor 174 which is an n-channel thin film transistor having an n-type impurity region, can be formed as the driver circuit portion (see FIG. 5E).

Figure 6A:
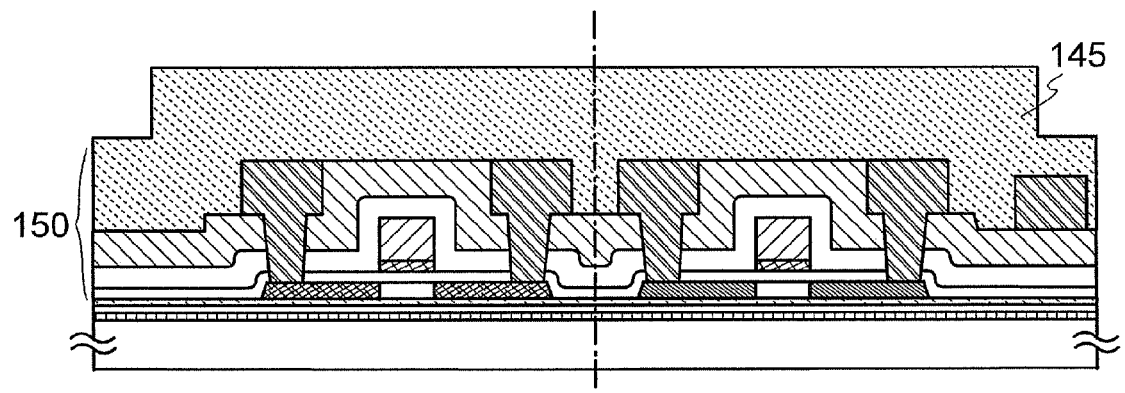
FIGS. 6A to 6C are views illustrating a manufacturing method of a semiconductor device, according to an aspect of this invention.
Figure 6B:
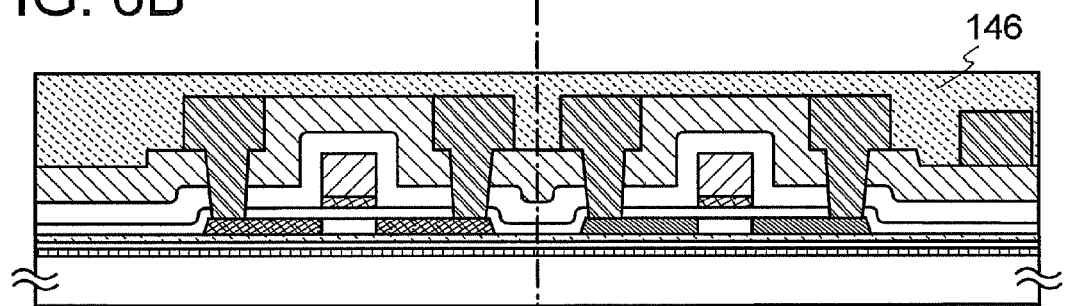

In order to flatten unevenness caused by the thin film transistors 173 and 174 and the like in the semiconductor element layer 150, an inorganic insulating layer 145 is formed (see FIG. 6A). Flattening treatment is performed on the inorganic insulating layer 145, and a flattened inorganic insulating layer 146 is formed (see FIG. 6B). In this embodiment mode, polishing treatment by a CMP method is performed as flattening treatment.

Figure 6C:
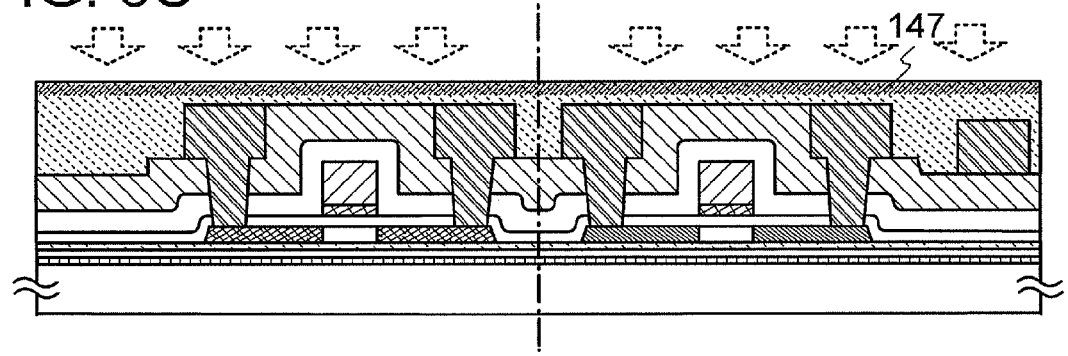

Since the flattened inorganic insulating layer 146 is to be a surface to be bonded to a semiconductor element layer manufactured by using another substrate, in this embodiment mode, plasma treatment is performed on the inorganic insulating layer 146 for activation to form an inorganic insulating layer 147 whose surface is subjected to modification treatment (see FIG. 6C). Through the above-described steps, steps up to the one before bonding the semiconductor element layer 150 which is to be in a bottom layer is completed.

Next, manufacturing steps of the semiconductor element layer of the memory cell array in the top layer will be described with reference to FIGS. 7A to 7E and FIGS. 8A to 8C. Note that since portions having the same functions as the semiconductor element layer of the driver circuit portion may be formed by the same material and steps as the driver circuit portion, description thereof will not be repeated.

A separation layer 158 is formed over a substrate 160 which is a formation substrate having an insulating surface, and an inorganic insulating film 159 is formed over the separation layer 158. The inorganic insulating film 159 also functions as a base film.

Next, a single crystal semiconductor layers 105 and 106, which are separated from a single crystal semiconductor substrate and bonded to the substrate 160 as in Embodiment Mode 1, are formed over the inorganic insulating film 159 with an insulating layer 181 interposed therebetween. A structure without the insulating layer 181, in which the inorganic insulating film 159 and the single crystal semiconductor layers 105 and 106 are directly bonded to each other can be employed.

To the single crystal semiconductor layers 105 and 106, in order to control a threshold voltage, a p-type impurity such as boron, aluminum, or gallium or an n-type impurity such as phosphorus or arsenic is preferably added so as to correspond to a formation region of an n-channel field-effect transistor or a p-channel field-effect transistor.

The thickness of each of the single crystal semiconductor layers 105 and 106 provided for the memory cell array may be thicker than that of the single crystal semiconductor layer provided for the driver circuit portion, preferably 25 nm or more and 100 nm or less, more preferably 50 nm or more and 60 nm or less.

Etching may be carried out by either plasma etching (dry etching) or wet etching.

An insulating film 107 is formed over the single crystal semiconductor layers 105 and 106. The insulating layer 107 may be formed using silicon oxide, or a layered structure of silicon oxide and silicon nitride. The insulating layer 107 may be formed by stacking insulating layers by a plasma CVD method or a low-pressure CVD method, or is preferably formed by solid-phase oxidation or solid-phase nitridation using plasma treatment. This is because an insulating layer which is formed using a single crystal semiconductor layer (typically a silicon layer) that is oxidized or nitrided by plasma treatment is dense and has high withstand voltage and thus is excellent in reliability. Since the insulating film 107 is used as a tunnel insulating layer for injecting charge to a charge accumulation layer 111, the insulating film 107 is preferably strong like the one shown above. The insulating film 107 is preferably formed to a thickness of 1 to 20 nm, more preferably 3 to 6 nm.

The preferable insulating film 107 is formed by plasma treatment in such a way that, for example, a silicon oxide layer is formed to a thickness of 3 to 6 nm over the single crystal semiconductor layer by plasma treatment in an oxygen atmosphere, and a nitrogen-plasma-treated layer is formed by treating the surface of the silicon oxide layer with nitrogen plasma in a nitrogen atmosphere. Specifically, the silicon oxide layer is formed to a thickness of 3 to 6 nm on the single crystal semiconductor layer by plasma treatment in an oxygen atmosphere. Subsequently, a nitrogen-plasma-treated layer with a high concentration of nitrogen is formed over the surface or the vicinity of the surface of the silicon oxide layer by performance of plasma treatment in a nitrogen atmosphere successively. Note that the vicinity of a surface refers to a depth of approximately 0.5 to 1.5 nm from the surface of a silicon oxide layer. For example, by conducting plasma treatment in a nitrogen atmosphere, a structure is obtained in which the silicon oxide layer contains 20 to 50 at. % nitrogen in a region from the surface to a depth of about 1 nm.

When a silicon layer is used as a typical example of the single crystal semiconductor layer, the surface of the silicon layer is oxidized by plasma treatment, so that a dense oxide layer without distortion at the interface can be formed. In addition, through nitridation by plasma treatment of the oxide layer, oxygen on a portion of a surface is substituted by nitrogen and a nitrogen layer is formed, whereby the layer can be made even denser. Consequently, an insulating layer with high withstand voltage can be formed.

In any event, through use of the aforementioned solid-phase oxidation or solid-phase nitridation, even if a glass substrate with a heat resistance temperature of less than or equal to 700° C. is used, an insulating layer equal to a thermal oxidation film that is formed at a temperature of from 950 to 1050° C. can be obtained. Thus, a tunnel insulating layer having high reliability can be formed as the tunnel insulating layer of a nonvolatile memory element.

The charge accumulation layer 111 is formed over the insulating layer 107. This charge accumulation layer 111 may be provided as either a single layer or stacked layers.

The charge accumulation layer 111 can be a floating gate formed of a layer or particles of a semiconductor material or a conductive material. As the semiconductor material, silicon, silicon germanium, or the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), and tungsten (W); an alloy containing the above element as its main component; an alloy film in which the above elements are combined (typically, an Mo—W alloy film or an Mo—Ta alloy film); or a silicon film provided with conductivity can be used. Under the conductive layer formed of such a material, a nitride such as tantalum nitride, tungsten nitride, titanium nitride, or molybdenum nitride; or a silicide such as tungsten silicide, titanium silicide, or molybdenum silicide may be formed. Furthermore, a layered structure of the above-described semiconductor materials, conductive materials, or the semiconductor material and the conductive material may be employed. For example, a layered structure of a silicon layer and a germanium layer may be used.

Alternatively, the charge accumulation layer 111 may be formed as an insulating material having a trap which holds charges. As a typical example of such materials, a silicon compound or a germanium compound can be given. As the silicon compound, silicon nitride, silicon oxynitride, silicon oxynitride to which hydrogen is added, or the like can be given. As examples of the germanium compound, germanium nitride, germanium nitride added with oxygen, germanium oxide added with nitrogen, germanium nitride to which oxygen and hydrogen are added, germanium oxide to which nitrogen and hydrogen are added, and the like can be given.

Next, a mask 161 that covers the single crystal semiconductor layer 106 is formed. An impurity element 163 imparting n-type conductivity is added using the mask 161, the first gate electrode layer 113, and the charge accumulation layer 111 as masks to form an n-type impurity region 162*a* and an n-type impurity region 162*b*. In this embodiment mode, phosphorus (P) is used as the impurity element. Here, an impurity element is added so that the n-type impurity region 162*a* and the n-type impurity region 162*b* contain the impurity element imparting n-type conductivity at a concentration of about $1 \times 10^{17}$ to $5 \times 10^{18}$ atoms/cm$^3$.

The mask 161 is removed and the insulating film 107 is processed by etching to form an insulating layer 110.

An oxide film over the single crystal semiconductor layer 106 is removed, and an insulating layer 109 that covers the single crystal semiconductor layers 105 and 106, the insulating layer 110, and the charge accumulation layer 111 is formed. When the gate insulating layer 109 is thick in the memory cell array, the thin film transistor and the memory element can have high resistance to high voltage; accordingly reliability can be heightened.

Note that although the gate insulating layer 109 formed over the single crystal semiconductor layer 105 functions as a control insulating layer of a memory element which is completed later, the insulating layer 109 formed over the single crystal semiconductor layer 105 functions as a gate insulating layer of the thin film transistor which is to be formed over the single crystal semiconductor layer 106. Therefore, the layer is called the gate insulating layer 109.

In a semiconductor device of this invention, the thickness of the gate insulating layer 109 included in the thin film transistors, which are provided in the memory cell array, is preferably 50 nm or more and 150 nm or less, and more preferably 60 nm or more and 80 nm or less.

Next, a gate electrode layer is formed over the gate insulating layer 109. In this embodiment mode, stacked layers of a first conductive film and a second conductive film are processed into a given shape, so that a first gate electrode layer 114, a second gate electrode layer 118, a first control gate electrode layer 115, and a second control gate electrode layer 119 are formed (see FIG. 7C).

In this embodiment mode, an example in which the first gate electrode layer and the second gate electrode layer (the first control gate electrode layer and the second control gate electrode layer) are formed to have perpendicular side surfaces is shown; however, this invention is not limited thereto. Both the first gate electrode layer and the second gate electrode layer (the first control gate electrode layer and the second control gate electrode layer) may have tapered shapes, or only one of the gate electrode layers (the first control gate electrode layer and the second control gate electrode layer) may have tapered shapes while the other gate electrode layer may have perpendicular side surfaces by anisotropic etching. The taper angles may be different or equal among the stacked gate electrode layers. With the tapered shape, coverage of a film stacked thereover is improved and defects are reduced, which improves reliability.

The gate insulating layers 108 and 109 may be etched to some extent and thinned (so-called film reduction) by the etching step in forming the gate electrode layers (and the control gate electrode layers).

The channel length of each of the thin film transistors, which are provided in the memory cell array, is preferably 1 to 5 µm (more preferably, 1 to 3 µm) in this embodiment mode.

Next, the impurity element 163 imparting n-type conductivity is added to the single crystal semiconductor layers 105 and 106 to form n-type impurity regions 164*a* and 164*b*, n-type impurity regions 127*a* and 127*b*, and n-type impurity regions 128*a* and 128*b* by using the first gate electrode layer 114*a*, the second gate electrode layer 118, the first control gate electrode layer 115, and the second control gate electrode layer 119 as masks. In this embodiment mode, phosphorus (P) is used as the impurity element. Here, the element imparting n-type conductivity is added so as to be contained at concentrations of approximately $5 \times 10^{19}$ to $5 \times 10^{20}$ atoms/cm$^3$ in the n-type impurity regions 127*a* and 127*b*, and the n-type impurity regions 128*a* and 128*b*. In addition, channel formation regions 130 and 131 are formed in the single crystal semiconductor layers 105 and 106, respectively (see FIG. 7D).

The n-type impurity region 127*a*, the n-type impurity region 127*b*, the n-type impurity region 128*a*, and the n-type impurity region 128*b* are high-concentration n-type impurity regions and serve as source and drain regions. On the other hand, the n-type impurity regions 164*a* and 164*b* are low-concentration impurity regions and LDD (lightly doped drain) regions.

Then, an interlayer insulating layer, which covers the gate electrode layers, the control gate electrode layers, and the gate insulating layers, is formed. In this embodiment mode, the interlayer insulating layer has a layered structure of insulating films 165 and 166. The insulating films 165 and 166 each may be a silicon nitride film, a silicon nitride oxide film, a silicon oxynitride film, or a silicon oxide film formed by a sputtering method or plasma CVD. Further, another insulating film containing silicon may also be employed to have a single-layer structure or a layered structure including three or more layers.

In addition, heat treatment is performed in a nitrogen atmosphere at 300 to 550° C. for 1 to 12 hours to hydrogenate the single crystal semiconductor layer.

Next, contact holes (opening portions) that reach the single crystal semiconductor layers are formed through the insulating film 166, the insulating film 167, the gate insulating layer 109, and the insulating film 110 using a resist mask. Etching is performed to remove the insulating film 166, the insulating film 167, the gate insulating layer 109, and the insulating film 110, so that the opening portions that reach the n-type impurity region 127*a*, the n-type impurity region 127*b*, the n-type impurity region 128a, and the n-type impurity region 128b, which are source and drain regions, are formed.

A conductive film is formed so as to cover the openings, and the conductive film is etched to form wiring layers 171a, 171b, 172a, and 172b, which are source electrode layers and drain electrode layers electrically connected to portions of respective source regions and drain regions.

Through the above-described steps, the semiconductor element layer 151 including a memory element 175 having an n-type impurity region and a thin film transistor 176 which is an n-channel thin film transistor having an n-type impurity region, can be formed as the memory cell array (see FIG. 7E).

Figure 8A:
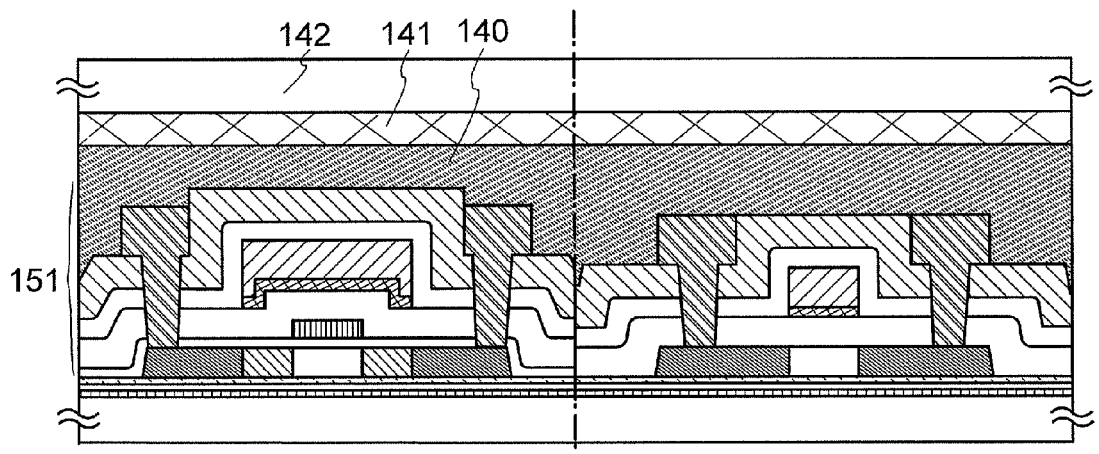
FIGS. 8A to 8C are views illustrating a manufacturing method of a semiconductor device, according to an aspect of this invention.
Figure 8B:
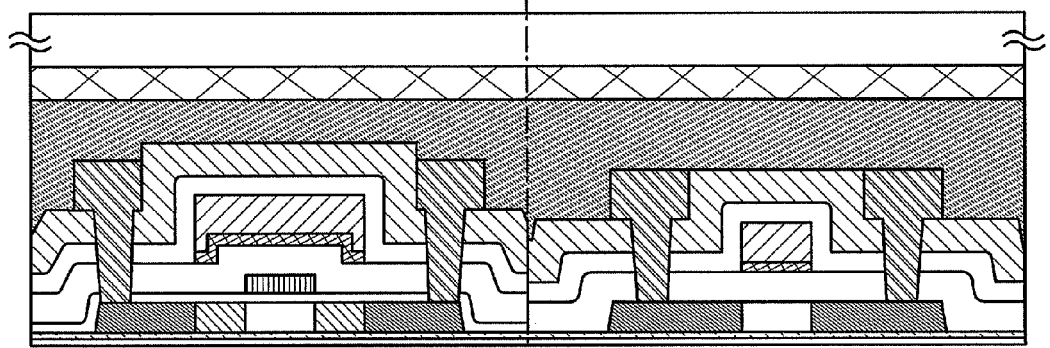

A resin layer 140 is provided over the semiconductor element layer 151 and bonded to a holding substrate 142 by a sticking layer 141 (see FIG. 8A).

The semiconductor element layer 151 is separated from the substrate 160 by using the separation layer 158. Thus, the semiconductor element layer 151 is provided on the holding substrate side. The separation layer 158, which remains on the inorganic insulating film 159 formed between the semiconductor element layer 151 and the separation 158, is removed to expose a flat surface of the inorganic insulating film 159 (see FIG. 8B). By removing the separation layer 158, which remains in an uneven form, from the surface of the inorganic insulating film 159, the surface of the inorganic insulating film 159 is flattened. In addition, flattening treatment may be further performed on the surface of the inorganic insulating film 159. For example, a tungsten film is used as the separation layer 158 and etching treatment by chlorine trifluoride can be performed on the surface of the inorganic insulating film 159 as flattening treatment.

Moreover, after the separation layer 158 is formed over the substrate 160, flattening treatment may be performed on the separation layer 158 before the inorganic insulating film 159 is formed. By forming the inorganic insulating film 159 over the separation layer 158 on which flattening treatment is performed, the flatness of the surface of the inorganic insulating film 159, which is exposed by removal of the separation layer 158, can be increased.

As flattening treatment, polishing treatment or etching treatment may be performed. It is needless to say that both polishing treatment and etching treatment may be performed. As polishing treatment, a chemical mechanical polishing (CMP) method or a liquid jet polishing method can be employed. As etching treatment, wet etching, dry etching, or both of them can be employed as appropriate. Alternatively, plasma treatment may be performed as flattening treatment. For example, a reverse sputtering method can be employed.

Figure 8C:
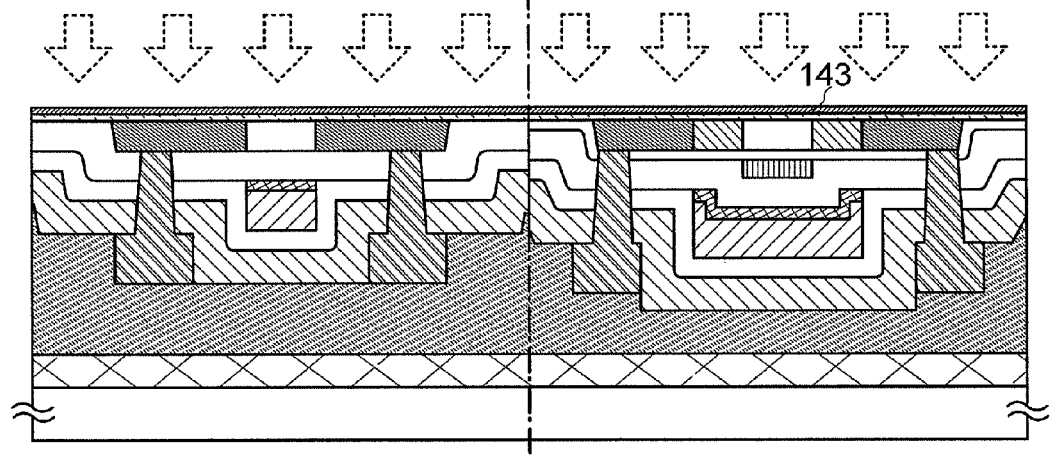

Since the exposed inorganic insulating film 159 serves as a surface which is to be bonded to a semiconductor element layer manufactured over another substrate, in this embodiment mode, plasma treatment is performed on the inorganic insulating film 159 for activation to form an inorganic insulating layer 143 whose surface is subjected to modification treatment (see FIG. 8C). Through the above-described steps, steps up to the one before bonding the semiconductor element layer 151 which is to be a top layer are completed.

The semiconductor element layer formed over the formation substrate with the inorganic insulating film interposed therebetween is separated from the formation substrate by using the separation layer to expose the inorganic insulating film. The inorganic insulating film exposed and the flat inorganic insulating layer formed over the semiconductor element layer in the bottom layer are bonded to each other, so that the semiconductor element layer in the bottom layer and the semiconductor element layer in the top layer are bonded to each other. Plasma treatment for activation is preferably performed on at least one of surfaces, which are to be bonded, of the exposed inorganic insulating film 143 and the flat inorganic insulating layer 147 provided over the semiconductor element layer 150 in the bottom layer. In this embodiment mode, an example in which plasma treatment is performed on both surfaces to be bonded is shown.

Figure 9A:
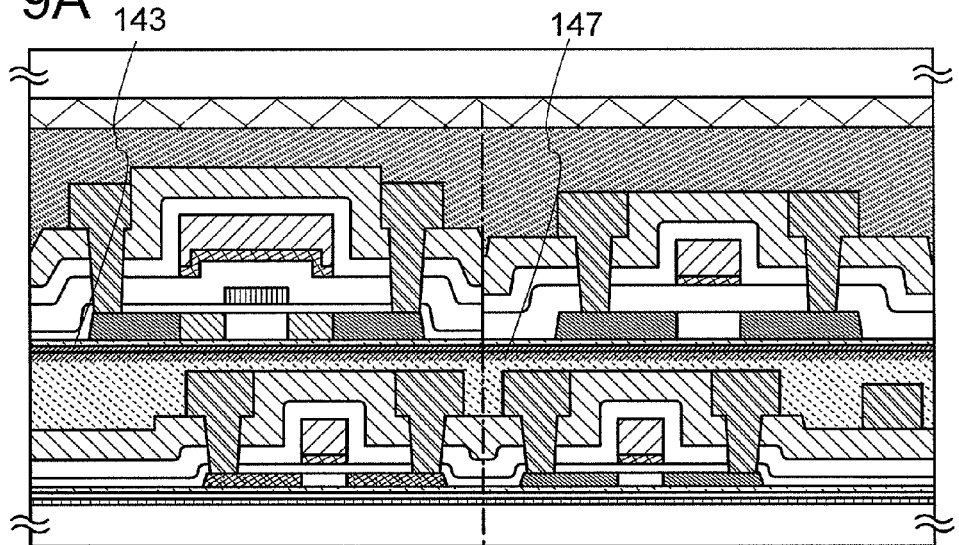
FIGS. 9A to 9C are views illustrating a manufacturing method of a semiconductor device, according to an aspect of this invention.

By making the flattened inorganic insulating film 143 and the inorganic insulating layer 147, on which plasma treatment is performed, in close contact in order to bond them to each other, the semiconductor element layer 150 in the bottom layer and the semiconductor element layer 151 in the top layer are stacked (see FIG. 9A).

Plasma treatment for activating a surface makes bonding between materials of different kinds easier even at a room temperature to 400° C. Accordingly, a semiconductor device with a multi-layer structure can be manufactured through a low temperature process. In addition, since semiconductor element layers are bonded with a thin inorganic insulating layer and an inorganic insulating film, without using an organic material such as an adhesive, the semiconductor device can be reduced in thickness and size.

Next, the resin layer 140, the sticking layer 141, and the holding substrate 142 are separated from stacked layers of the semiconductor element layer 150 and the semiconductor element layer 151 to be removed. In this embodiment mode, a water-soluble resin is used for a resin layer 140, and the sticking layer 141 and the holding substrate 142 are separated by melting and removing the resin layer. Another soluble resin or curable resin can also be used for the resin layer 140 so that the resin layer 140 is separated from the semiconductor element layer 151 chemically or physically.

Figure 9B:
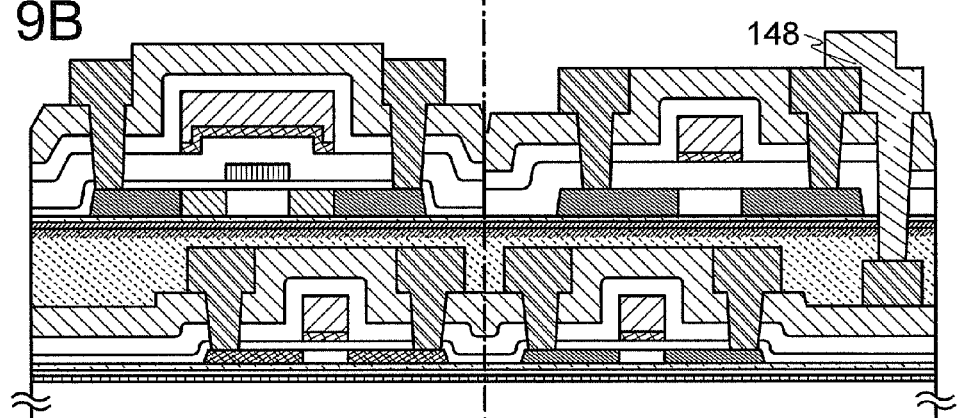

An opening (contact hole) that penetrates the insulating film 166, the insulating film 165, the gate insulating layer 109, the inorganic insulating film 143, and the inorganic insulating layer 147, is formed, and a wiring layer 148 that electrically connects the thin film transistor 176 in the top layer to the wiring layer 154 is formed (see FIG. 9B). With the wiring layer 148, the semiconductor element layer 151 of the memory cell array in the top layer and the semiconductor element layer 150 of the driver circuit portion in the bottom layer can be electrically connected to each other.

Figure 9C:
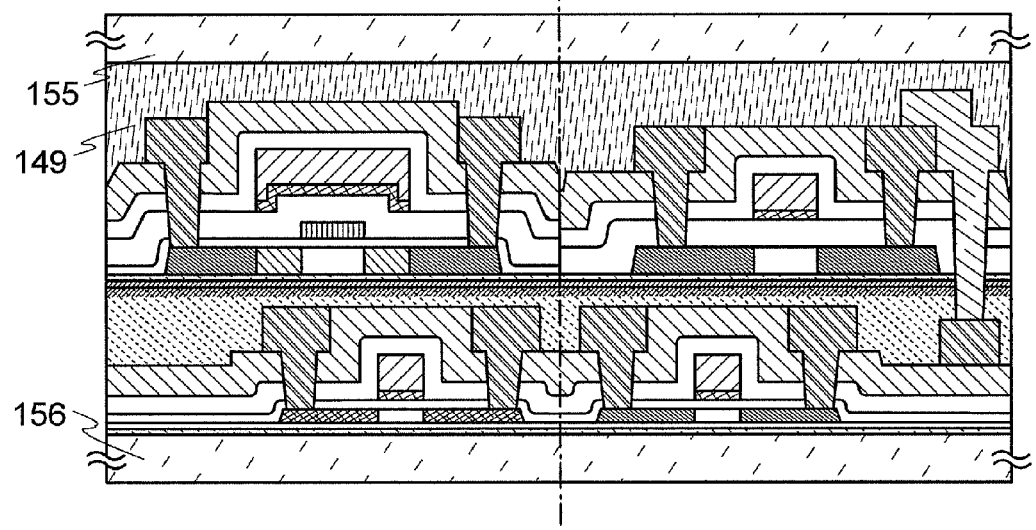

A resin layer 149 is formed over the semiconductor element layer 151 and the wiring layer 148, and a flexible substrate 155 is provided over the resin layer 149. The substrate 100 is separated by using the separation layer 101 and removed. The separation layer which remains on the surface of the inorganic insulating film 102 is removed by etching or the like so that the surface of the inorganic insulating film 102 can be flattened. In the case where the inorganic insulating film 102 is further bonded to an inorganic insulating layer provided over another semiconductor element layer, it is preferable to flatten the inorganic insulating film 102. In this embodiment mode, a flexible substrate 156 is provided so as to be in contact with the inorganic insulating film 102 and seal the semiconductor element layer with a multi-layer structure (see FIG. 9C). The flexible substrate may be provided by adhering using an adhesive layer.

A semiconductor device manufactured in this embodiment mode may be a semiconductor device with flexibility by being provided over a flexible substrate.

When a channel formation region is thick, in the case of a short channel length, current flows on the lower side in the channel formation region in a subthreshold region, where gate voltage is lower than or equal to threshold voltage, by the influence of an electric field between source and drain. Therefore, the subthreshold value is increased, and the threshold voltage is reduced. When the channel formation region is formed to be thin, a path where current flows on the lower side in the channel formation region is blocked, and leakage current can be suppressed. Therefore, increase in the subthreshold value is suppressed, and reduction in the threshold voltage is suppressed. Accordingly, when the channel formation region is formed to be thin, the amount of change in threshold voltage toward negative values can be suppressed in a region where the channel length is short, and a thin film transistor whose subthreshold value is small can be manufactured. Since the subthreshold value is reduced, the threshold voltage can be reduced while suppressing current flowing between the source and the drain at a gate voltage of 0 V.

Thinning of the single crystal semiconductor layers of the thin film transistors 173 and 174 in the semiconductor element layer of the driver circuit portion acts so as to deplete the entire channel formation region and can suppress a short channel effect. In addition, threshold voltage of the thin film transistors can be lowered. Accordingly, miniaturization and high performance of the thin film transistors that are provided in the driver circuit portion can be realized. Therefore, low voltage driving of the semiconductor device can be performed, and low power consumption can be realized. Since miniaturization of the thin film transistor can be realized by thinning the single crystal semiconductor layer (or, the gate insulating layer as well), reduction in the area of the driver circuit portion or the control circuit portion can be achieved, and miniaturization of the semiconductor device can be realized.

On the other hand, the semiconductor layers (or, the gate insulating layer as well) of the memory element 175 and the thin film transistor 176 provided in the memory cell array are made thicker than that of the driver circuit portion; accordingly, a semiconductor device having high withstand voltage with respect to driving voltage and high reliability can be provided.

Since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layers in different layers. Accordingly, a semiconductor device with a multi-layer structure of a plurality of semiconductor elements can also have high performance.

Further, since a single crystal semiconductor layer separated and transferred from a single crystal semiconductor substrate is used, a crystal plane orientation and a crystallographic axis in a channel length direction in a transistor can be controlled by selecting a single crystal semiconductor substrate.

By employing a crystal plane orientation and a crystallographic axis in the single crystal semiconductor layer, which make the mobility of a carrier flowing through a channel of the transistor the highest, the effective mass of the carrier is reduced and the mobility of the transistor can be improved. Therefore, the transistor can have high performance.

In this embodiment which employs this invention, a semiconductor device with a multi-layer structure can be manufactured through a low temperature process. In addition, since semiconductor element layers are bonded with a thin inorganic insulating layer and an inorganic insulating film, without using an organic material such as an adhesive, the semiconductor device can be reduced in thickness and size.

Since the inorganic insulating layer provided between the semiconductor element layers to be stacked is thin, a wiring layer which is formed by penetrating the inorganic insulating layer provided between single crystal semiconductor layers can be easily manufactured, whereby yield and productivity can be improved. Accordingly, electrical defects due to a defective shape in electrical connection between the semiconductor elements to be stacked are reduced and thus a semiconductor device with high reliability can be manufactured.

Accordingly, a semiconductor device of this invention has a structure of high integration in which semiconductor elements are three-dimensionally stacked. Therefore, the degree of freedom in arrangement of semiconductor elements in the semiconductor device is high, and thus higher integration and performance can be achieved. As a semiconductor element, as well as a field effect transistor, a memory element using a single crystal semiconductor layer can be used. Therefore, a semiconductor device that satisfies various functions required for various purposes can be manufactured and provided.

Embodiment Mode 6

In this embodiment mode, an example of a semiconductor device which is aimed at higher integration and further reduction in thickness and size will be described. Specifically, as examples of the semiconductor device, examples of a microprocessor and a semiconductor device which has an arithmetic function and can transmit and receive data without contact will be described.

Figure 15:
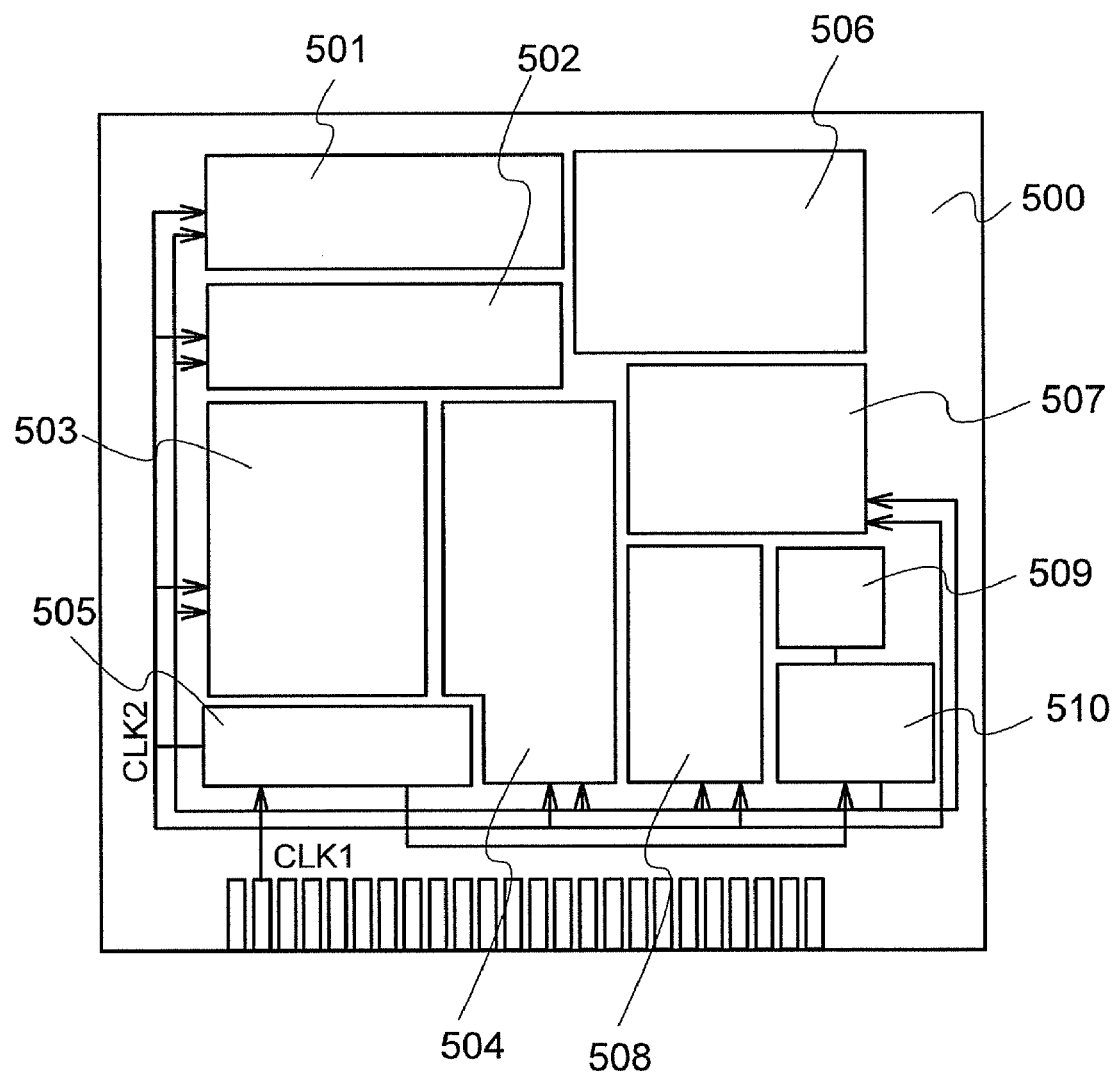
FIG. 15 is a block diagram illustrating a structure of a micro processor obtained by a semiconductor device according to an aspect of this invention.

FIG. 15 shows an example of a microprocessor 500 as an example of a semiconductor device. The microprocessor 500 is manufactured using the semiconductor device of the above embodiment modes. The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction inputted to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 depending on the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 shown in FIG. 15 is just an example of the simplified structure, and practical microprocessors have various structures depending on usage.

In the micro processor 500, the arithmetic logic unit 501 and the ALU controller 502 are formed in a semiconductor element layer 551, the register 506 and the register controller 507 are formed in a semiconductor element layer 552, the instruction decoder 503, the interrupt controller 504, the timing controller 505, and the bus interface 508 are formed in a semiconductor element layer 553, and the ROM 509 and the ROM interface 510 are formed in a semiconductor element layer 554. By using this invention, the semiconductor element layer 551, the semiconductor element layer 552, the semiconductor element layer 553, and the semiconductor element layer 554, which are formed by using different formation substrates, are stacked to be a multi-layer structure, and are electrically connected through a wiring layer that penetrates these stacked layers.

Since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layers in different layers. Accordingly, a semiconductor device with a multi-layer structure of a plurality of semiconductor elements can also have high performance.

Since an integrated circuit is formed using a single crystal semiconductor layer whose crystals are oriented in a certain direction and which is bonded over a substrate in such a microprocessor 500, high processing speed and low power consumption can be achieved.

Figure 16:
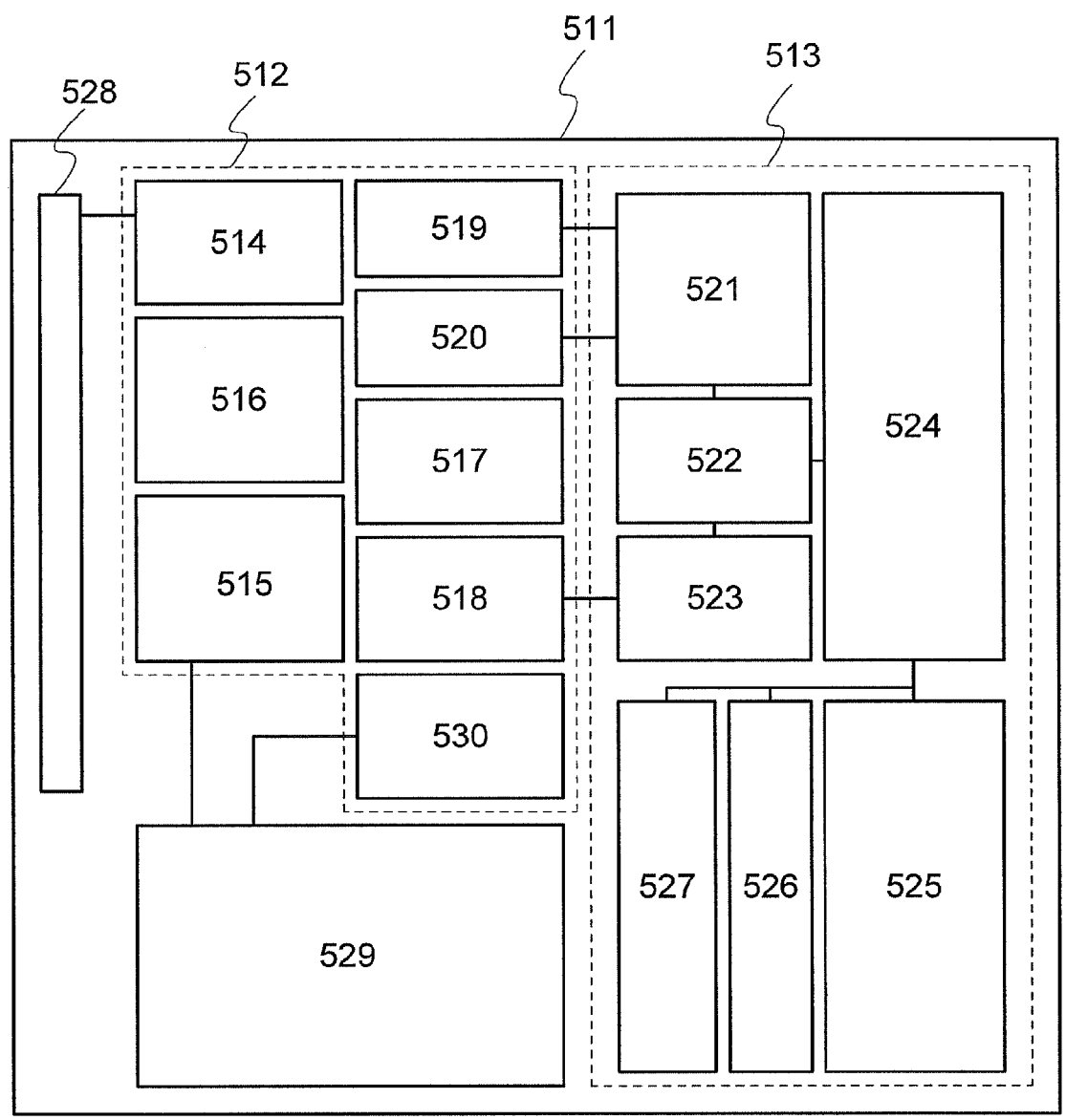
FIG. 16 is a block diagram illustrating a structure of an RFCPU obtained by a semiconductor device according to an aspect of this invention.

Next, an example of a semiconductor device which has an arithmetic function and can transmit and receive data without contact is described with reference to FIG. 16. FIG. 16 shows an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonance capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, an interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 through the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface which partly constitutes the RFCPU 511.

The reset circuit 517 generates a signal which resets the digital circuit portion 513 to be initialized. For example, the reset circuit 517 generates, as a reset signal, a signal which rises with delay after increase in the power supply voltage. The oscillator circuit 518 changes the frequency and the duty ratio of a clock signal depending on a control signal generated by the constant voltage circuit 516. The demodulation circuit 519 having a low pass filter, for example, binarizes changes in the amplitude of reception signals of an amplitude shift keying (ASK) system. The modulation circuit 520 changes the amplitude of transmission signals of an amplitude shift keying (ASK) system to transmit transmission data. The modulation circuit 520 changes the resonance point of the resonance circuit 514, thereby changing the amplitude of communication signals. The clock controller 523 generates a control signal for changing the frequency and the duty ratio of the clock signal depending on the power supply voltage or current consumption in the central processing unit 525. The power supply voltage is monitored by a power supply control circuit 530.

A signal which is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 through the interface 524. The interface 524 has a function of generating an access signal for any one of the read only memory 527, the random access memory 526, and the control register 522 in accordance with an address requested by the central processing unit 525.

As an arithmetic method of the central processing unit 525, a method may be employed in which the read only memory 527 stores an OS (operating system) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which part of process is conducted in the circuit dedicated to arithmetic and the other part of the arithmetic process is conducted by the central processing unit 525, using a program.

In the RFCPU 511, the resonance circuit 514, the constant voltage circuit 516, the rectifier circuit 515, the demodulation circuit 519, the modulation circuit 520, the reset circuit 517, the oscillator circuit 518, the power supply control circuit 530, the capacitor portion 529, and the antenna 528 are formed in a semiconductor element layer 561, and the RF interface 521, the control register 522, the clock controller 523, the CPU interface 524, the CPU 525, the RAM 526, and the ROM 527 are formed in a semiconductor element layer 562. By using this invention, the semiconductor element layer 561 and the semiconductor element layer 562 which are formed by using different formation substrates are stacked to be a multi-layer structure, and are electrically connected through a wiring layer that penetrates these stacked layers.

Since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layers in different layers. Accordingly, a semiconductor device with a multi-layer structure of a plurality of semiconductor elements can also have high performance.

In addition, in the case where a circuit or a structure in a semiconductor device is changed, a change can be dealt with in each semiconductor element layer. Therefore, this semiconductor device can have a wide range of selectivity in designing a semiconductor device.

Since an integrated circuit is formed using a single crystal semiconductor layer whose crystals are oriented in a certain direction and which is bonded to a substrate in the RFCPU 511, higher processing speed and lower power consumption can be achieved. Accordingly, even when the capacitor portion 529 which supplies electric power is miniaturized, long-term operation can be secured.

Embodiment Mode 7

In this embodiment mode, an example of an application of a semiconductor device described in the foregoing embodiment modes is described. Specifically, an application example of a semiconductor device capable of input/output data without contact is described with reference to drawings. The semiconductor device capable of inputting and outputting data without contact is also referred to as an RFID tag, an ID tag, an IC tag, an IC chip, an RF tag, a wireless tag, an electronic tag, or a wireless chip.

First, an example of a top-surface structure of a semiconductor device shown in this embodiment mode is explained with reference to FIG. 12. A semiconductor device 2180 shown in FIG. 12 includes a thin film integrated circuit 2131 provided with a plurality of elements such as thin film transistors for forming a memory portion and a logic portion, and conductive layers 2132 which function as antennas. The conductive layers 2132 that function as antennas is electrically connected to the thin film integrated circuit 2131. The transistor described in Embodiment Mode 1 can be applied to the integrated circuit 2131.

Figure 12:
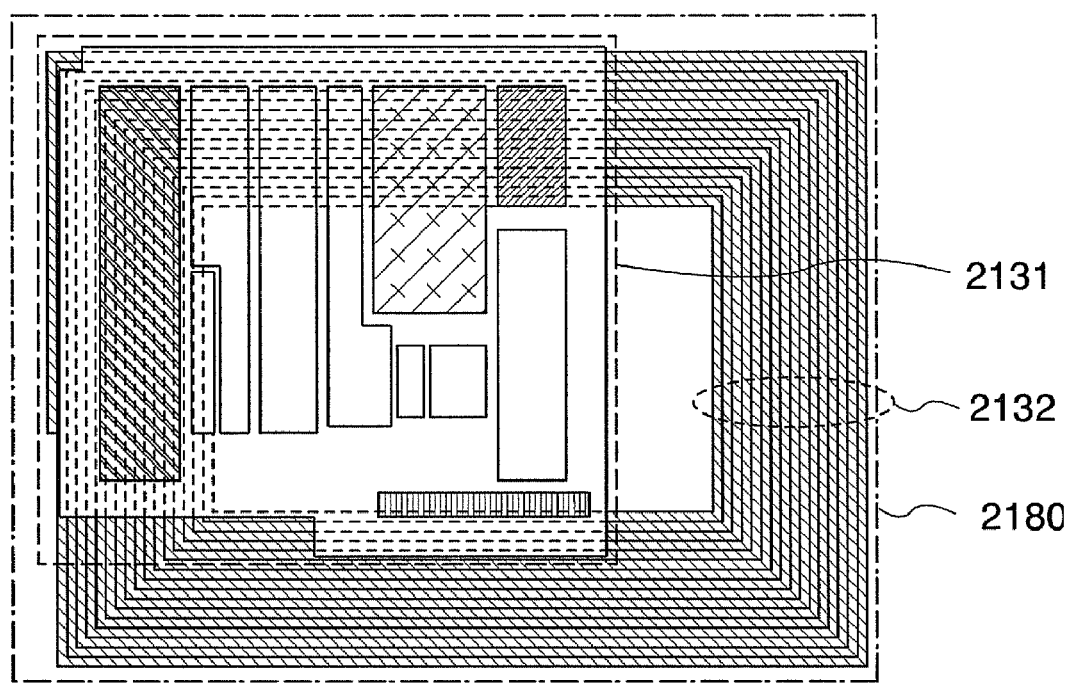
FIG. 12 is a view illustrating a semiconductor device according to an aspect of this invention.
Figure 13A:
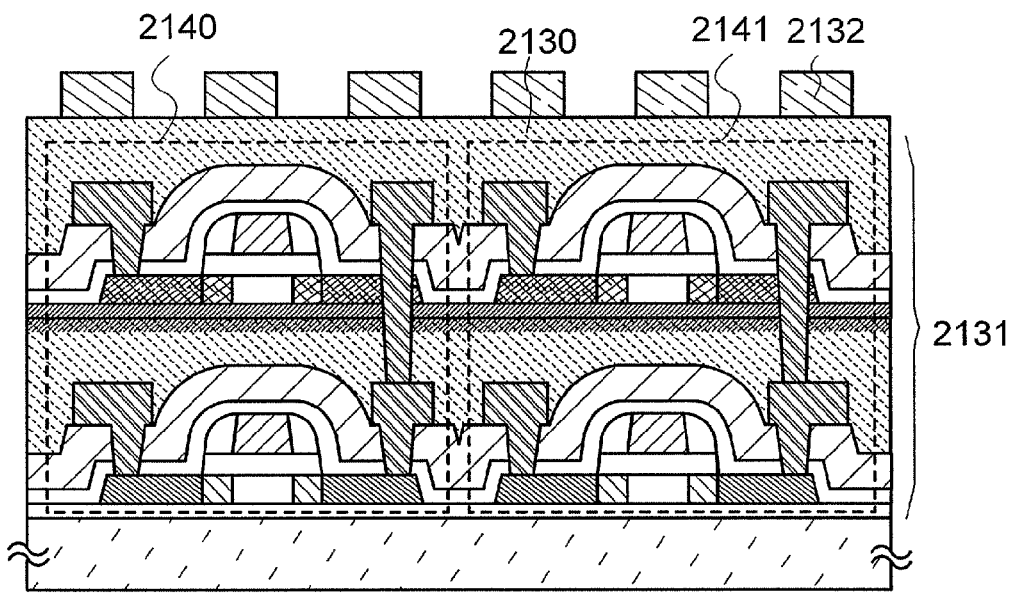
FIGS. 13A and 13B are views illustrating a semiconductor device according to an aspect of this invention.
Figure 13B:
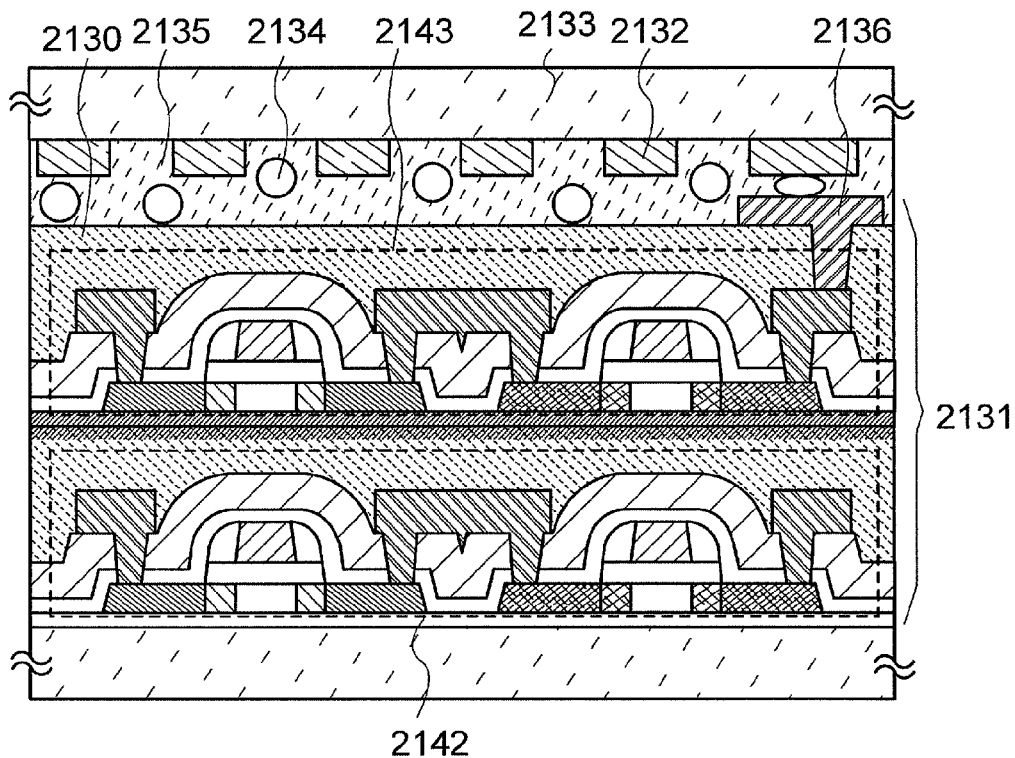

FIGS. 13A and 13B are schematic views of a cross section of FIG. 12. The conductive layers 2132 which function as antennas may be provided above the elements for forming the memory portion and the logic portion; for example, the conductive layers 2132 which function as antennas can be provided above COMS structures 2140 and 2141 with the insulating layer 2130 interposed therebetween (see FIG. 13A). Alternatively, the conductive layers 2132 which function as antennas may be provided over a substrate 2133 and then the substrate 2133 and the thin film integrated circuit 2131 may be attached to each other so as to sandwich the conductive layers 2132 (see FIG. 13B). An example in which a conductive layer 2136 provided over the insulating layer 2130 and the conductive layers 2132 which function as antennas are electrically connected to each other with conductive particles 2134 contained in an adhesive resin 2135 is shown in FIG. 13B.

The structure of a semiconductor device described in this embodiment mode is shown in cross section in FIGS. 13A and 13B. Transistors included in the CMOS structure 2140, the CMOS structure 2141, a CMOS structure 2142, and a CMOS structure 2143 each have a side wall insulating layer with a side wall structure and a low-concentration impurity region between a channel formation region and a source and drain region, which are high-concentration impurity region, in a single crystal semiconductor layer. An example is shown in which the CMOS structures 2140 and 2141 are formed of the transistor in the bottom layer and the transistor in the top layer which are stacked, and the CMOS structures 2142 and 2143 are formed of the transistors which are formed in contact with the same inorganic insulating film in series, and are stacked. The semiconductor device of this embodiment mode has a multi-layer structure of stacked semiconductor element layers. The semiconductor element layer formed over the formation substrate with the inorganic insulating film interposed therebetween is separated from the formation substrate by using the separation layer to expose the inorganic insulating film. The exposed inorganic insulating film and the flat inorganic insulating layer formed over the semiconductor element layer in the bottom layer are bonded to each other, so that the semiconductor element layer in the bottom layer and the semiconductor element layer in the top layer are bonded to each other. Plasma treatment for activation is preferably performed on at least one of surfaces, which are to be bonded, of the exposed inorganic insulating film and the flat inorganic insulating layer provided over the semiconductor element layer in the bottom layer. In this embodiment mode, an example in which plasma treatment is performed on both surfaces which are to be bonded is shown.

In this embodiment mode, the single crystal semiconductor layers of the transistors included in the CMOS structures 2140, 2141, 2142, and 2143 are single crystal semiconductor layers that are separated from single crystal semiconductor substrates and transferred to formation substrates in manufacturing steps. In this embodiment mode, a structure in which the single crystal semiconductor layer and an inorganic insulating film are directly bonded to each other without providing an insulating layer therebetween is employed. In this manner, the insulating layer for enhancing the bonding between the single crystal semiconductor layer and the inorganic insulating film is not necessary or may be provided.

Accordingly, in this embodiment mode which employs this invention, a semiconductor device with a multi-layer structure can be manufactured through a low temperature process. In addition, since semiconductor element layers are bonded with a thin inorganic insulating layer and an inorganic insulating film, without using an organic material such as an adhesive, the semiconductor device can be reduced in thickness and size.

Since the inorganic insulating layer provided between the semiconductor element layers to be stacked is thin, a wiring layer which is formed by penetrating the inorganic insulating layer provided between single crystal semiconductor layers can be easily manufactured, whereby yield and productivity can be improved. Accordingly, electrical defects due to a defective shape in electrical connection between the semiconductor elements to be stacked are reduced and a semiconductor device with high reliability can be manufactured.

Further, since a single crystal semiconductor layer separated and transferred from a single crystal semiconductor substrate is used, a crystal plane orientation and a crystallographic axis in a channel length direction in a transistor can be controlled by selecting a single crystal semiconductor substrate.

By employing a crystal plane orientation and a crystallographic axis in the single crystal semiconductor layer, which make the mobility of a carrier flowing through a channel of the transistor the highest, the effective mass of the carrier is reduced and the mobility of the transistor can be improved. Therefore, the transistor can have high performance.

In addition, since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layers in different layers. Accordingly, a semiconductor device with a multi-layer structure of a plurality of semiconductor elements can also have high performance.

Accordingly, a semiconductor device of this invention has a structure of high integration in which semiconductor elements are three-dimensionally stacked. Therefore, the degree of freedom in arrangement of semiconductor elements in the semiconductor device is high, and higher integration and performance can be achieved. As a semiconductor element, as well as a field effect transistor, a memory element using a single crystal semiconductor layer can be used. Therefore, a semiconductor device that satisfies various functions required for various purposes can be manufactured and provided.

Note that although an example in which the conductive layers 2132 that function as antennas are provided in the shape of a coil and either an electromagnetic induction method or an electromagnetic coupling method is employed is described in this embodiment mode, the semiconductor device of this invention is not limited thereto, and a microwave method may also be employed. In the case of a microwave method, the shape of the conductive layers 2132 that function as antennas may be decided as appropriate depending on the wavelength of an electromagnetic wave.

For example, when the microwave method (e.g., with an UHF band (in the range of 860 MHz to 960 MHz), a frequency band of 2.45 GHz, or the like) is employed as the signal transmission method of the semiconductor device 2180, the shape such as the length of the conductive layer that functions as an antenna may be set as appropriate in consideration of the wavelength of an electromagnetic wave used in sending a signal. For example, the conductive layer which functions as an antenna can be formed into a linear shape (for example, a dipole antenna), a flat shape (for example, a patch antenna or a ribbon shape), or the like. Further, the shape of the conductive layers 2132 which function as antennas is not limited to a line, and the conductive layer in the shape of a curved line, in an S-shape, or in a shape combining them may be provided as well in consideration of the wavelength of the electromagnetic wave.

The conductive layers 2132 that function as antennas are formed of a conductive material by a CVD method, a sputtering method, a printing method such as a screen printing method or a gravure printing method, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material mainly including the element, and a single layer structure or a stacked-layer structure may be employed.

For example, when the conductive layers 2132 that function as antennas are formed by a screen printing method, it can be provided by selective printing with a conductive paste in which conductive particles with a grain diameter of several nm to several tens of µm are dissolved or dispersed in an organic resin. As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or more selected from organic resins which function as a binder of metal particles, a solvent, a dispersing agent and a coating material can be used. Typically, an organic resin such as an epoxy resin, a silicone resin, and the like can be given. Further, in forming the conductive layer, it is preferable to bake the conductive paste after being provided. For example, in the case of using fine particles (e.g., with a grain diameter of 1 nm or more and 100 nm or less) mainly containing silver as a material of the conductive paste, the conductive layer can be formed by baking the conductive paste at a temperature in the range of 150 to 300° C. to be hardened. Also, fine particles containing solder, or lead-free solder as their main component may be used, and in this case fine particles whose size is 20 µm or less is preferably used. Solder and lead-free solder have an advantage of being low cost.

High integration can be achieved in a semiconductor device to which this invention is applied. Therefore, this invention is effective in the case of a small semiconductor device capable of input/output data without contact as described in this embodiment mode.

Embodiment Mode 8

In this embodiment mode, an example of application of the above-described semiconductor device capable of input/output data without contact, which is formed using this invention, will be described with reference to drawings. The semiconductor device which can input and output data without contact is also referred to as an RFID tag, an ID tag, an IC tag, an IC chip, an RF tag, a wireless tag, an electronic tag, or a wireless chip depending on application modes.

Figure 14A:
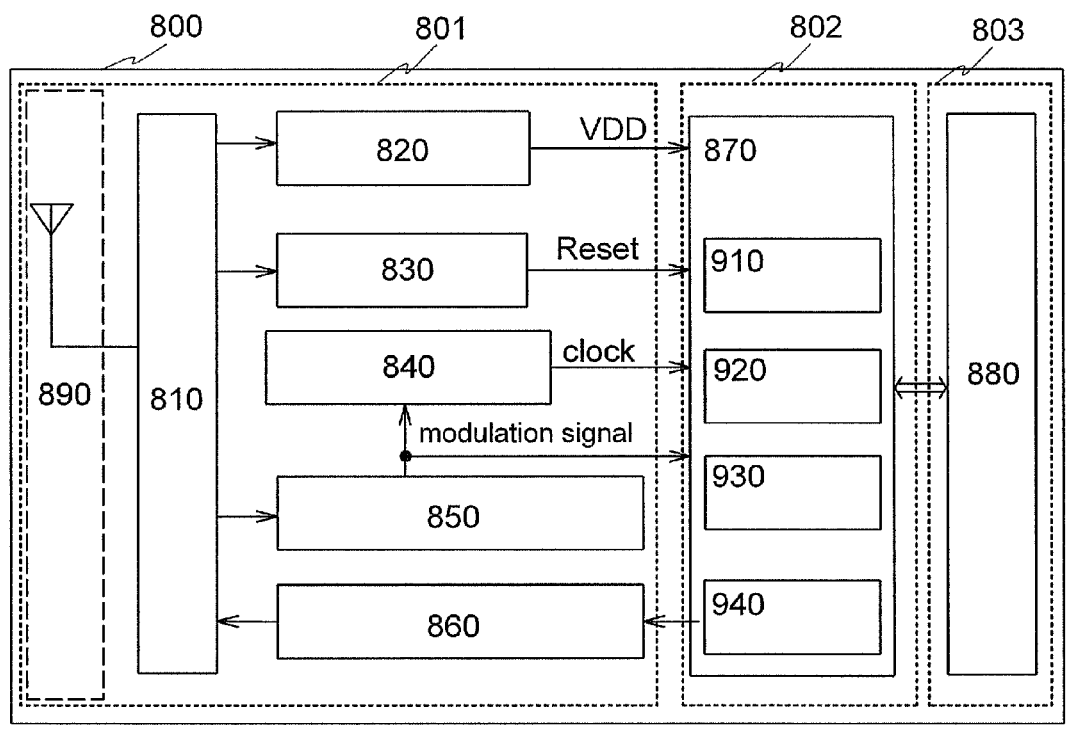
FIGS. 14A to 14C are diagrams each illustrating application of a semiconductor device according to an aspect of this invention.

A semiconductor device 800 has a function of communicating data without contact, and includes a high frequency circuit 810, a power supply circuit 820, a reset circuit 830, a clock generation circuit 840, a data demodulation circuit 850, a data modulation circuit 860, a control circuit 870 which controls another circuit, a memory circuit 880, and an antenna 890 (see FIG. 14A). The high frequency circuit 810 receives a signal by the antenna 890 and also outputs a signal from the antenna 890, which is received from the data modulating circuit 860. The power supply circuit 820 generates a power source potential from a received signal. The reset circuit 830 generates a reset signal. The clock generation circuit 840 generates various clock signals based on a received signal input from the antenna 890. The data demodulation circuit 850 demodulates and outputs a received signal to the control circuit 870. The data modulation circuit 860 modulates a signal received from control circuit 870. In the control circuit 870, a code extraction circuit 910, a code judgment circuit 920, a CRC judgment circuit 930, and an output unit circuit 940 are included. Note that the code extraction circuit 910 extracts a plurality of codes included in instructions transmitted to the control circuit 870. The code judgment circuit 920 compares the extracted codes and codes corresponding to a reference to judge the content of the instructions. The CRC judgment circuit 930 detects the presence of transmission errors and the like based on the judged codes.

Next, an example of operation of the above-described semiconductor device is described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit included in the semiconductor device 800. A signal transmitted to the data demodulation circuit 850 via the high frequency circuit 810 is demodulated (hereinafter, such a signal is referred to as a demodulated signal). Further, a signal and the demodulated signal which have passed the reset circuit 830 and the clock generation circuit 840, respectively, are transmitted to the control circuit 870. The signal transmitted to the control circuit 870 is analyzed by the code extraction circuit 910, the code judgment circuit 920, the CRC judgment circuit 930, and the like. Then, based on the analyzed signal, information of the semiconductor device which is stored in the memory circuit 880 is output. The output information of the semiconductor device is encoded by passing through the output unit circuit 940. Furthermore, the encoded information of the semiconductor device 800 passes through the data modulation circuit 860 and transmitted by the antenna 890 as a radio signal. Note that among a plurality of circuits included in the semiconductor device 800, a low power supply potential (hereinafter, referred to as VSS) is common and VSS can be set as GND.

In this manner, data in the semiconductor device 800 can be read by transmitting a signal to the semiconductor device 800 from a communication device and by receiving a signal which is transmitted from the semiconductor device 800 by the communication device.

The semiconductor device 800 may be a type in which, for supply of a power supply voltage to each circuit, no electric power supply (battery) is installed and a power supply voltage is supplied by use of electromagnetic waves; or the semiconductor device 800 may be a type in which, for supply of a power supply voltage to each circuit, an electric power supply (battery) is installed and a power supply voltage is supplied to each circuit by use of electromagnetic waves and a battery.

In the semiconductor device 800, the high frequency circuit 810, the power supply circuit 820, the reset circuit 830, the clock generation circuit 840, the data demodulation circuit 850, the data modulation circuit 860, and the antenna 890 are formed in a semiconductor element layer 801; control circuit 870 including the code extraction circuit 910, the code judgment circuit 920, the CRC judgment circuit 930, and the output unit circuit 940 is formed in a semiconductor element layer 802; and the memory circuit 880 is formed in a semiconductor element layer 803. By using this invention, the semiconductor element layer 801, the semiconductor element layer 802, and the semiconductor element layer 803, which are formed by using different formation substrates are stacked to be a multi-layer structure, and are electrically connected through a wiring layer that penetrates these stacked layers.

Since the semiconductor element layers manufactured over the different substrates through different processes are stacked for integration, the semiconductor element layers each having excellent characteristics can be formed in an optimized condition (a material, thickness, and an element structure) without being influenced by manufacturing conditions of the semiconductor element layers in different layers. Accordingly, a semiconductor device with a multi-layer structure of a plurality of semiconductor elements can also have high performance.

Figure 14B:
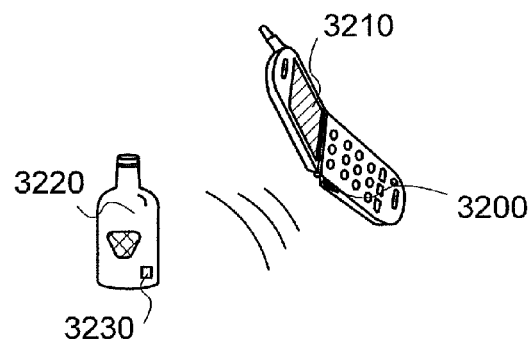
Figure 14C:
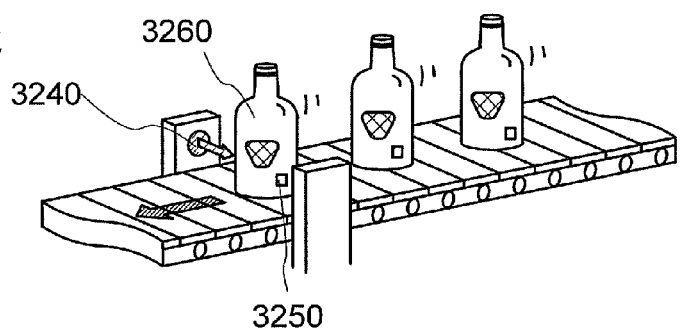

Next, an example of a usage mode of a semiconductor device capable of input/output data without contact is described. A communication device 3200 is provided on a side surface of a portable terminal including a display portion 3210, and a semiconductor device 3230 is provided on a side surface of an article 3220 (see FIG. 14B). When the communication device 3200 is put close to the semiconductor device 3230 on the article 3220, information related to the article 3220, such as its raw material, its place of production, inspection results for each production step, the history of distribution, or an description of the article, is displayed on the display portion 3210. Further, while a product 3260 is transported by a conveyor belt, the product 3260 can be inspected using a communication device 3240 and a semiconductor device 3250 provided on the product 3260 (see FIG. 14C). Thus, by application of a semiconductor device to a system, information can be acquired easily, and high function and high added value can be realized. Further, since the semiconductor device according to this invention can realize lower power consumption and higher integration, a semiconductor device provided for an article can be downsized.

A semiconductor device according to this invention has a very wide range of application and can be used in electronic devices in various fields.

Embodiment Mode 9

According to this invention, a semiconductor device serving as a chip having a processor circuit (hereinafter also referred to as a processor chip, a wireless chip, a wireless processor, a wireless memory, or a wireless tag) can be formed. An applicable range of a semiconductor device according to this invention is wide, and the semiconductor device can be applied to any product as long as it clarifies information related to an object, such as the history thereof, without contact and is useful for production, management, and the like. For example, the semiconductor device can be mounted on bills, coins, securities, certificates, bearer bonds, packing containers, books, recording media, personal belongings, vehicles, food, clothing, health products, livingwares, medicine, electronic appliances, and the like. Examples of them are described with reference to FIGS. 11A to 11G.

Bills and coins are money circulating in the market, and include one valid in a certain area (cash voucher), memorial coins, and the like. Securities refer to checks, certificates, promissory notes, and the like and can be provided with a chip 190 having a processor circuit (see FIG. 11A). Certificates refer to driver's licenses, certificates of residence, and the like and can be provided with a chip 191 having a processor circuit (see FIG. 11B). Personal belongings refer to bags, glasses, and the like and can be provided with a chip 197 having a processor circuit (see FIG. 11C). Bearer bonds refer to stamps, rice coupons, various gift certificates, and the like. Packing containers refer to wrapping paper for food containers, plastic bottles, and the like and can be provided with a chip 193 having a processor circuit (see FIG. 11D). Books refer to hardbacks, paperbacks, and the like and can be provided with a chip 194 having a processor circuit (see FIG. 11E). Recording media refer to DVD software, video tapes, and the like and can be provided with a chip 195 having a processor circuit (see FIG. 11F). Vehicles refer to wheeled vehicles like bicycles, ships, and the like and can be provided with a chip 196 having a processor circuit (see FIG. 11G). Food products refer to food items, beverages, and the like. Clothing refers to clothes, footwear, and the like. Health products refer to medical instruments, health instruments, and the like. Livingwares refer to furniture, lighting equipment, and the like. Medicine refers to medical products, pesticides, and the like. Electronic devices refer to liquid crystal display devices, EL display devices, television sets (TV receivers and flat-screen TV receivers), cellular phones, and the like.

The semiconductor device can be provided by being attached to the surface of goods or being embedded in goods. For example, in the case of a book, the semiconductor device may be embedded in a piece of paper; and in the case of a package made from an organic resin, the semiconductor device may be embedded in the organic resin.

In this manner, when the semiconductor device is provided for packaging containers, recording media, personal belongings, foods, clothing, livingwares, electronic devices, and the like, the efficiency of an inspection system, a rental shop system, and the like can be improved. In addition, when the semiconductor device is provided for vehicles, forgery and theft thereof can be prevented. Further, when the semiconductor device is implanted in creatures such as animals, identification of an individual creature can be easily carried out.

For example, when the semiconductor device provided with a sensor is implanted in creatures such as livestocks, its health condition such as a body temperature as well as its birth year, sex, breed, or the like can be easily managed.

Note that this embodiment can be implemented in combination with any of Embodiment Modes 1 to 8 as appropriate.

This application is based on Japanese Patent Application serial no. 2007-311910 filed with Japan Patent Office on Dec. 3, 2007, the entire contents of which are hereby incorporated by reference.

What is claimed is:

1. A method for manufacturing a semiconductor device, comprising the steps of:
    forming a first inorganic insulating layer over the first substrate;
    forming a first semiconductor element layer over the first inorganic insulating layer;
    forming a second inorganic insulating layer over the first semiconductor element layer;
    forming a separation layer over a second substrate;
    forming a third inorganic insulating layer over the separation layer;
    forming a second semiconductor element layer over the third inorganic insulating layer;
    bonding a third substrate to the second semiconductor element layer;
    exposing the third inorganic insulating layer by removing the separation layer and the second substrate;
    bonding the second inorganic insulating layer and the third inorganic insulating layer to each other; and
    forming a wiring layer for electrically connecting the first semiconductor element layer and the second semiconductor element layer.

2. A method for manufacturing a semiconductor device, comprising the steps of:
    forming a first separation layer over a first substrate;
    forming a first inorganic insulating layer over the first separation layer;
    forming a first semiconductor element layer over the first inorganic insulating layer;
    forming a second inorganic insulating layer over the first semiconductor element layer;
    forming a second separation layer over a second substrate;
    forming a third inorganic insulating layer over the second separation layer;
    forming a second semiconductor element layer over the third inorganic insulating layer;
    bonding a third substrate to the second semiconductor element layer;
    exposing the third inorganic insulating layer by removing the second separation layer and the second substrate;
    bonding the second inorganic insulating layer and the third inorganic insulating layer to each other;
    removing the third substrate from the second semiconductor element layer;
    forming a wiring layer for electrically connecting the first semiconductor element layer and the second semiconductor element layer;
    bonding a first flexible substrate to the second semiconductor element layer;
    exposing the first inorganic insulating layer by removing the first separation layer and the first substrate; and
    bonding a second flexible substrate to the first inorganic insulating layer.

3. A method for manufacturing a semiconductor device, comprising the steps of:
    forming a first weakened layer in a first single crystal semiconductor substrate;
    forming a first inorganic insulating layer over the first substrate;
    bonding the first single crystal semiconductor substrate to the first substrate with the first separation layer and the first inorganic insulating layer interposed between the first single crystal semiconductor substrate and the first substrate;
    forming a first single crystal semiconductor layer over the first inorganic insulating layer by separating the first single crystal semiconductor substrate from the first substrate along the first weakened layer;
    forming a first transistor using the first single crystal semiconductor layer over the first inorganic insulating layer;
    forming a second inorganic insulating layer over the first transistor;
    forming a second weakened layer in a second single crystal semiconductor substrate;
    forming a separation layer over a second substrate;
    forming a third inorganic insulating layer over the separation layer;
    bonding the second single crystal semiconductor substrate to the second substrate with the separation layer and the third inorganic insulating layer interposed between the second single crystal semiconductor substrate and the second substrate;
    forming a second single crystal semiconductor layer over the third inorganic insulating layer by separating the second single crystal semiconductor substrate from the second substrate along the second weakened layer;
    forming a second transistor using the second single crystal semiconductor layer over the third inorganic insulating layer;
    bonding a third substrate to the second transistor;
    exposing the third inorganic insulating layer by removing the separation layer and the second substrate;
    bonding the second inorganic insulating layer and the third inorganic insulating layer to each other; and
    forming a wiring layer for electrically connecting the first transistor and the second transistor.

4. A method for manufacturing a semiconductor device, comprising the steps of:
    forming a first weakened layer in a first single crystal semiconductor substrate;
    forming a first separation layer over a first substrate;
    forming a first inorganic insulating layer over the first separation layer;
    bonding the first single crystal semiconductor substrate to the first substrate with the first separation layer and the first inorganic insulating layer interposed between the first single crystal semiconductor substrate and the first substrate;
    forming a first single crystal semiconductor layer over the first inorganic insulating layer by separating the first single crystal semiconductor substrate from the first substrate along the first weakened layer;
    forming a first transistor using the first single crystal semiconductor layer over the first inorganic insulating layer;
    forming a second inorganic insulating layer over the first transistor;
    forming a second weakened layer in a second single crystal semiconductor substrate;
    forming a second separation layer over a second substrate;
    forming a third inorganic insulating layer over the second separation layer;

bonding the second single crystal semiconductor substrate to the second substrate with the second separation layer and the third inorganic insulating layer interposed between second single crystal semiconductor substrate and the second substrate;

forming a second single crystal semiconductor layer over the third inorganic insulating layer by separating the second single crystal semiconductor substrate from the second substrate along the second weakened layer;

forming a second transistor using the second single crystal semiconductor layer over the third inorganic insulating layer;

bonding a third substrate to the second transistor;

exposing the third inorganic insulating layer by removing the second separation layer and the second substrate;

bonding the second inorganic insulating layer and the third inorganic insulating layer to each other;

removing the third substrate from the second transistor;

forming a wiring layer for electrically connecting the first transistor and the second transistor;

bonding a first flexible substrate to the second transistor;

exposing the first inorganic insulating layer by removing the first separation layer and the first substrate; and bonding a second flexible substrate to the first inorganic insulating layer.

5. A method for manufacturing a semiconductor device according to claim 1, wherein each of the first substrate and the second substrate is a glass substrate.

6. A method for manufacturing a semiconductor device according to claim 2, wherein each of the first substrate and the second substrate is a glass substrate.

7. A method for manufacturing a semiconductor device according to claim 3, wherein each of the first substrate and the second substrate is a glass substrate.

8. A method for manufacturing a semiconductor device according to claim 4, wherein each of the first substrate and the second substrate is a glass substrate.

9. A method for manufacturing a semiconductor device according to claim 1, further comprising:
performing a plasma treatmenet to at least one of the second inorganic insulating layer and the third inorganic insulating layer before bonding the second inorganic insulating layer and the third inorganic insulating layer to each other.

10. A method for manufacturing a semiconductor device according to claim 2, further comprising:
performing a plasma treatmenet to at least one of the second inorganic insulating layer and the third inorganic insulating layer before bonding the second inorganic insulating layer and the third inorganic insulating layer to each other.

11. A method for manufacturing a semiconductor device according to claim 3, further comprising:
performing a plasma treatmenet to at least one of the second inorganic insulating layer and the third inorganic insulating layer before bonding the second inorganic insulating layer and the third inorganic insulating layer to each other.

12. A method for manufacturing a semiconductor device according to claim 4, further comprising:
performing a plasma treatmenet to at least one of the second inorganic insulating layer and the third inorganic insulating layer before bonding the second inorganic insulating layer and the third inorganic insulating layer to each other.

13. A method for manufacturing a semiconductor device according to claim 1, further comprising:
performing a flattening treatment to the second inorganic insulating layer.

14. A method for manufacturing a semiconductor device according to claim 2, further comprising:
performing a flattening treatment to the second inorganic insulating layer.

15. A method for manufacturing a semiconductor device according to claim 3, further comprising:
performing a flattening treatment to the second inorganic insulating layer.

16. A method for manufacturing a semiconductor device according to claim 4, further comprising:
performing a flattening treatment to the second inorganic insulating layer.

17. A method for manufacturing a semiconductor device according to claim 1, wherein the first semiconductor element layer comprises a transistor and the second semiconductor element layer comprises a memory element.

18. A method for manufacturing a semiconductor device according to claim 2, wherein the first semiconductor element layer comprises a transistor and the second semiconductor element layer comprises a memory element.

19. A method for manufacturing a semiconductor device according to claim 1, wherein the third substrate is a holding substrate.

20. A method for manufacturing a semiconductor device according to claim 2, wherein the third substrate is a holding substrate.

21. A method for manufacturing a semiconductor device according to claim 3, wherein the third substrate is a holding substrate.

22. A method for manufacturing a semiconductor device according to claim 4, wherein the third substrate is a holding substrate.

* * * * *